(12) United States Patent
Chung et al.

(10) Patent No.: US 12,051,643 B2
(45) Date of Patent: Jul. 30, 2024

(54) HYBRID VIA INTERCONNECT STRUCTURE

(71) Applicant: Taiwan Semiconductor Manufacturing Company Limited, Hsinchu (TW)

(72) Inventors: Chin-Lung Chung, Hsinchu (TW); Shin-Yi Yang, New Taipei (TW); Ming-Han Lee, Taipei (TW)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 53 days.

(21) Appl. No.: 16/878,043

(22) Filed: May 19, 2020

(65) Prior Publication Data

US 2021/0366822 A1 Nov. 25, 2021

(51) Int. Cl.
*H01L 23/522* (2006.01)
*H01L 21/768* (2006.01)

(52) U.S. Cl.
CPC .... *H01L 23/5226* (2013.01); *H01L 21/76805* (2013.01); *H01L 21/76807* (2013.01); *H01L 21/76841* (2013.01); *H01L 21/76877* (2013.01)

(58) Field of Classification Search
CPC ........... H01L 23/5226; H01L 21/76807; H01L 21/76841; H01L 21/76877; H01L 21/76805
See application file for complete search history.

(56) References Cited

U.S. PATENT DOCUMENTS

| | | | | |
|---|---|---|---|---|
| 10,573,593 | B2* | 2/2020 | Lin | H01L 21/76879 |
| 11,127,675 | B2* | 9/2021 | Hsu | H01L 21/76804 |
| 11,152,257 | B2* | 10/2021 | Lanzillo | H01L 21/76849 |
| 2002/0168849 | A1* | 11/2002 | Lee | H01L 21/76808 |
| | | | | 257/E21.255 |
| 2007/0042588 | A1 | 2/2007 | Beck et al. | |
| 2014/0065815 | A1 | 3/2014 | Tanwar | |
| 2016/0163587 | A1* | 6/2016 | Backes | H01L 23/53238 |
| | | | | 257/751 |
| 2017/0243839 | A1* | 8/2017 | Buckalew | H01L 24/20 |
| 2019/0019726 | A1* | 1/2019 | Ryan | H01L 21/76802 |
| 2019/0051600 | A1* | 2/2019 | Oh | H01L 21/7684 |
| 2020/0144107 | A1* | 5/2020 | Dutta | H01L 21/76816 |
| 2020/0219808 | A1* | 7/2020 | Hwang | H01L 21/76832 |
| 2020/0395294 | A1* | 12/2020 | Liang | H01L 21/76813 |
| 2021/0278360 | A1* | 9/2021 | Pan | H01L 21/6719 |
| 2021/0327803 | A1* | 10/2021 | Motoyama | H01L 21/76816 |

* cited by examiner

*Primary Examiner* — Phat X Cao
(74) *Attorney, Agent, or Firm* — FOLEY & LARDNER LLP

(57) ABSTRACT

A hybrid via interconnect structure includes a first metal filling at least partially surrounded by a first barrier metal layer, a second metal filling at least partially surrounded by a second barrier metal layer, and a hybrid via formed between the first metal filling and the second metal filling. The hybrid via provides an electrical connection between the first metal filling and the second metal filling and is formed of a different material than the first metal filling, the second metal filling, the first barrier metal layer, and the second barrier metal layer. The hybrid via interconnect structure can be formed during the back end of line (BEOL) portion of an integrated circuit (IC) fabrication process to provide reduced interconnect resistance and improved ease of fabrication.

20 Claims, 46 Drawing Sheets

HYBRID VIA INTERCONNECT STRUCTURE

BACKGROUND

The present disclosure generally relates to semiconductor devices and methods for forming circuits including semiconductor devices. More particularly, the present disclosure relates to interconnect structures formed during the integrated circuit fabrication process.

Semiconductor devices are used in a wide variety of electronics, and improvements regarding both production and performance of semiconductor devices are generally desired. As the size of these devices continues to decrease, challenges in creating high performance and feasible interconnect structures can arise.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features can be arbitrarily increased or reduced for clarity of discussion.

DETAILED DESCRIPTION

Figure 1:
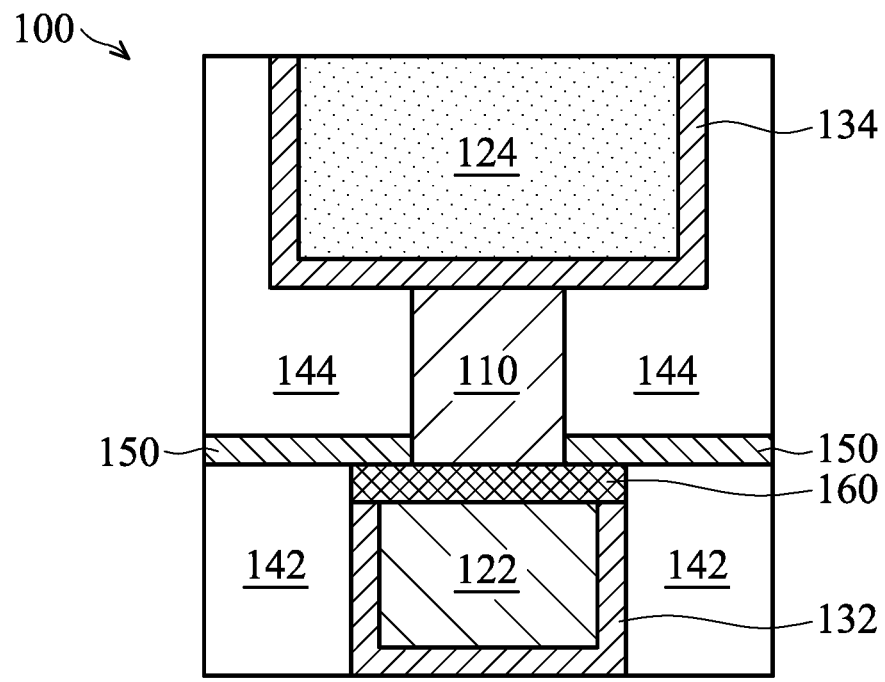
FIGS. 1-10 illustrate cross sections of various embodiments of a hybrid via interconnect structure that is formed using a single damascene process.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows can include embodiments in which the first and second features are formed in direct contact, and can also include embodiments in which additional features can be formed between the first and second features, such that the first and second features can not be in direct contact. In addition, the present disclosure can repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein can likewise be interpreted accordingly.

The present disclosure provides various embodiments of a hybrid via interconnect structure that can be used to provide improved interconnect structures within an integrated circuit. The hybrid via interconnect structure includes a hybrid via that generally provides an electrical connection between two metals such as two copper interconnects. The hybrid via can be formed of a variety of materials including metals, alloys, and other conductive materials. The hybrid via interconnect structure can be formed using a single damascene process, a dual damascene process, a reactive ion etching process, and other suitable processes. The hybrid via interconnect structure can provide advantages in terms of reduced contact and interconnect resistance as well as improved ease and efficiency of fabrication.

FIGS. 1-10 illustrate cross sections of various embodiments of a hybrid via interconnect structure 100 that is formed using a single damascene process. Hybrid via interconnect structure 100 can generally be formed during the back end of line (BEOL) portion of an integrated circuit (IC) fabrication process. The BEOL portion of the IC fabrication process generally occurs after the front end of line (FEOL) portion of the IC fabrication process. In the FOEL portion, individual semiconductor devices (e.g. transistors, capacitors, resistors, etc.) are formed on a wafer (e.g. bulk silicon substrate) and separated into device regions using isolation structures (e.g. shallow trench isolation structures). In the BEOL portion, interconnections between individual devices and wiring on the wafer are formed. The BEOL portion can include formation of various contacts, metal layers, insulating layers, and bonding sites, for example.

Some previous approaches to forming interconnect structures during the BEOL portion of the IC fabrication process can suffer from high contact resistance. For example, when forming copper interconnects, the use of barrier metal layers to chemically isolate copper fillings from surrounding silicon material can lead to high contact resistance. This phenomenon can introduce propagation delays, increase power consumption, and cause other undesirable effects. Further, as the feature size of semiconductor devices decreases and the demand for smaller chips more generally increases, challenges with forming more traditional copper interconnects and other similar interconnect structures can arise. For example, difficulties in the filling process used to form copper interconnects can result in voids and other undesirable effects. These problems can arise when using various fabrication techniques including single damascene techniques, dual damascene techniques, reactive ion etching techniques, and other similar techniques.

As shown in FIG. 1, hybrid via interconnect structure 100 includes a first metal filling 122 and a second metal filling 124 electrically connected by a hybrid via 110. Metal filling 122 is surrounded by a barrier metal layer 132 and a capping layer 160. The second metal filling 124 is surrounded by a barrier metal layer 134. The first metal filling 122 can be completely surrounded by the combination of barrier metal layer 132 and capping layer 160. The second metal filling 124 can be completely surrounded by barrier metal layer 134 (although this is not explicitly shown in FIG. 1). These layers are adjacent to an insulating layer 142 and an insulating layer 144 that are separated by an etch stop layer 150.

In some embodiments, both the metal filling 122 and metal filling 124 are copper interconnects. However, the metal filling 122 and metal filling 124 can be formed of other suitable materials (e.g. aluminum, etc.). The barrier metal layer 132 and barrier metal layer 134 chemically isolate the metal filling 122 and metal filling 124, respectively, from surrounding materials such as silicon and other materials. For example, barrier metal layer 132 can prevent diffusion of metal filling 122 into insulating layer 142. Barrier metal layer 132 and barrier metal layer 134 can be formed using materials such as tantalum, cobalt, ruthenium, and other suitable materials. Barrier metal layer 132 and barrier metal layer 134 are generally formed of a material that is effective in chemically isolating metal filling 122 and metal filling 124 while also being effective electrical conductors.

Insulating layer 142 and insulating layer 144 are generally dielectric materials with low electrical conductivity. For example, insulating layer 142 and insulating layer 144 can be formed of materials including silicon nitride, silicon oxide, and other suitable materials with a relatively high dielectric constants (high-k materials). Etch stop layer 150 can generally prevent over-etching such that structures below etch stop layer 150 (e.g. insulating layer 142, capping layer 160, etc.) are not damaged when structures above etch stop layer 150 are being etched. Further, etch stop layer 150 can facilitate improved precision during various etching processes. For example, a first etching process can be used until etch stop layer 150 is reached, and then a second etching process can be used to remove a portion of etch stop layer 150 that is exposed as a result of the first etching process. Etch stop layer 150 can be formed of materials such as silicon nitride, silicon carbide, silicon carbonitride, and other suitable materials. Capping layer 160 can generally be included to reduce electromigration within hybrid via interconnect structure 100. Capping layer 160 can be formed using various materials such as silicon carbon nitride, silicon nitride, cobalt tungsten phosphide, copper alloys, and other suitable materials and combinations thereof.

Hybrid via 110 itself can be formed using various materials including metals (e.g. aluminum, copper, cobalt, nickel, tungsten, ruthenium, molybdenum, platinum, palladium, etc.), alloys (copper/zinc alloys, iron/cobalt alloys, molybdenum/tantalum alloys, etc.), other conductive materials (e.g. fullerenes, carbon nanotubes, molybdenum disulfide, etc.), and various other suitable materials and combinations thereof depending on the intended application. Hybrid via 110 is generally formed of different material(s) than metal filling 122, metal filling 124, barrier metal layer 132, and barrier metal layer 134 are formed of. The use of different material(s) for hybrid via 110 can enable metallization for advanced nodes and can reduce contact resistance associated with hybrid via interconnect structure 100 overall, among other possible benefits.

Hybrid via interconnect structure 100 can generally provide reduced contact resistance and reduced interconnect resistance due to a variety of factors. For example, especially in wrapped via structures such as shown in FIGS. 7-10 (where metal filling 122 in contact with and wrapped around a portion of hybrid via 110), contact resistance can be reduced due to a larger contact area between hybrid via 110 and metal filling 122. Further, with the development of more advanced semiconductor nodes, various embodiments of hybrid via interconnect structure 100 can be easier and/or more efficient to produce depending on the intended application.

Figure 10:
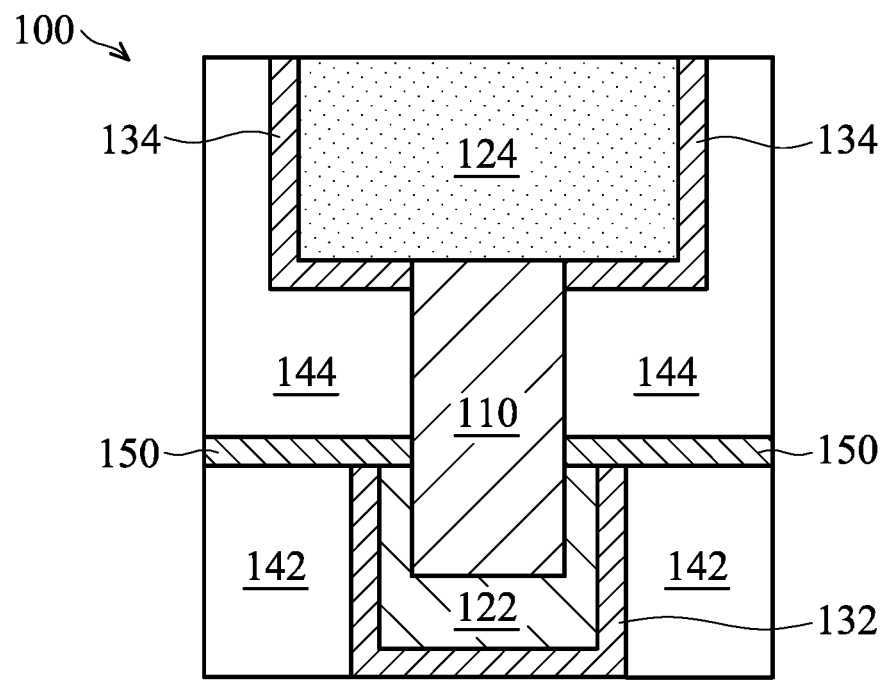
Figure 11A:
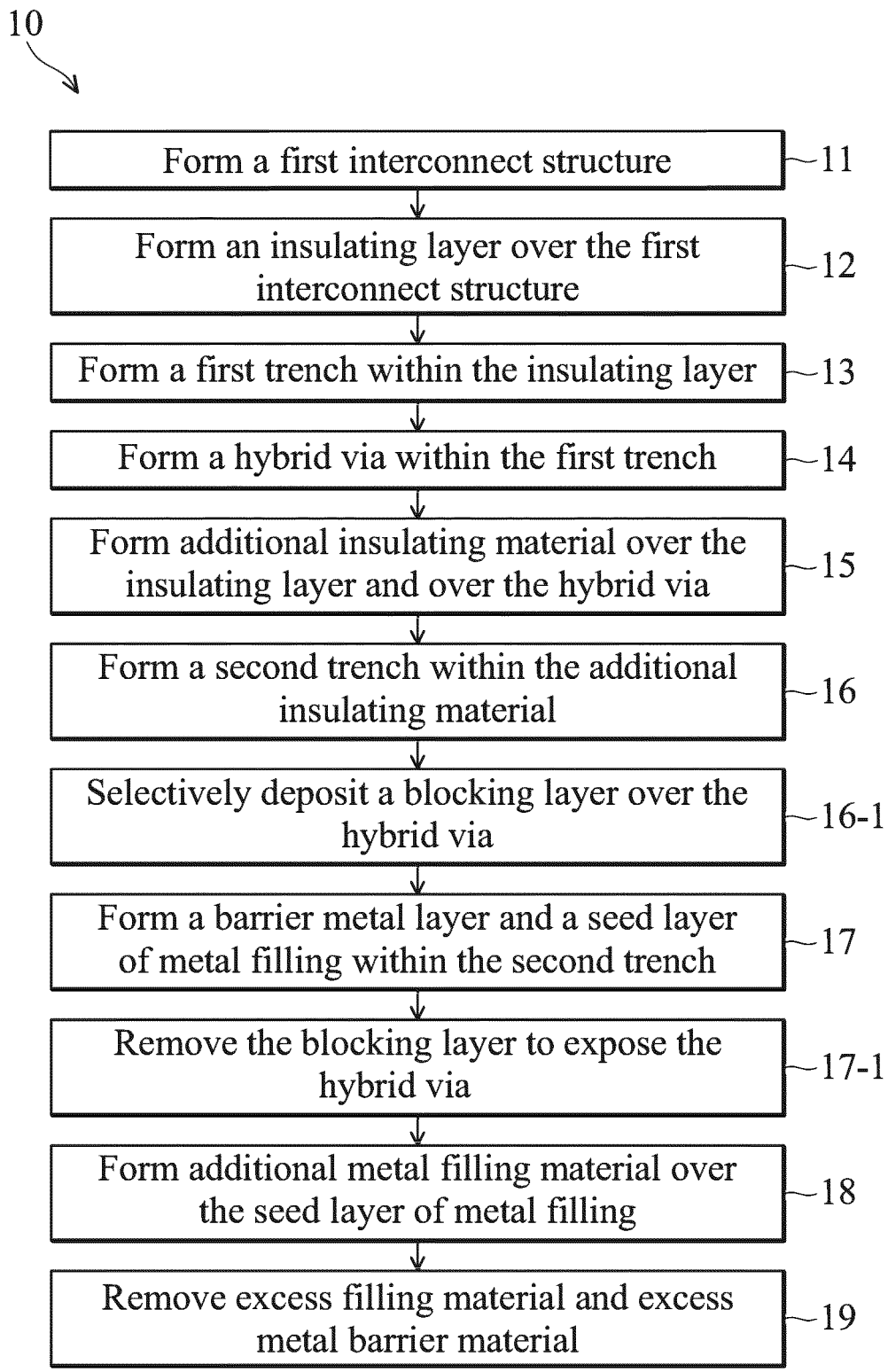
FIG. 11A is a flow diagram illustrating a process for forming the hybrid via interconnect structure of FIGS. 1-10, in accordance with some embodiments.

FIG. 11A is a flow diagram illustrating a process 10 for forming hybrid via interconnect structure 100. FIGS. 11B-11J illustrate various steps of process 10. Hybrid via interconnect structure 100 formed using process 10 can have lower contact and interconnect resistance and thereby improved performance when compared to some previous approaches. Further, process 10 can provide advantages in terms of ease and efficiency in the interconnect structure fabrication process in different applications when compared to some previous approaches. Process 10 is generally a single damascene process that involves formation of hybrid via 110 that electrically connects a metal filling 122 and a metal filling 124. Hybrid via 110 is generally formed of a different material than metal filling 122 and metal filling 124. Various adaptions of process 10 are contemplated such as described with respect to FIGS. 2-10.

Figure 11B:
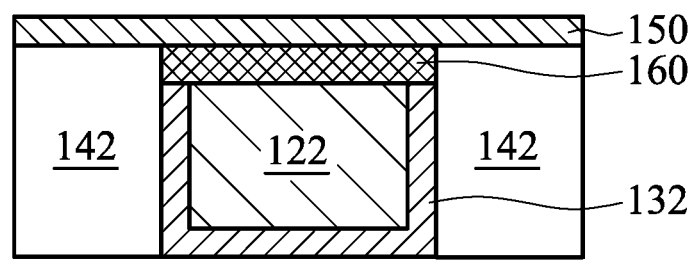
FIGS. 11B-11J illustrate various steps of the process of FIG. 11A, in accordance with some embodiments.

At a step 11, a first interconnect structure is formed (FIG. 11B). The first interconnect structure formed in step 11 includes metal filling 122, barrier metal layer 132, insulating layer 142, etch stop layer 150, and capping layer 160. The first interconnect structure can be formed on top of a contact, such as a contact formed during a middle end of line (MEOL) portion of the integrated circuit fabrication process. For example, the first interconnect structure can be formed over a gate contact. Step 11 can include depositing insulating layer 142 on a contact surface, using lithography and etching techniques to form a trench within insulating layer 142, depositing barrier metal layer 132 within the trench, forming a seed layer of metal filling 122 over barrier metal layer 132 (e.g. by using a physical vapor deposition process), filling the trench with additional metal filling material that is formed over the seed layer to form metal filling 122, using chemical-mechanical planarization to remove excess material from metal filling 122 and barrier metal layer 132, forming capping layer 160 over metal filling 122 and barrier metal layer 132, and forming etch stop layer 150 over insulating layer 142 and capping layer 160. The formation of metal filling 122 that occurs in step 11 can generally be characterized as a single damascene process, wherein the single trench is filled with metal filling 122.

Figure 11C:
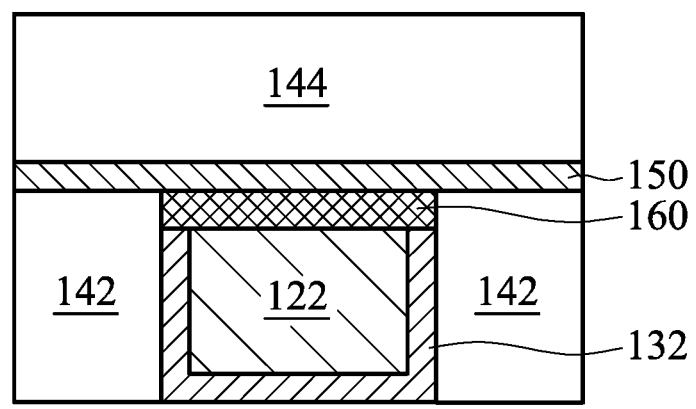

At a step 12, an insulating layer is formed over the first interconnect structure (FIG. 11C). The insulating layer formed in step 12 is insulating layer 144. As illustrated in FIG. 11C, insulating layer 144 is formed over etch stop layer 150. Formation of insulating layer 144 in step 12 can include depositing material(s) with a high dielectric constant (high-k) such as silicon oxide and silicon nitride.

Figure 11D:
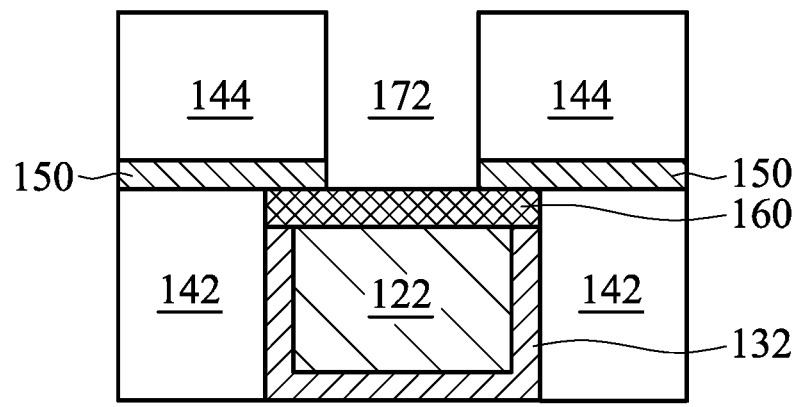

At a step 13, a first trench is formed within the insulating layer (FIG. 11D). As illustrated in FIG. 11D, a trench 172 is formed within insulating layer 144. Trench 172 can be formed using patterning and removal techniques such as suitable lithography and etching techniques. For example, a first etching process can be used to remove a portion of insulating layer 144 until etch stop layer 150 is reached. Then, a second etching process can be used to remove etching layer 150 until capping layer 160 is reached. As discussed below with respect to FIGS. 2-10, trench 172 can also be formed such that it extends into and through capping layer 160, and even into metal filling 122 as well. Trench 172 provides an opening to fill with material that becomes hybrid via 110.

Figure 11E:
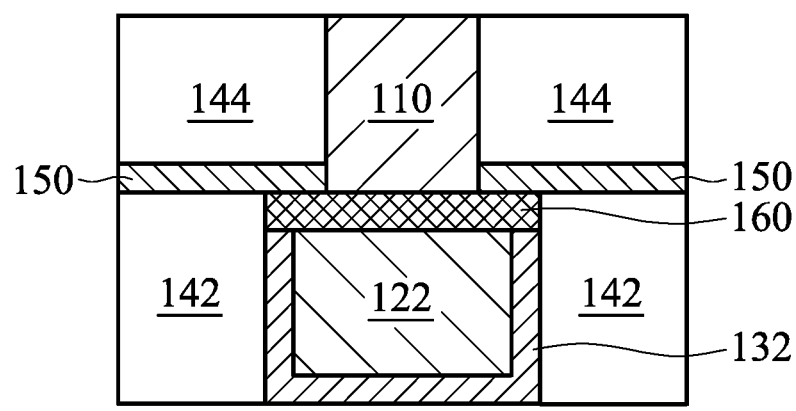

At a step 14, a hybrid via is formed within the first trench (FIG. 11E). That is, hybrid via 110 is formed within trench 172 by filling materials such as metals, alloys, and/or other conductive materials within trench 172. As illustrated in FIG. 11E, hybrid via 110 is formed such that a top surface of hybrid via 110 is flush or approximately flush with a top surface of insulating layer 144. However, as discussed below with respect to FIGS. 2-10, hybrid via 110 can also be formed such that it extends beyond the top surface of insulating layer 144. Hybrid via 110 can be formed using processes such as physical vapor deposition, chemical vapor deposition, atomic layer deposition, electrochemical deposition, and other suitable processes. In some embodiments, the process temperature for the formation of hybrid via 110 ranges from about 20 degrees Celsius to 1000 degrees Celsius, however process temperatures outside of this range are also contemplated. Further, in some embodiments, hybrid via 110 ranges in height from about 5 angstroms to 100 microns, however heights outside of this range are also contemplated.

Figure 11F:
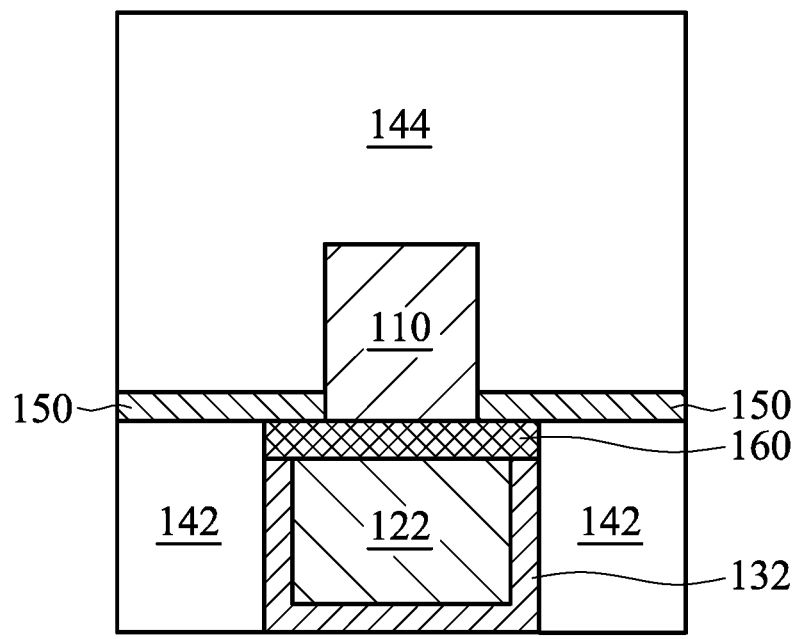

At a step 15, additional insulating material is formed over the insulating layer and over the hybrid via (FIG. 11F). The additional insulating material formed in step 15 is part of insulating layer 144. Since process 10 is a single damascene process, the additional insulating material is deposited after formation of hybrid via 110 such that it can be patterned and filled to form a second interconnect structure as discussed in more detail below. Formation of the additional insulating material in step 15 can include depositing material(s) with a high dielectric constant (high-k) such as silicon oxide and silicon nitride.

Figure 11G:
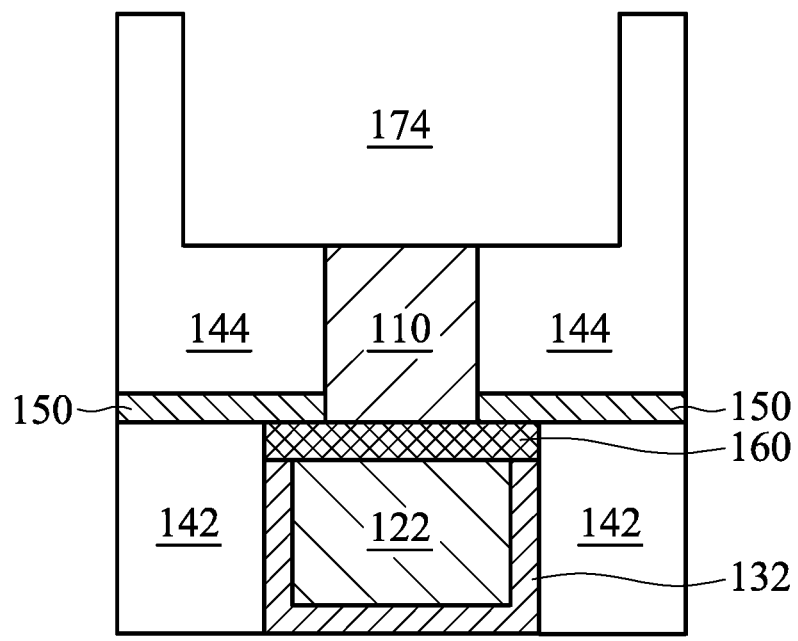

At a step 16, a second trench is formed within the additional insulating material (FIG. 11G). As illustrated in FIG. 11G, a trench 174 is formed within the additional insulating material formed as part of insulating layer 144 in step 15. Trench 174 using patterning and removal techniques such as suitable lithography and etching techniques. Trench 174 provides an opening to fill with material that becomes metal filling 124 and barrier metal layer 134, as discussed in detail below.

Figure 11H:
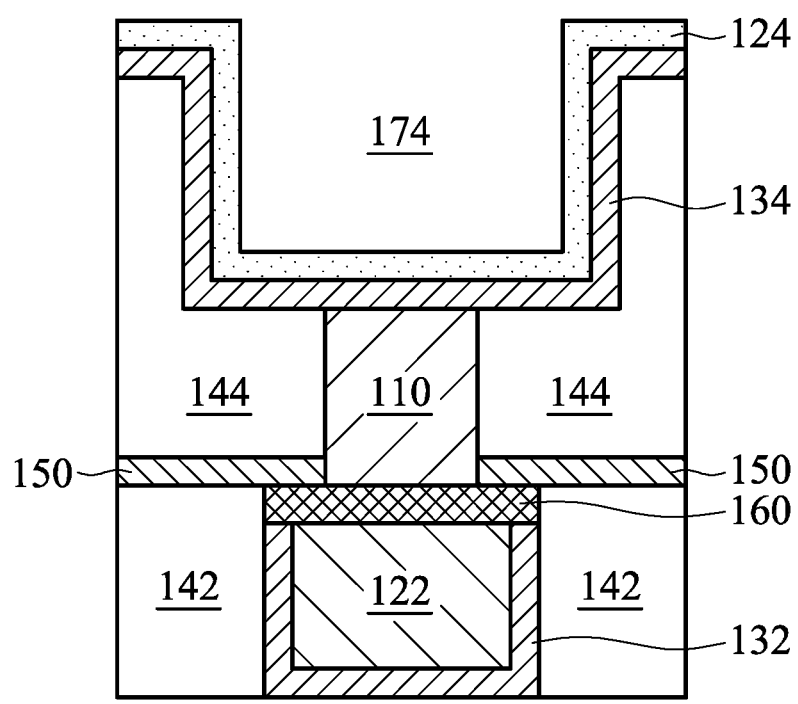

At a step 17, a barrier metal layer and a seed layer of metal filling are formed within the second trench (FIG. 11H). First, barrier metal layer 134 is deposited within trench 174. Barrier metal layer 134 can be formed of materials such as tantalum, cobalt, ruthenium, and other similar materials that are effective in chemically isolating metal filling 124 while also being effective electrical conductors. Then, the seed layer of metal filling (e.g. copper material) is formed over barrier metal layer 134. The seed layer of metal filling can provide improvements in the formation of metal filling 124 itself. For example, the seed layer can prevent formation of small air voids that can be formed between barrier metal layer 134 and metal filling 124 without the use of the seed layer. Barrier metal layer 134 and the seed layer of metal filling can be formed within trench 174 using various suitable deposition processes.

Figure 11I:
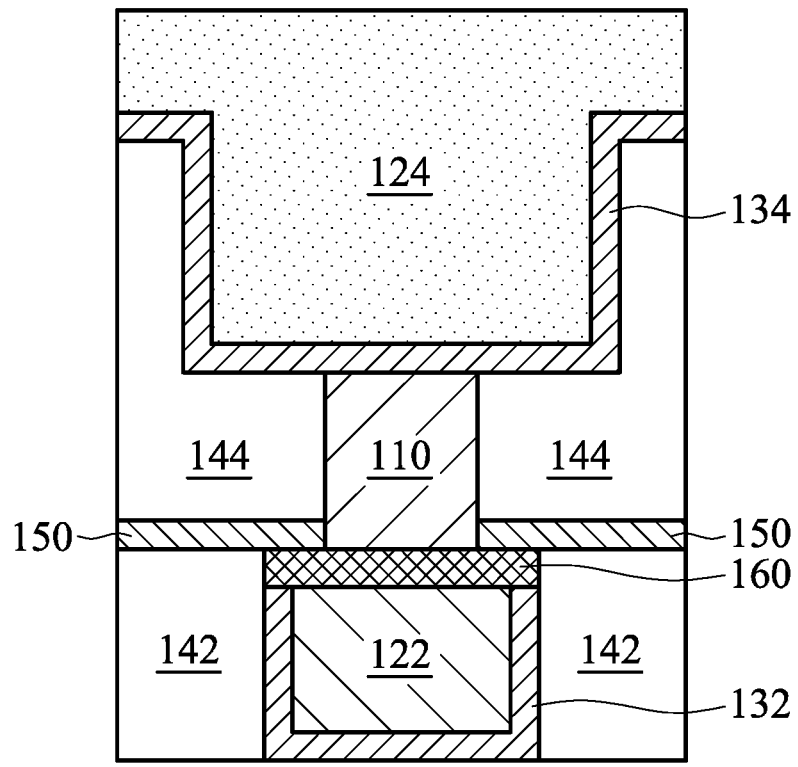

At a step 18, additional metal filling material is formed over the seed layer of metal filling (FIG. 11I). That is, the material used to form metal filling 124 (e.g. copper) is deposited within trench 174 and over the seed layer of metal filling. The additional metal filling material can be over-filled as illustrated in FIG. 11I such that it completely fills trench 174 and excess material resides above barrier metal layer 134 and insulating layer 144. The over-filling of the additional metal filling material can prevent formation of air voids and other undesirable effects that can result from an incomplete filling of the metal material.

Figure 11J:
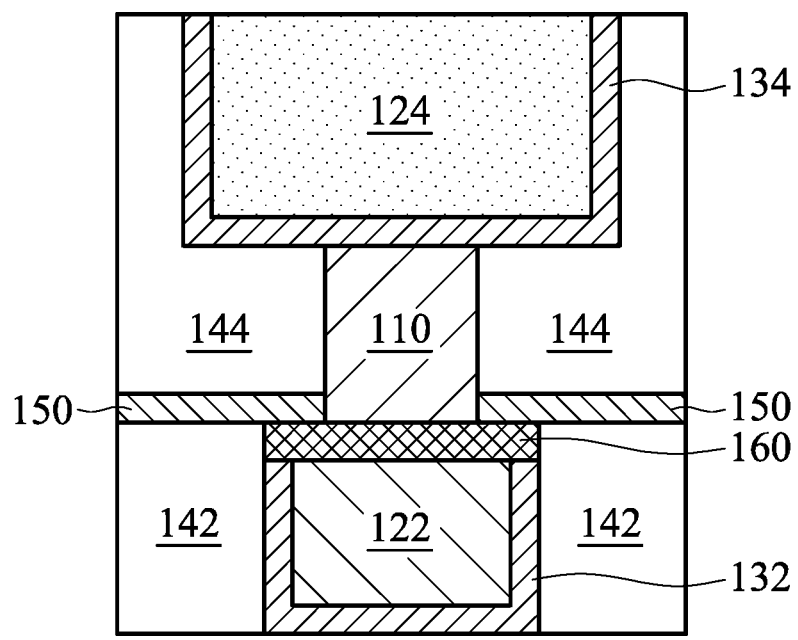

At a step 19, excess metal filling material and excess barrier metal material are removed (FIG. 11J). In some embodiments, the excess metal filling material and the excess barrier metal material are removed using a chemical-mechanical planarization process, however other suitable removal processes are also contemplated. As illustrated in FIG. 11J, the removal of excess metal filling material and excess barrier metal material can result in a structure wherein the top surfaces of insulating layer 144, barrier metal layer 134, and metal filling 124 are flush or approximately flush with each other such that the top of hybrid via interconnect structure 100 is flat or approximately flat. After step 19, the formation of hybrid via interconnect structure 100 is generally complete. Various different embodiments of hybrid via interconnect structure 100 are discussed in detail below with respect to FIGS. 2-10.

Figure 2:
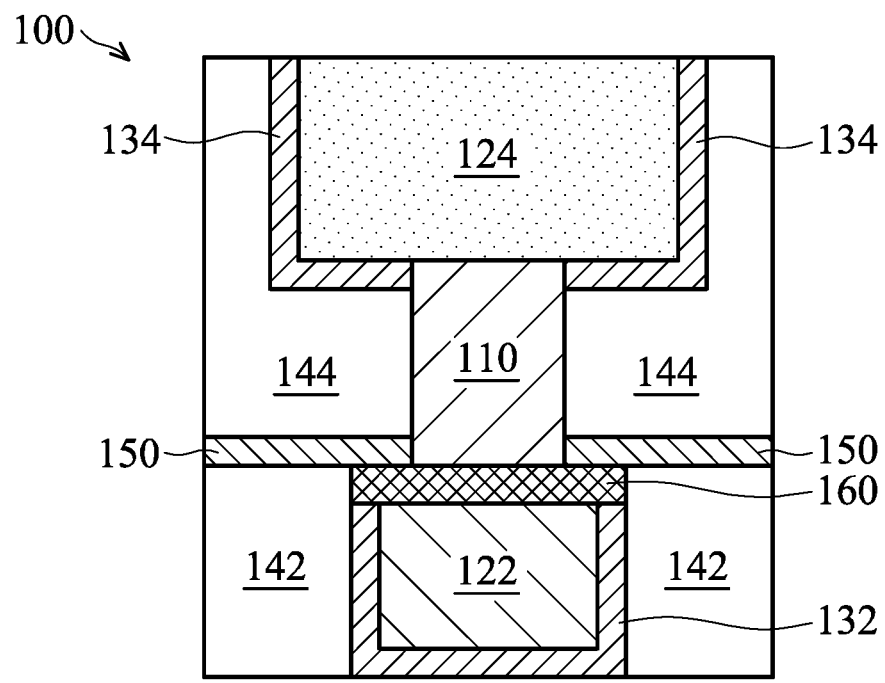

As shown in FIG. 2, another embodiment of hybrid via interconnect structure 100 includes a gap formed in barrier metal layer 134 such that hybrid via 110 is in contact with metal filling 124. To form the structure shown in FIG. 2, process 10 can be adapted such that a blocking layer is selectively deposited over hybrid via 110 between steps 16 and 17 (as indicated by step 16-1 in FIG. 11A) and removed after step 17 (as indicated by step 17-1 in FIG. 11A). More detail regarding such a blocking layer is described below. Depending on the application, the embodiment of hybrid via interconnect structure 100 illustrated in FIG. 2 can provide improved ease of fabrication and reduced contact resistance.

Figure 3:
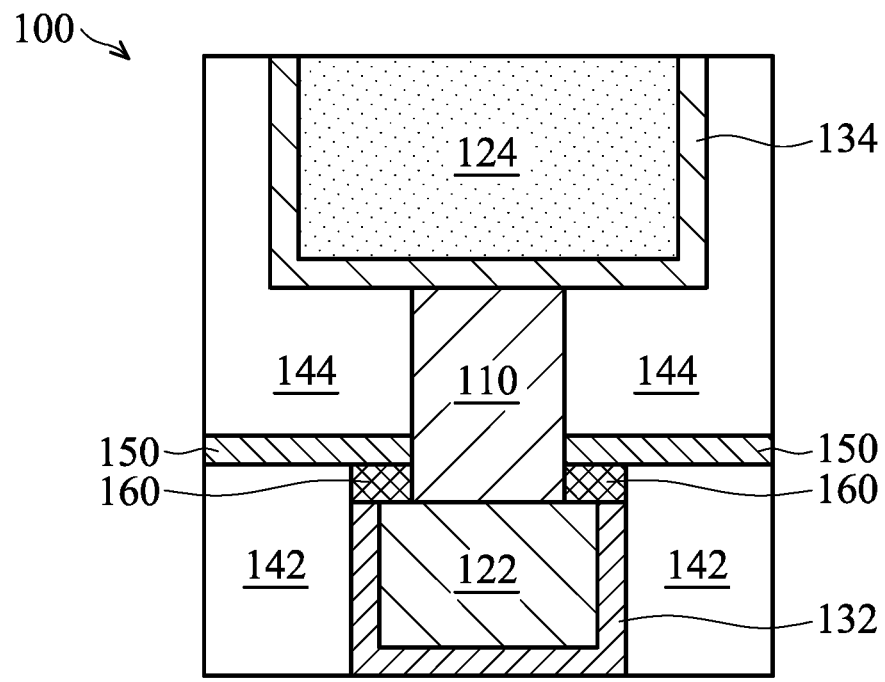

As shown in FIG. 3, another embodiment of hybrid via interconnect structure 100 includes a gap formed in capping layer 160 such that hybrid via 110 is in contact with metal filling 122. To form the structure shown in FIG. 3, process 10 can be adapted such that the formation of trench 172 performed in step 13 results in an extension of trench 172 into and through capping layer 160. Depending on the application, the embodiment of hybrid via interconnect structure 100 illustrated in FIG. 3 can provide improved ease of fabrication and reduced contact resistance.

Figure 4:
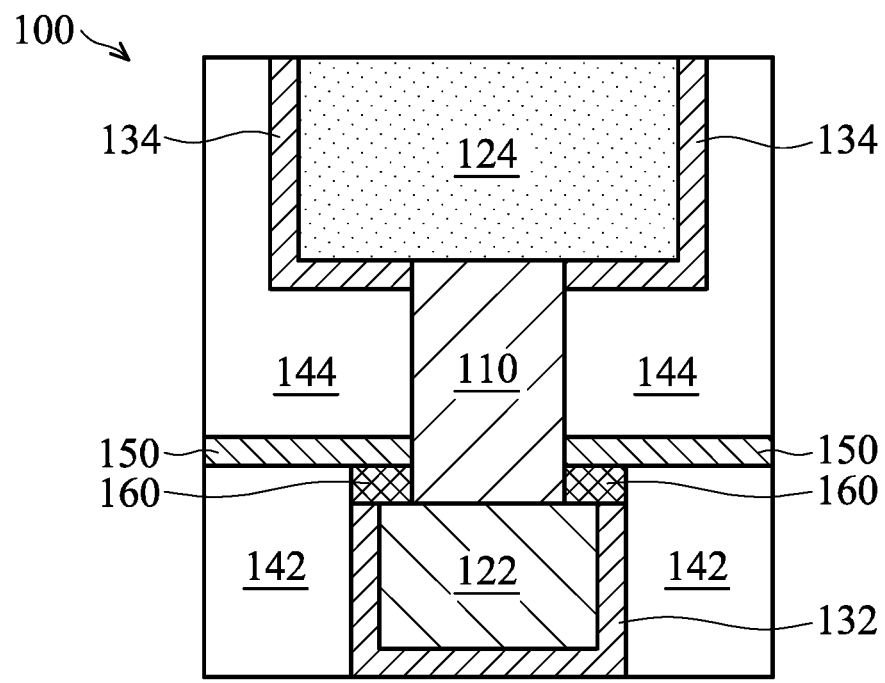

As shown in FIG. 4, another embodiment of hybrid via interconnect structure 100 includes both a gap formed in barrier metal layer 134 such that hybrid via 110 is in contact with metal filling 124 and a gap formed in capping layer 160 such that hybrid via 110 is in contact with metal filling 122. To form the gap in barrier metal layer 134, process 10 can be adapted such that a blocking layer is selectively deposited over hybrid via 110 between steps 16 and 17, and removed during step 17 after barrier metal layer 134 is formed. To form the gap in capping layer 160, process 10 can be adapted such that the formation of trench 172 performed in step 13 results in an extension of trench 172 into and through capping layer 160. Depending on the application, the embodiment of hybrid via interconnect structure 100 illustrated in FIG. 4 can provide improved ease of fabrication and reduced contact resistance.

Figure 5:
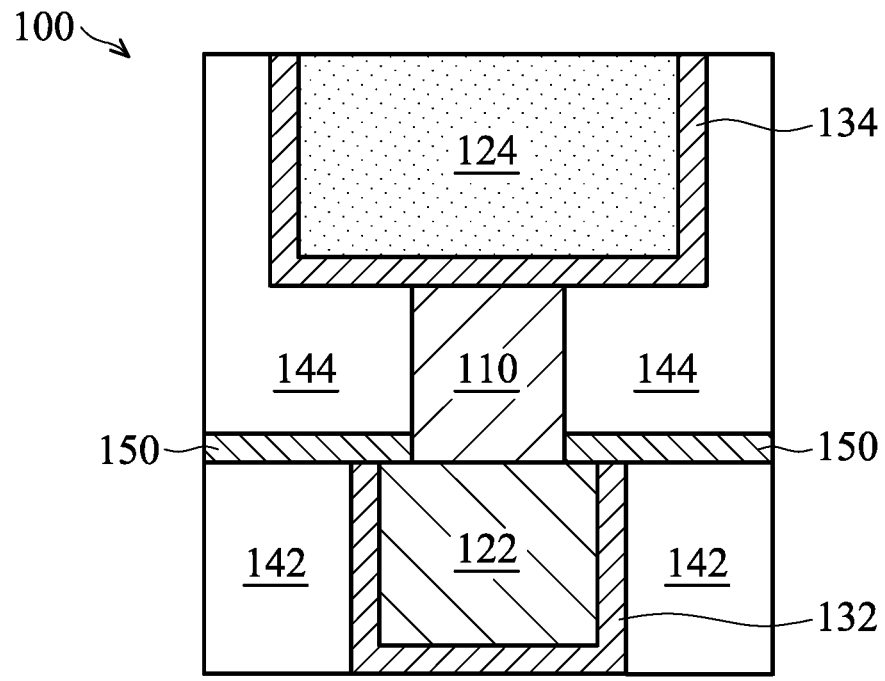

As shown in FIG. 5, another embodiment of hybrid via interconnect structure 100 does not include capping layer 160. In this structure, etch stop layer 150 and hybrid via 110 are in contact with metal filling 122 and provide a barrier on a top surface of metal filling 122 instead of capping layer 160. Depending on the application, the embodiment of hybrid via interconnect structure 100 illustrated in FIG. 5 can provide improved ease of fabrication and reduced contact resistance.

Figure 6:
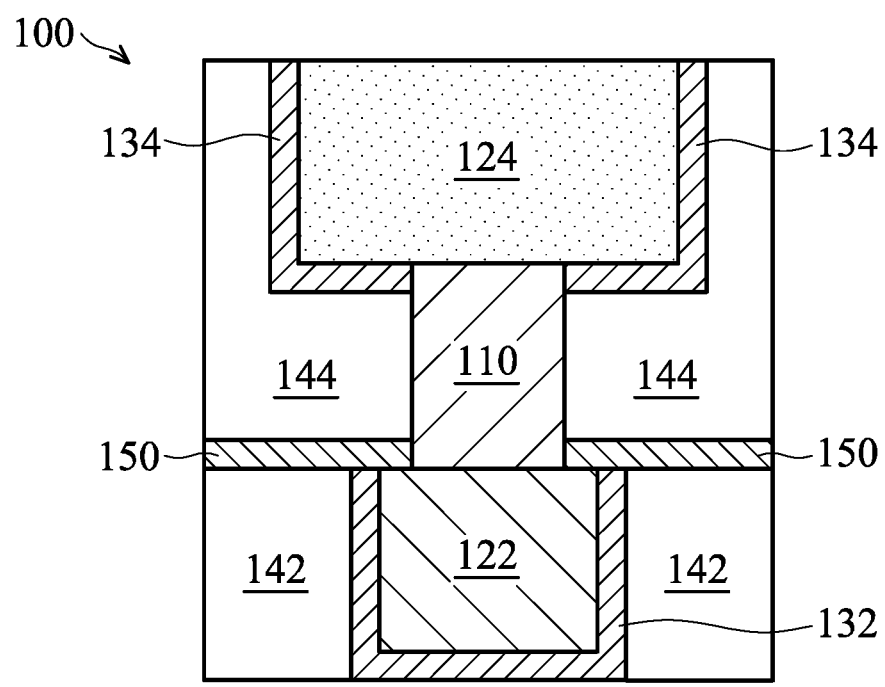

As shown in FIG. 6, another embodiment of hybrid via interconnect structure 100 does not include capping layer 160 but does include a gap formed in barrier metal layer 134 such that hybrid via 110 is in contact with metal filling 124. To form the gap in barrier metal layer 134, process 10 can be adapted such that a blocking layer is selectively deposited over hybrid via 110 between steps 16 and 17, and removed during step 17 after barrier metal layer 134 is formed. Depending on the application, the embodiment of hybrid via interconnect structure 100 illustrated in FIG. 6 can provide improved ease of fabrication and reduced contact resistance.

Figure 7:
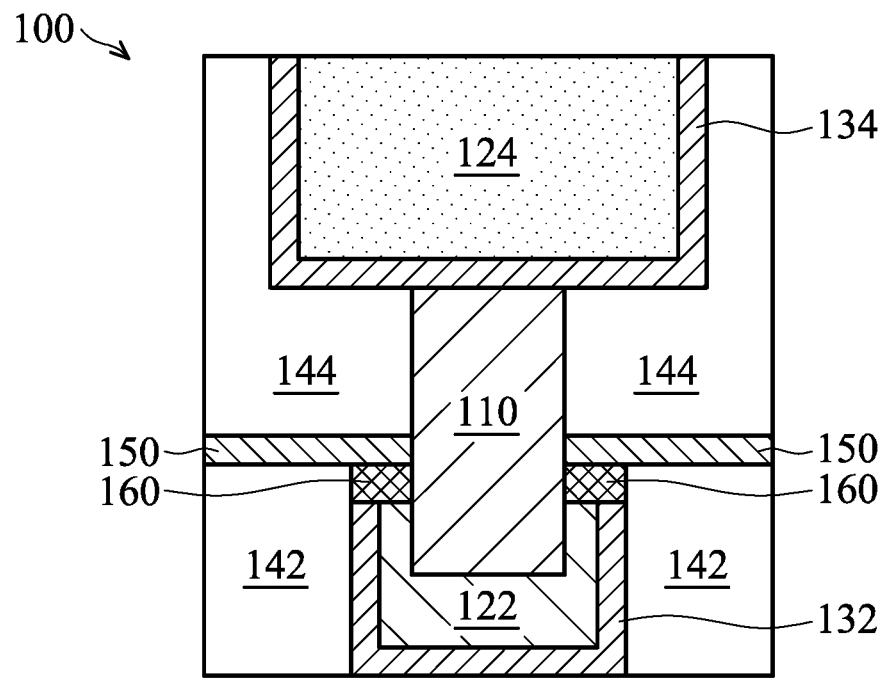

As shown in FIG. 7, another embodiment of hybrid via interconnect structure 100 includes a gap formed in capping layer 160 and an extension of hybrid via 110 into metal filling 122. Process 10 can be adapted such that the formation of trench 172 in step 13 results in an extension of trench 172 into and through capping layer 160 and into metal filling 122 such that a recess is formed within metal filling 122. Depending on the application, the embodiment of hybrid via interconnect structure 100 illustrated in FIG. 7 can provide improved ease of fabrication and reduced contact resistance.

Figure 8:
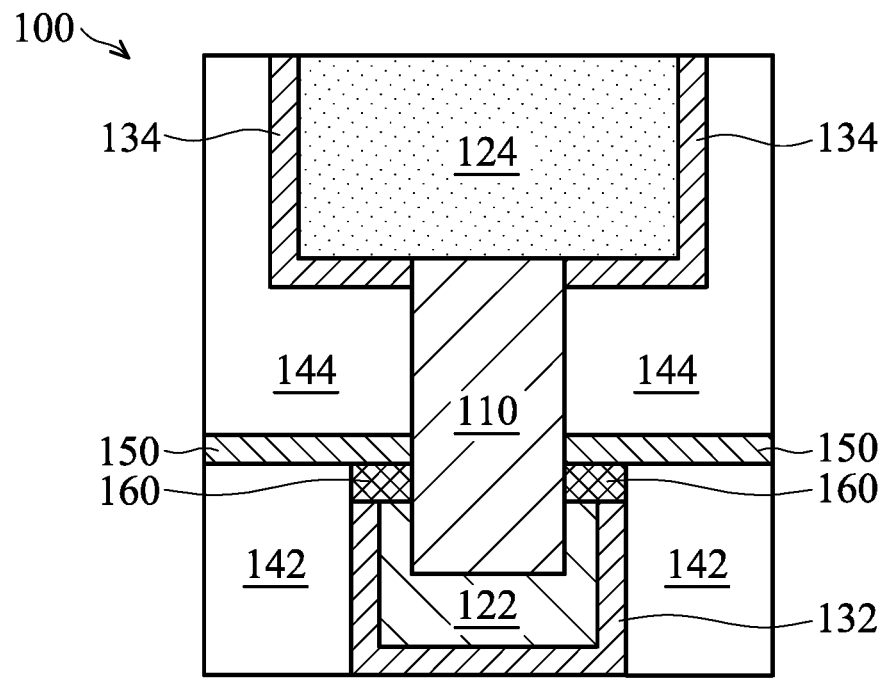

As shown in FIG. 8, another embodiment of hybrid via interconnect structure 100 includes a gap formed in barrier metal layer 134 such that hybrid via 110 is in contact with metal filling 124, a gap formed in capping layer 160, and an extension of hybrid via 110 into metal filling 122. To form the gap in barrier metal layer 134, process 10 can be adapted such that a blocking layer is selectively deposited over hybrid via 110 between steps 16 and 17, and removed during step 17 after barrier metal layer 134 is formed. Further, process 10 can be adapted such that the formation of trench 172 performed in step 13 results in an extension of trench 172 into and through capping layer 160 and into metal filling 122 such that a recess is formed within metal filling 122. Depending on the application, the embodiment of hybrid via interconnect structure 100 illustrated in FIG. 8 can provide improved ease of fabrication and reduced contact resistance.

Figure 9:
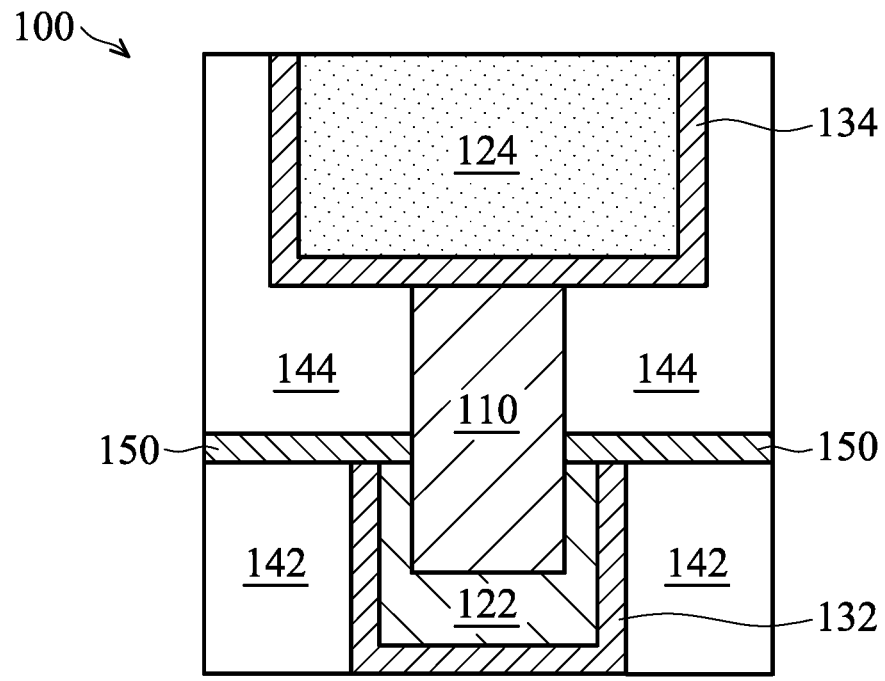

As shown in FIG. 9, another embodiment of hybrid via interconnect structure 100 does not include capping layer 160, but does include an extension of hybrid via 110 into metal filling 122. Process 10 can be adapted such that the formation of trench 172 performed in step 13 results in an extension of trench 172 into metal filling 122 such that a recess is formed within metal filling 122. Depending on the application, the embodiment of hybrid via interconnect structure 100 illustrated in FIG. 9 can provide improved ease of fabrication and reduced contact resistance.

As shown in FIG. 10, another embodiment of hybrid via interconnect structure 100 does not include capping layer 160, but does include both a gap formed in barrier metal layer 134 such that hybrid via 110 is in contact with metal filling 124 and an extension of hybrid via 110 into metal filling 122. To form the gap in barrier metal layer 134, process 10 can be adapted such that a blocking layer is selectively deposited over hybrid via 110 between steps 16 and 17, and removed during step 17 after barrier metal layer 134 is formed. Further, process 10 can be adapted such that the lithography and etching performed in step 13 results in an extension of trench 172 into metal filling 122 such that a recess is formed within metal filling 122. Depending on the application, the embodiment of hybrid via interconnect structure 100 illustrated in FIG. 10 can provide improved ease of fabrication and reduced contact resistance. Structures similar to hybrid via interconnect structure 100 can also be formed using a dual damascene process as discussed in more detail below with respect to FIGS. 12-48F.

Figure 12:
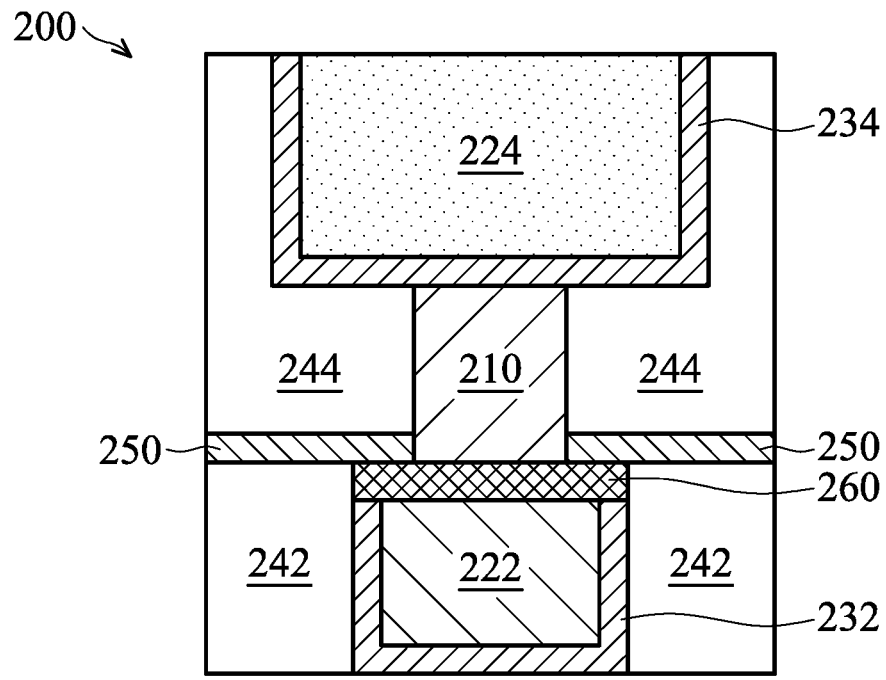
FIGS. 12-47 illustrate cross sections of various embodiments of a hybrid via interconnect structure that is formed using a dual damascene process.

FIGS. 12-47 illustrate cross sections of various embodiments of a hybrid via interconnect structure 200 that is formed using a dual damascene process. Hybrid via interconnect structure 200 can generally be formed during the BEOL portion of an IC fabrication process. As shown in FIG. 12, hybrid via interconnect structure 200 includes a first metal filling 222 and a second metal filling 224 electrically connected by a hybrid via 210. Metal filling 222 is surrounded by a barrier metal layer 232 and a capping layer 260. Metal filling 224 is surrounded by a barrier metal layer 234. Metal filling 222 can be completely surrounded by the combination of barrier metal layer 232 and capping layer 260. Metal filling 224 can be partially surrounded by barrier metal layer 234 or completely surrounded by barrier metal layer 234 (although this is not explicitly shown in FIG. 12). These layers are adjacent to an insulating layer 242 and an insulating layer 244 separated by an etch stop layer 250.

In some embodiments, both metal filling 222 and metal filling 224 are copper interconnects. However, metal filling 222 and metal filling 224 can be formed of other suitable materials (e.g. aluminum, etc.). Barrier metal layer 232 and barrier metal layer 234 chemically isolate metal filling 222 and metal filling 224, respectively, from surrounding materials such as silicon and other materials. For example, barrier metal layer 232 can prevent diffusion of metal filling 222 into insulating layer 242. Barrier metal layer 232 and barrier metal layer 234 can be formed using materials such as tantalum, cobalt, ruthenium, and other suitable materials. Barrier metal layer 232 and barrier metal layer 234 are generally formed of material(s) that are effective in chemically isolating metal filling 222 and metal filling 224 while also being effective electrical conductors.

Insulating layer 242 and insulating layer 244 are generally dielectric materials with low electrical conductivity. For example, insulating layer 242 and insulating layer 244 can be formed of materials including silicon nitride, silicon oxide, and other suitable materials with a relatively high dielectric constants (high-k materials). Etch stop layer 250 can generally prevent over-etching such that structures below etch stop layer 250 (e.g. insulating layer 242, capping layer 260, etc.) are not damaged when structures above etch stop layer 250 are being etched. Further, etch stop layer 250 can facilitate improved precision during various etching processes. For example, a first etching process can be used until etch stop layer 250 is reached, and then a second etching process can be used to remove a portion of etch stop layer 250 that is exposed as a result of the first etching process. Etch stop layer 250 can be formed of materials such as silicon nitride, silicon carbide, silicon carbonitride, and other suitable materials. Capping layer 260 can generally be included to reduce electromigration within hybrid via interconnect structure 200. Capping layer 260 can be formed using various materials such as silicon carbon nitride, silicon nitride, cobalt tungsten phosphide, copper alloys, and other suitable materials and combinations thereof.

Hybrid via 210 itself can be formed of various materials including metals (e.g. aluminum, copper, cobalt, nickel, tungsten, ruthenium, molybdenum, platinum, palladium, etc.), alloys (copper/zinc alloys, iron/cobalt alloys, molybdenum/tantalum alloys, etc.), other conductive materials (e.g. fullerenes, carbon nanotubes, molybdenum disulfide, etc.), and other suitable materials and combinations thereof. Hybrid via 210 is generally formed of different material(s) than metal filling 222, metal filling 224, barrier metal layer 232, and barrier metal layer 234. The use of different material(s) for hybrid via 210 can enable metallization for advanced nodes and can reduce contact resistance associated with hybrid via interconnect structure 200 overall.

Hybrid via interconnect structure 200 can generally provide reduced contact resistance and reduced interconnect resistance due to a variety of factors. For example, especially in wrapped via structures such as shown in FIGS. 18-21, 23, 25, 27-31, 36-39, 41, and 43-47 (where metal filling 222 and/or metal filling 224 is in contact with and wrapped around part of hybrid via 110), contact resistance can be reduced due to a larger contact area between hybrid via 210 and metal filling 222 and/or metal filling 224. Further, with the development of more advanced semiconductor nodes, various embodiments of hybrid via interconnect structure 200 can be easier and/or more efficient to produce.

Figure 47:
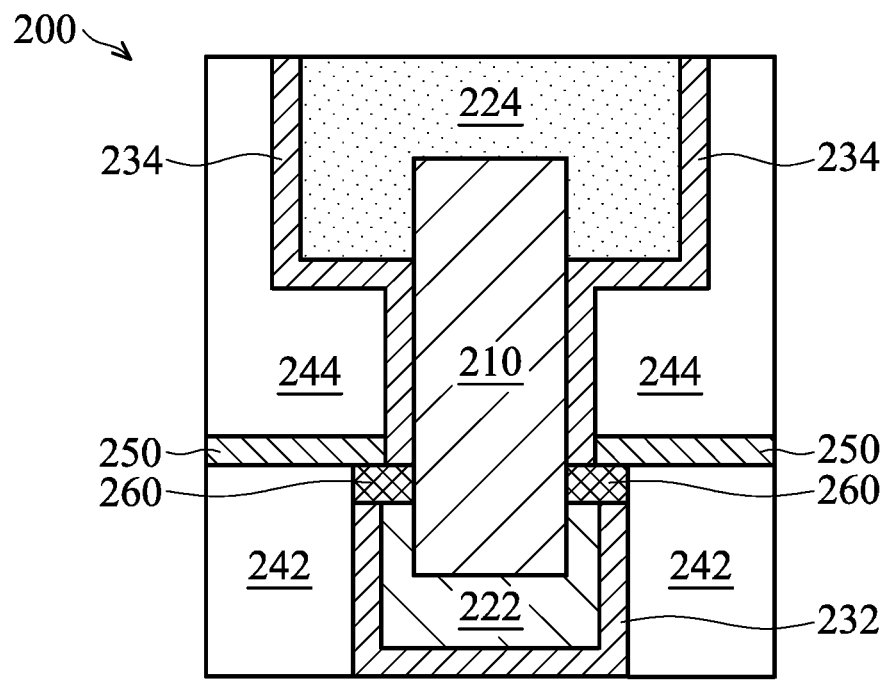
Figure 48A:
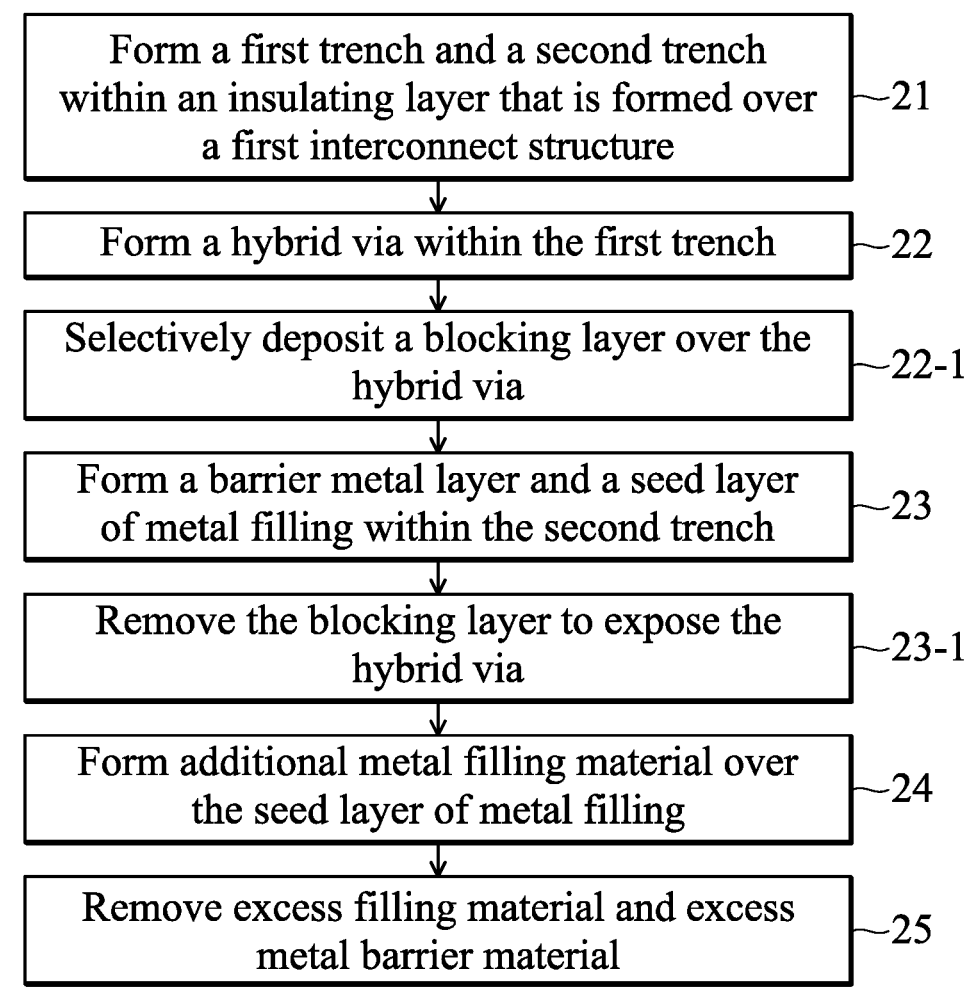
FIG. 48A is a flow diagram illustrating a process for forming the hybrid via interconnect structure of FIGS. 12-47, in accordance with some embodiments.

FIG. 48A is a flow diagram illustrating a process 20 for forming hybrid via interconnect structure 200. FIGS. 48B-48F illustrate various steps of process 20. Hybrid via interconnect structure 200 formed using process 20 can have lower contact and interconnect resistance and thereby improved performance when compared to some previous approaches. Further, process 20 can provide advantages in terms of ease and efficiency in the interconnect structure fabrication process in different applications when compared to some previous approaches. Process 20 is generally a dual damascene process that involves formation of hybrid via 210 that electrically connects a metal filling 222 and a metal filling 224. Hybrid via 210 is generally formed of different material(s) than metal filling 222 and metal filling 224. Various adaptions of process 20 are contemplated such as described with respect to FIGS. 13-47.

Figure 48B:
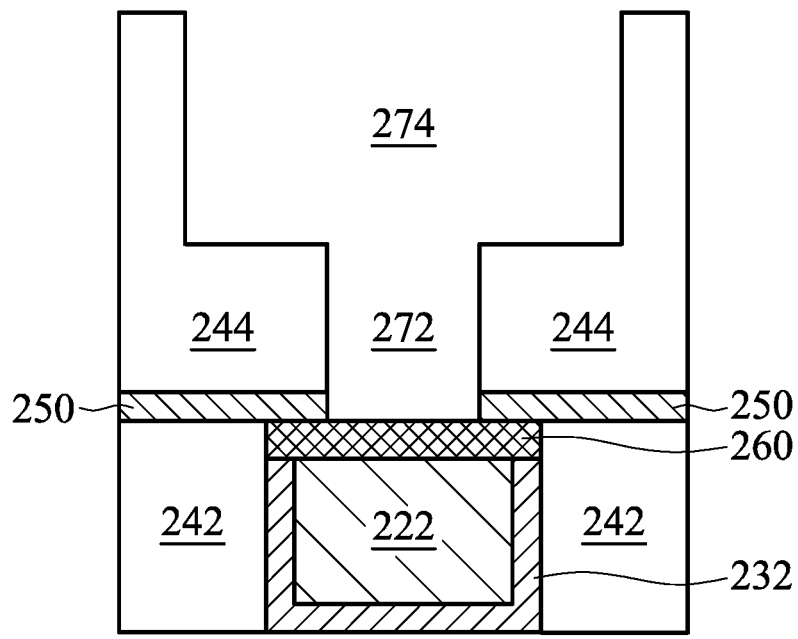
FIGS. 48B-48F illustrate various steps of the process of FIG. 11A, in accordance with some embodiments.

At a step 21, a first trench and a second trench are formed within an insulating layer that is formed over a first interconnect structure (FIG. 48B). As illustrated in FIG. 48B, a trench 272 and a trench 274 are formed within insulating layer 244. As process 20 is a dual damascene process, both trench 272 and trench 274 can be formed before hybrid via 210 is formed, as opposed to process 10 wherein first trench 172 is formed, then hybrid via 110 is formed, then trench 174 is formed. The first interconnect structure includes metal filling 222, barrier metal layer 232, insulating layer 242, etch stop layer 250, and capping layer 260. The first interconnect structure can be formed on top of a contact, such as a contact formed during the MEOL portion of an IC fabrication process. For example, the first interconnect structure can be formed over a gate contact. The first interconnect structure can be formed by depositing insulating layer 242 on a contact surface, forming a trench within insulating layer 242, forming barrier metal layer 232 within the trench, forming a seed layer of metal filling over barrier metal layer 232, forming additional metal filling material over the seed layer to form metal filling 222, removing excess material from metal filling 222 and barrier metal layer 232, forming capping layer 260 over metal filling 222 and barrier metal layer 232, and forming etch stop layer 250 over insulating layer 242 and capping layer 260.

Figure 48C:
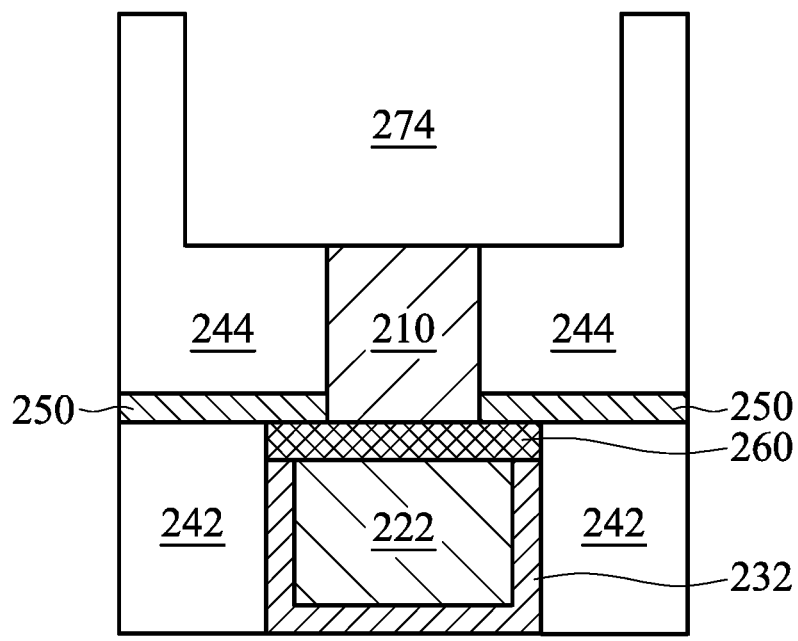

At a step 22, a hybrid via is formed within the first trench (FIG. 48C). As illustrated in FIG. 48C, hybrid via 210 is formed within trench 272 by filling materials such as metals, alloys, and/or other conductive materials within trench 272. As illustrated in FIG. 48C, hybrid via 210 is formed such that a top surface of hybrid via 210 is flush or approximately flush with a bottom surface of trench 274. However, as discussed below with respect to FIGS. 13-47, hybrid via 210 can also be formed such that it extends into trench 274. Hybrid via 210 can be formed using processes such as physical vapor deposition, chemical vapor deposition, atomic layer deposition, electrochemical deposition, and other suitable processes and combinations thereof. In some embodiments, the process temperature for forming of hybrid via 210 ranges from about 20 degrees Celsius to 1000 degrees Celsius, however process temperatures outside of this range are also contemplated. Further, in some embodiments, hybrid via 210 ranges from about 5 angstroms to 100 microns in height, however heights outside of this range are also contemplated.

Figure 48D:
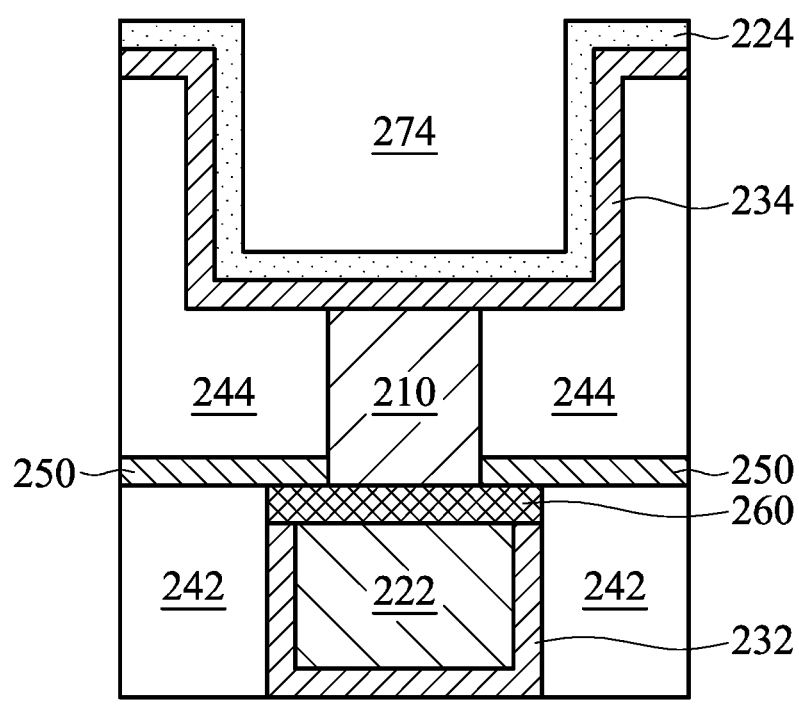

At a step 23, a barrier metal layer and a seed layer of metal filling are formed within the second trench (FIG. 48D). First, barrier metal layer 234 is deposited within trench 274. Barrier metal layer 234 can be formed of materials such as tantalum, cobalt, ruthenium, and other similar materials that are effective in chemically isolating metal filling 224 while also being effective electrical conductors. Then, the seed layer of metal filling (e.g. copper material) is formed over barrier metal layer 234. The seed layer of metal filling can provide improvements in the formation of metal filling 224 itself. For example, the seed layer can prevent formation of small air voids that can be formed between barrier metal layer 234 and metal filling 224 without the use of the seed layer. Barrier metal layer 234 and the seed layer of metal filling can be formed within trench 274 using various suitable deposition processes.

Figure 48E:
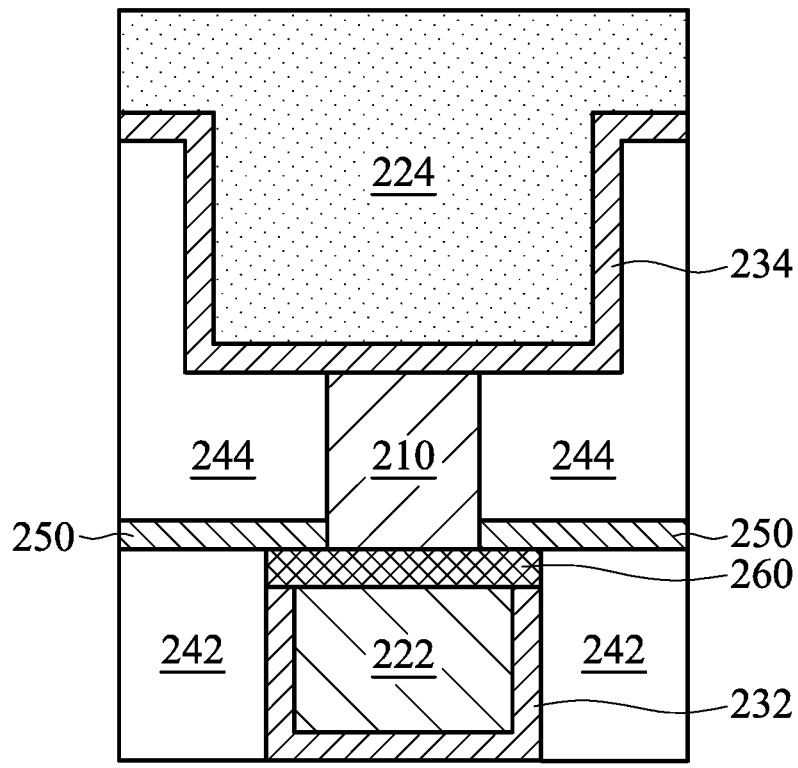

At a step 24, additional metal filling material is formed over the seed layer of metal filling (FIG. 48E). That is, the material used to form metal filling 224 (e.g. copper) is deposited within trench 274 and over the seed layer of metal filling. The additional metal filling material can be over-filled as illustrated in FIG. 48E such that it completely fills trench 274 and excess material resides above barrier metal layer 234 and insulating layer 244. The over-filling of the additional metal filling material can prevent formation of air voids and other undesirable effects that can result from an incomplete filling.

Figure 48F:
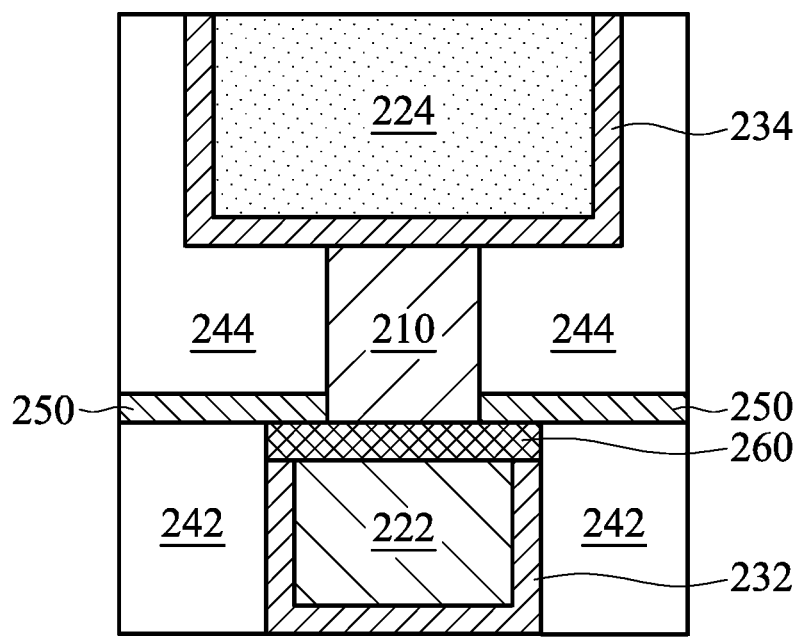

At a step 25, excess metal filling material and excess barrier metal material is removed (FIG. 48F). In some embodiments, the excess metal filling material and excess barrier metal material are removed using a chemical-mechanical planarization process. As illustrated in FIG. 48F, the removal of excess metal filling material and excess barrier metal material can result in a structure wherein the top surfaces of insulating layer 244, barrier metal layer 234, and metal filling 224 are flush or approximately flush with each other such that the top of hybrid via interconnect structure 200 is flat or approximately flat. After step 25, the formation of hybrid via interconnect structure 200 is generally complete. Various different embodiments of hybrid via interconnect structure 100 are discussed in detail below with respect to FIGS. 13-47.

Figure 13:
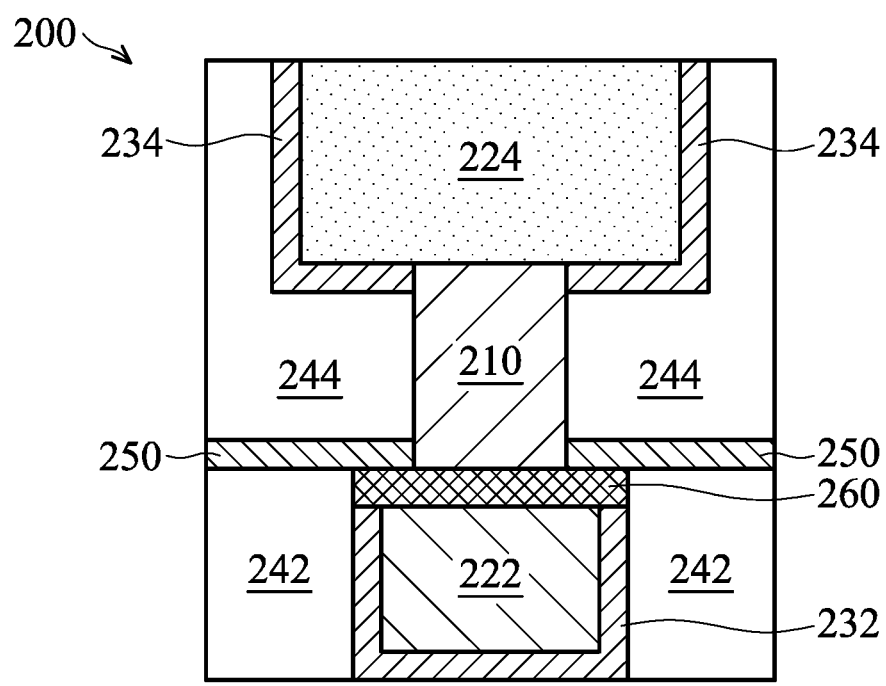

As shown in FIG. 13, another embodiment of hybrid via interconnect structure 200 includes a gap formed in barrier metal layer 234 such that hybrid via 210 is in contact with metal filling 224. To form the structure shown in FIG. 13, process 20 can be adapted such that a blocking layer is selectively deposited over hybrid via 210 between steps 22 and 23 (as indicated by step 22-1 in FIG. 48A) and removed after barrier metal layer 234 is formed in step 23 has indicated by step 23-1 in FIG. 48A). The blocking layer is described in more detail below. Depending on the application, the embodiment of hybrid via interconnect structure 200 illustrated in FIG. 13 can provide improved ease of fabrication and reduced contact resistance.

Figure 14:
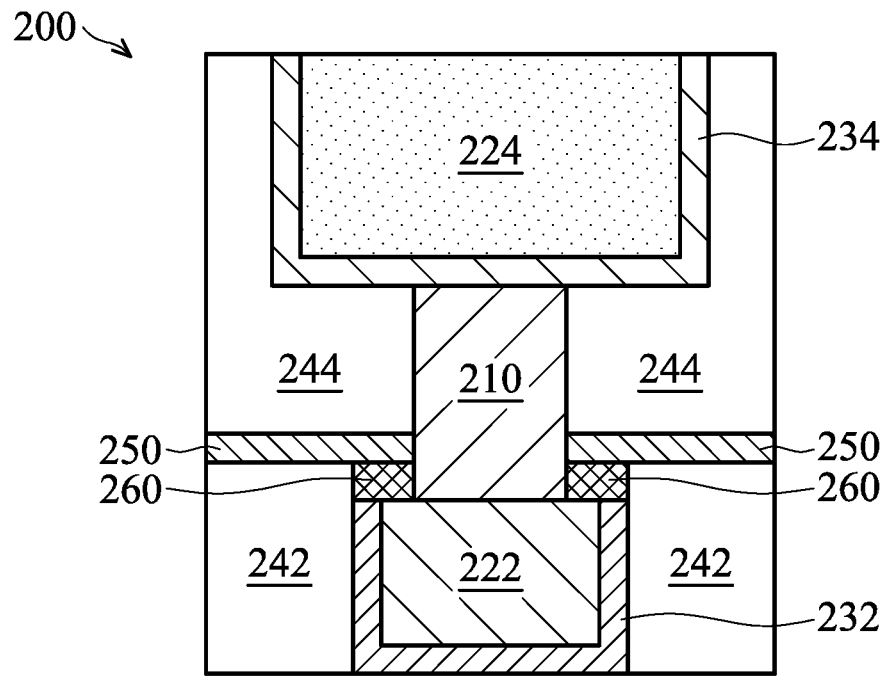

As shown in FIG. 14, another embodiment of hybrid via interconnect structure 200 includes a gap formed in capping layer 260 such that hybrid via 210 is in contact with metal filling 222. To form the structure shown in FIG. 14, process 20 can be adapted such that the formation of trench 272 performed in step 21 results in an extension of trench 272 into and through capping layer 260. Depending on the application, the embodiment of hybrid via interconnect structure 200 illustrated in FIG. 14 can provide improved ease of fabrication and reduced contact resistance.

Figure 15:
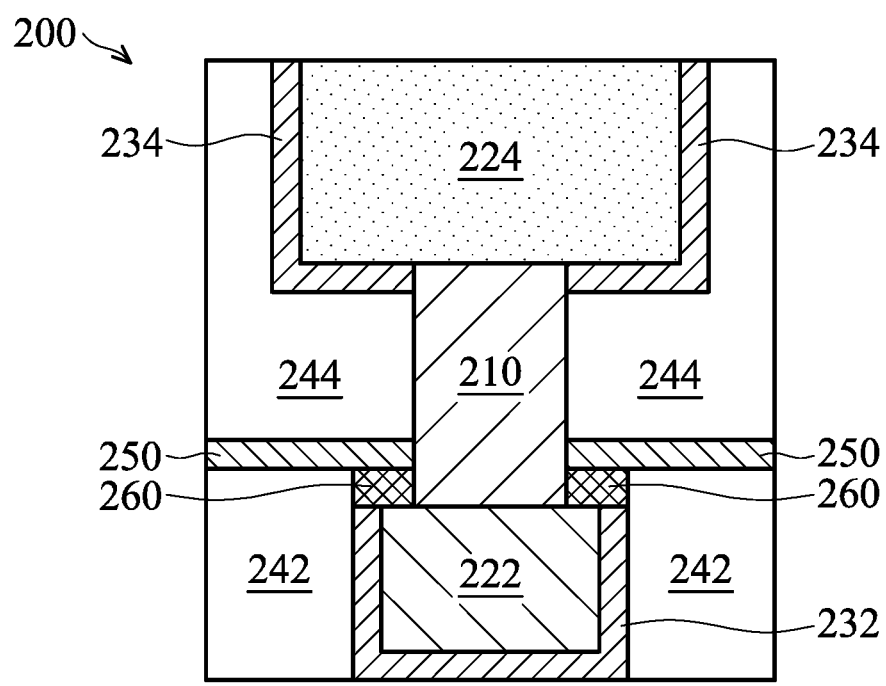

As shown in FIG. 15, another embodiment of hybrid via interconnect structure 200 includes both includes a gap formed in barrier metal layer 234 such that hybrid via 210 is in contact with metal filling 224 and a gap formed in capping layer 260 such that hybrid via 210 is in contact with metal filling 222. To form the gap in barrier metal layer 234, process 20 can be adapted such that a blocking layer is selectively deposited over hybrid via 210 between steps 22 and 23, and removed during step 23 after barrier metal layer 234. To form the gap in capping layer 260, process 20 can be adapted such that the formation of trench 272 performed in step 21 results in an extension of trench 272 into and through capping layer 260. Depending on the application, the embodiment of hybrid via interconnect structure 200 illustrated in FIG. 15 can provide improved ease of fabrication and reduced contact resistance.

Figure 16:
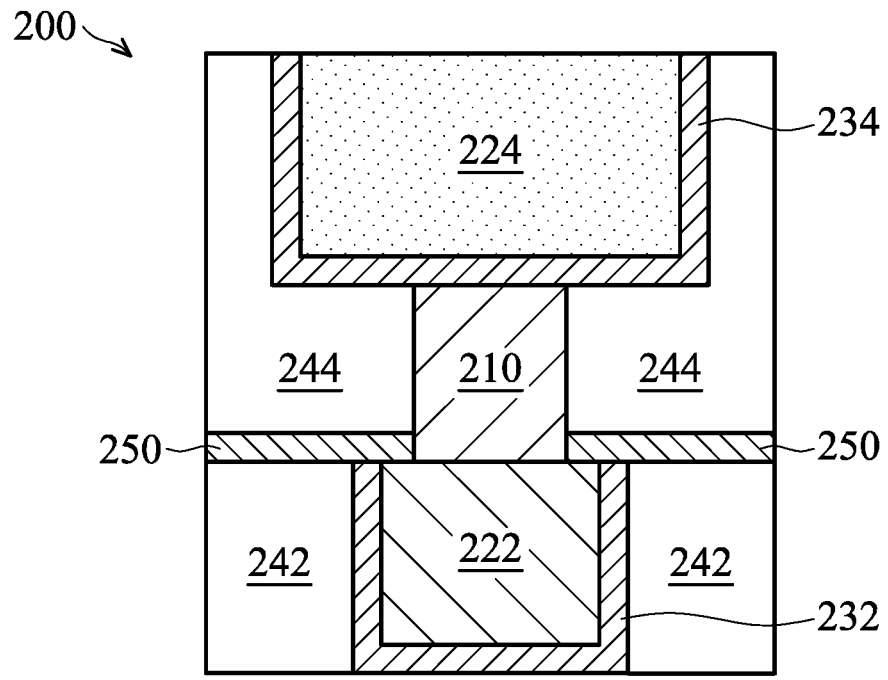

As shown in FIG. 16, another embodiment of hybrid via interconnect structure 200 does not include capping layer 260. In this structure, etch stop layer 250 and hybrid via 210 are both in contact with metal filling 222 instead of capping layer 260. Depending on the application, the embodiment of hybrid via interconnect structure 200 illustrated in FIG. 16 can provide improved ease of fabrication and reduced contact resistance.

Figure 17:
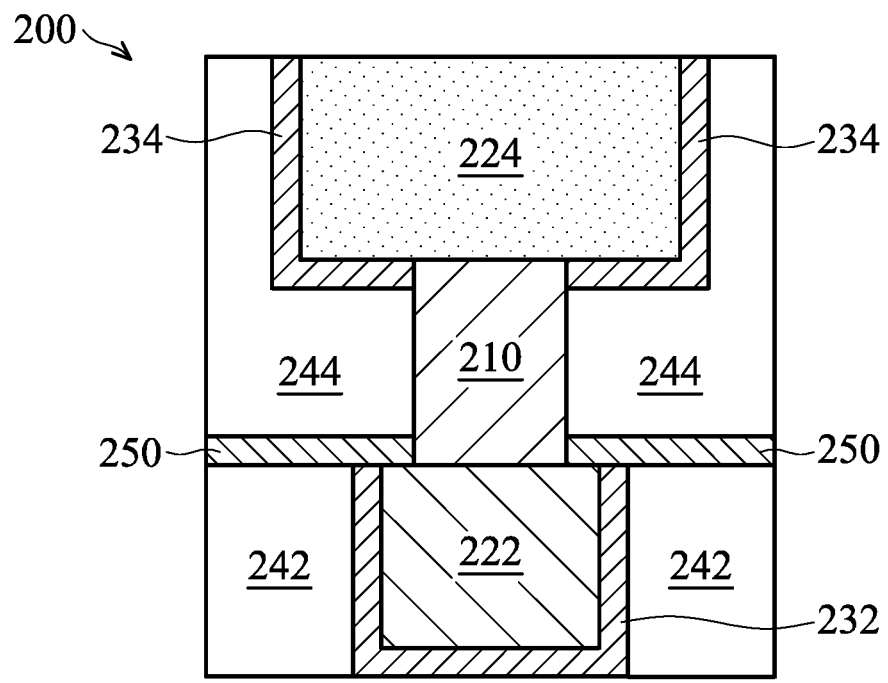

As shown in FIG. 17, another embodiment of hybrid via interconnect structure 200 does not include capping layer 260 but does include a gap formed in in barrier metal layer 234 such that hybrid via 210 is in contact with metal filling 224. In this structure, hybrid via 210 is in contact with both metal filling 222 and metal filling 224. To form the gap in barrier metal layer 234, process 20 can be adapted such that a blocking layer is selectively deposited over hybrid via 210 between steps 22 and 23, and removed after forming barrier metal layer 234 in step 23. Depending on the application, the embodiment of hybrid via interconnect structure 200 illustrated in FIG. 17 can provide improved ease of fabrication and reduced contact resistance.

Figure 18:
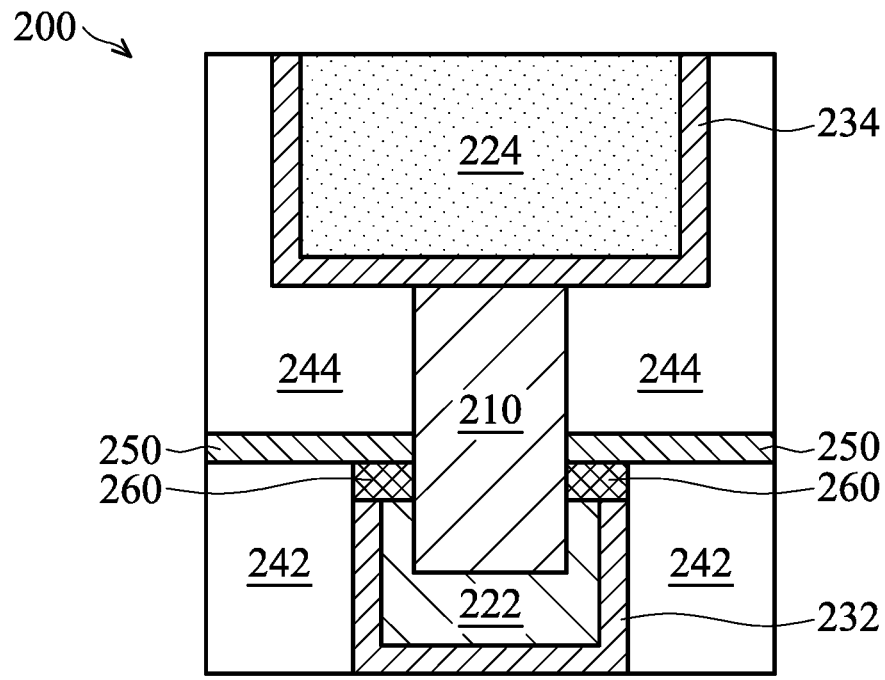

As shown in FIG. 18, another embodiment of hybrid via interconnect structure 200 includes a gap formed in capping layer 260 and an extension of hybrid via 210 into metal filling 222. Process 20 can be adapted such that the formation of trench 272 performed in step 21 results in an extension of trench 272 into and through capping layer 260 and into metal filling 222 such that a recess is formed within metal filling 222. Then, hybrid via 210 can be formed within the recess at step 22 such that metal filling 222 is in contact with and wrapped around a portion of hybrid via 210. Depending on the application, the embodiment of hybrid via interconnect structure 200 illustrated in FIG. 18 can provide improved ease of fabrication and reduced contact resistance.

Figure 19:
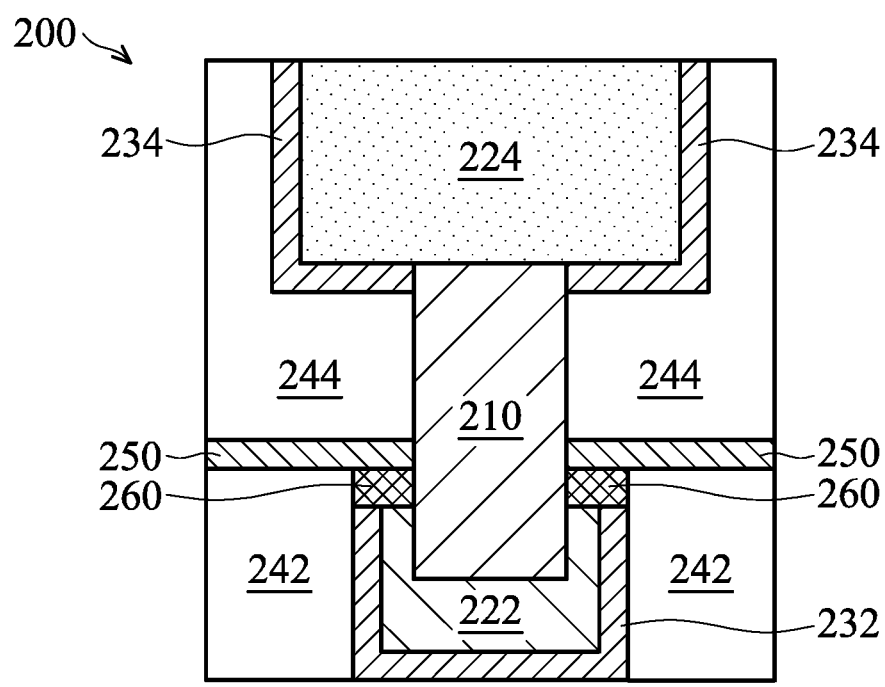

As shown in FIG. 19, another embodiment of hybrid via interconnect structure 200 includes a gap formed in in barrier metal layer 234 such that hybrid via 210 is in contact with metal filling 224, a gap formed in capping layer 260, and an extension of hybrid via 210 into metal filling 222. To form the gap in barrier metal layer 234, process 20 can be adapted such that a blocking layer is selectively deposited over hybrid via 210 between steps 22 and 23, and removed during step 23 after barrier metal layer 234 is formed. Further, process 20 can be adapted such that the formation of trench 272 performed in step 21 results in an extension of trench 272 into and through capping layer 260 and into metal filling 222 such that a recess is formed within metal filling 222. Then, hybrid via 210 can be formed within the recess at step 22 such that metal filling 222 is in contact with and wrapped around a portion of hybrid via 210. Depending on the application, the embodiment of hybrid via interconnect structure 200 illustrated in FIG. 19 can provide improved ease of fabrication and reduced contact resistance.

Figure 20:
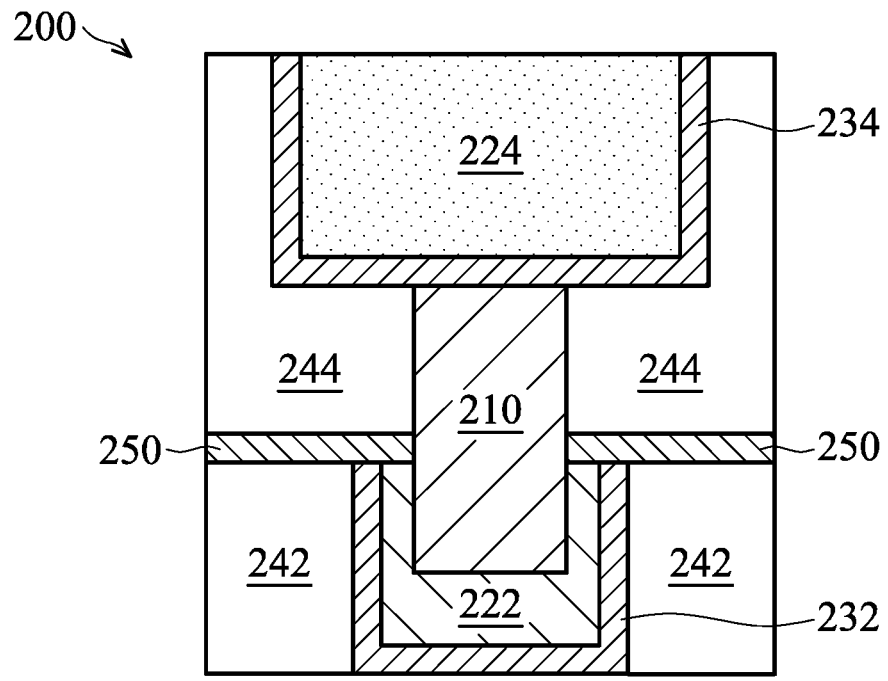

As shown in FIG. 20, another embodiment of hybrid via interconnect structure 200 does not include capping layer 260 but does include an extension of hybrid via 210 into metal filling 222. Process 20 can be adapted such that the formation of trench 272 performed in step 21 results in an extension of trench 272 into metal filling 222 such that a recess is formed within metal filling 222. Then, hybrid via 210 can be formed within the recess at step 22 such that metal filling 222 is in contact with and wrapped around a portion of hybrid via 210. Depending on the application, the embodiment of hybrid via interconnect structure 200 illustrated in FIG. 20 can provide improved ease of fabrication and reduced contact resistance.

Figure 21:
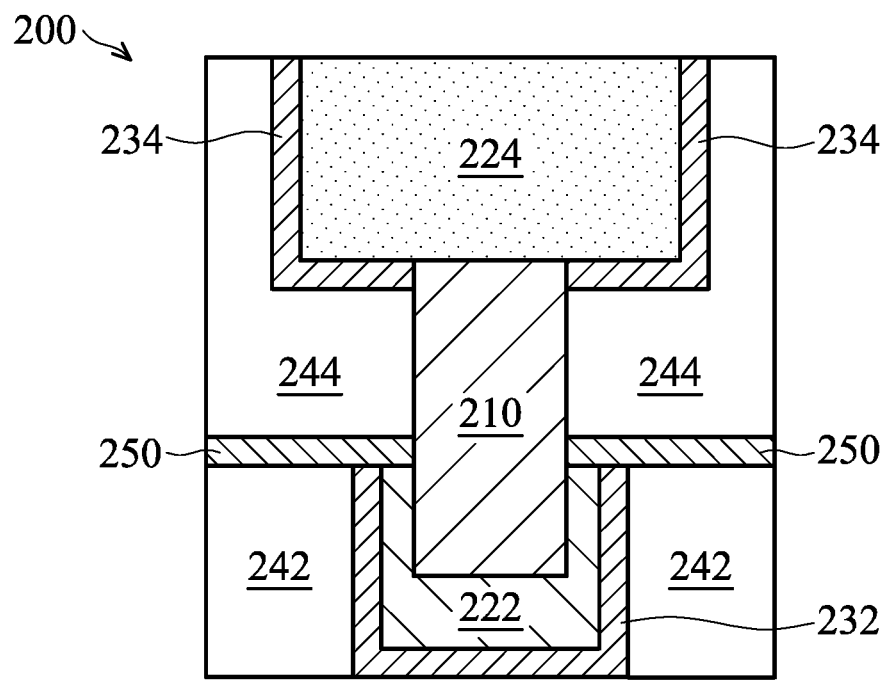

As shown in FIG. 21, another embodiment of hybrid via interconnect structure 200 does not include capping layer 260 but does include includes a gap formed in in barrier metal layer 234 such that hybrid via 210 is in contact with metal filling 224 and an extension of hybrid via 210 into metal filling 222. To form the gap in barrier metal layer 234, process 20 can be adapted such that a blocking layer is selectively deposited over hybrid via 210 between steps 22 and 23, and removed during step 23 after barrier metal layer 234 is formed. Further, process 20 can be adapted such that the formation of trench 272 performed in step 21 results in an extension of trench 272 into metal filling 222 such that a recess is formed within metal filling 222. Then, hybrid via 210 can be formed within the recess at step 22 such that metal filling 222 is in contact with and wrapped around a portion of hybrid via 210. Depending on the application, the embodiment of hybrid via interconnect structure 200 illustrated in FIG. 21 can provide improved ease of fabrication and reduced contact resistance.

Figure 22:
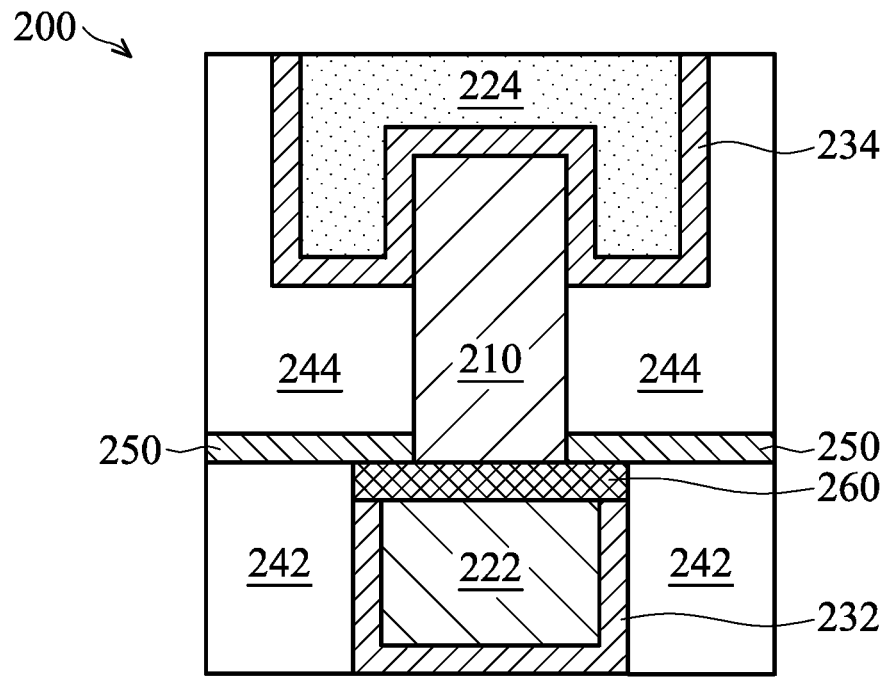

As shown in FIG. 22, another embodiment of hybrid via interconnect structure 200 includes an extension of hybrid via 210 into metal filling 224, wherein the portion of hybrid via 210 that extends into metal filling 224 is surrounded by barrier metal layer 234 such that hybrid via 210 is not in contact with metal filling 224. To form the structure shown in FIG. 22, process 20 can be adapted at step 22 such that hybrid via 210 not only fills trench 272, but it also extends into trench 274. Depending on the application, the embodiment of hybrid via interconnect structure 200 illustrated in FIG. 22 can provide improved ease of fabrication and reduced contact resistance.

Figure 23:
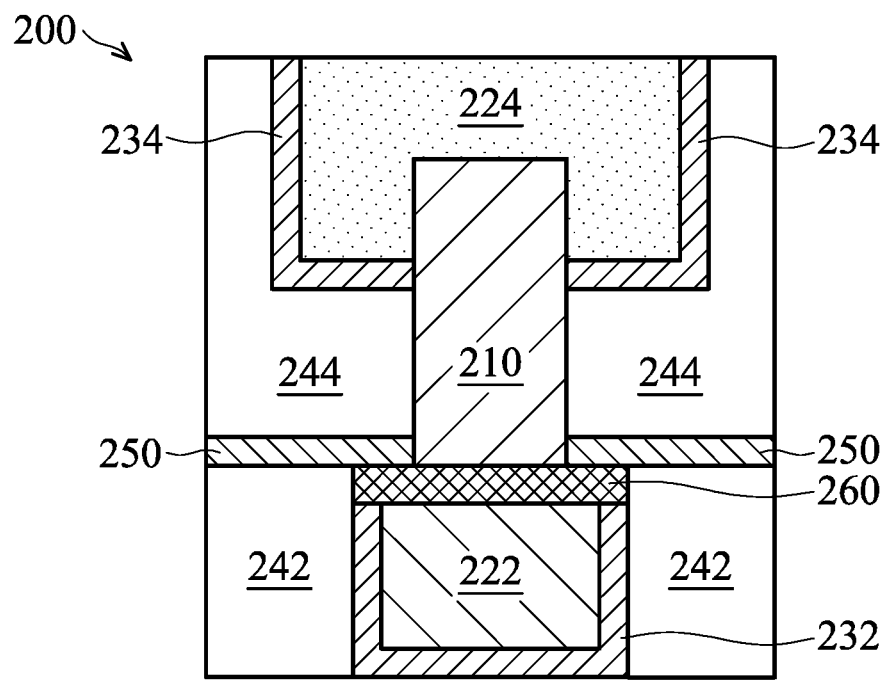

As shown in FIG. 23, another embodiment of hybrid via interconnect structure 200 includes an extension of hybrid via 210 into metal filling 224, wherein the portion of hybrid via 210 that extends into metal filling 224 is not surrounded by barrier metal layer 234 and is instead barrier-free in that metal filling 224 is in contact with and wrapped around a portion of hybrid via 210. In this sense, a recess is formed within metal filling 224 that is filled by hybrid via 210. To form this structure, process 20 can be adapted at step 22 such that hybrid via 210 not only fills trench 272, but it also extends into trench 274. Further, a blocking layer can be selectively deposited over hybrid via 210 between steps 22 and 23, and removed during step 23 after barrier metal layer 234 is formed. Depending on the application, the embodiment of hybrid via interconnect structure 200 illustrated in FIG. 23 can provide improved ease of fabrication and reduced contact resistance.

Figure 24:
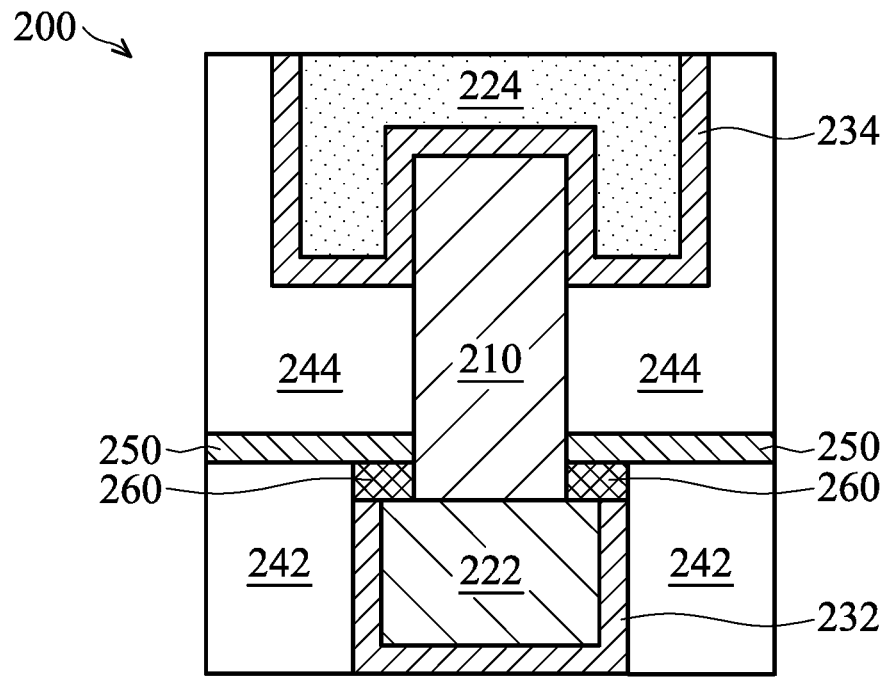

As shown in FIG. 24, another embodiment of hybrid via interconnect structure 200 includes a gap formed in capping layer 260 such that hybrid via 210 is in contact with metal filling 222 and an extension of hybrid via 210 into metal filling 224, wherein the portion of hybrid via 210 that extends into metal filling 224 is surrounded by barrier metal layer 234 such that hybrid via 210 is not in contact with metal filling 224. To form the gap in capping layer 260, process 20 can be adapted such that the formation of trench 272 performed in step 21 results in an extension of trench 272 into and through capping layer 260. Further, process 20 can be adapted at step 22 such that hybrid via 210 not only fills trench 272, but it also extends into trench 274. Depending on the application, the embodiment of hybrid via interconnect structure 200 illustrated in FIG. 22 can provide improved ease of fabrication and reduced contact resistance.

Figure 25:
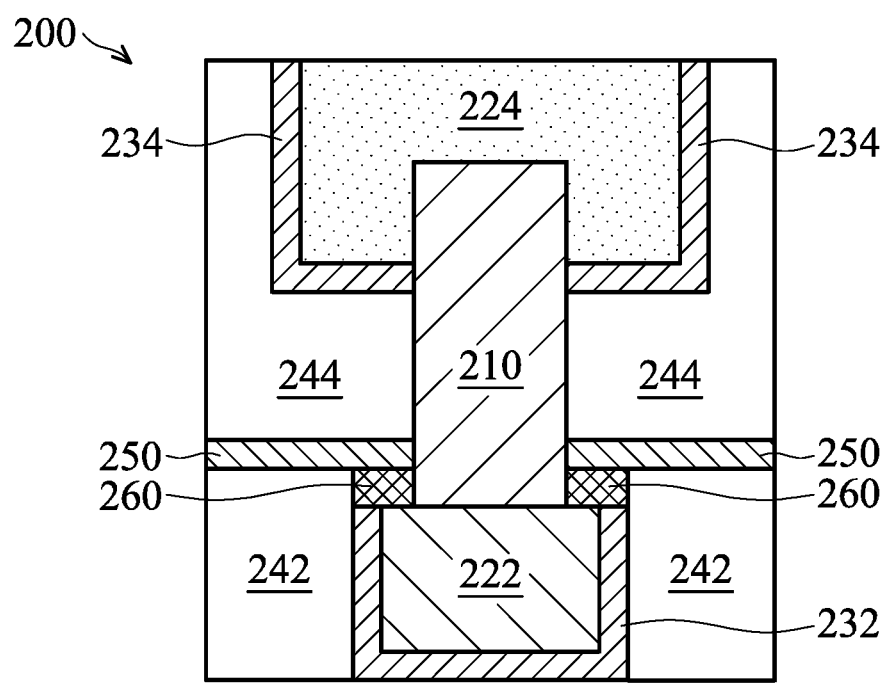

As shown in FIG. 25, another embodiment of hybrid via interconnect structure 200 includes a gap formed in capping layer 260 and an extension of hybrid via 210 into metal filling 224, wherein the portion of hybrid via 210 that extends into metal filling 224 is not surrounded by barrier metal layer 234 and is instead barrier-free in that metal filling 224 is in contact with and wrapped around a portion of hybrid via 210. To form the gap in capping layer 260, process 20 can be adapted such that the formation of trench 272 performed in step 21 results in an extension of trench 272 into and through capping layer 260. Further, process 20 can be adapted at step 22 such that hybrid via 210 not only fills trench 272, but it also extends into trench 274, and a blocking layer can be selectively deposited over hybrid via 210 between steps 22 and 23 and removed during step 23 after barrier metal layer 234 is formed. Depending on the application, the embodiment of hybrid via interconnect structure 200 illustrated in FIG. 25 can provide improved ease of fabrication and reduced contact resistance.

Figure 26:
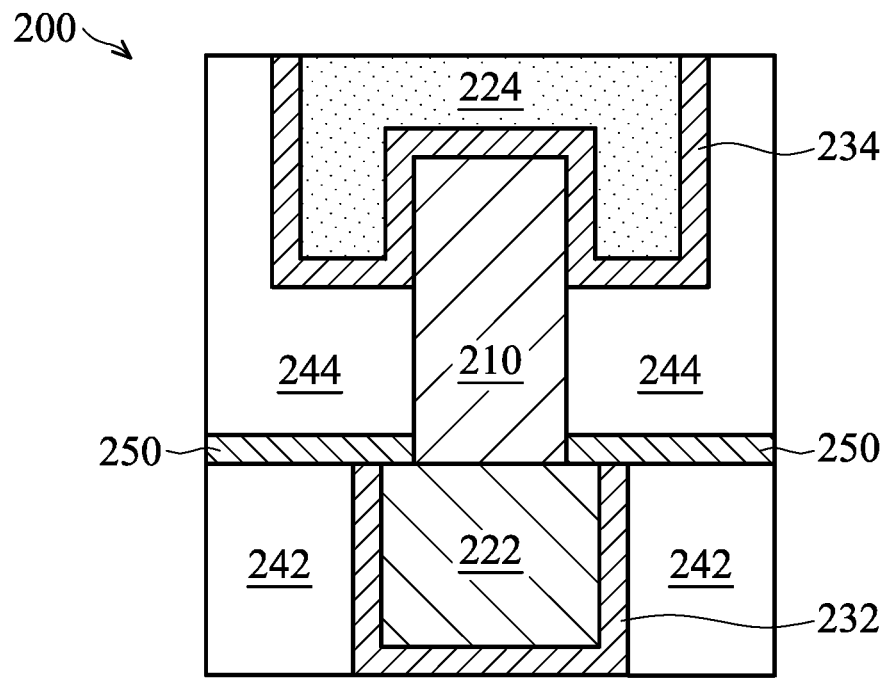

As shown in FIG. 26, another embodiment of hybrid via interconnect structure 200 does not include capping layer 260 but does include an extension of hybrid via 210 into metal filling 224, wherein the portion of hybrid via 210 that extends into metal filling 224 is surrounded by barrier metal layer 234 such that hybrid via 210 is not in contact with metal filling 224. Without capping layer 260, both hybrid via 210 and etch stop layer 250 are in contact with metal filling 222. Process 20 can be adapted at step 22 such that hybrid via 210 not only fills trench 272, but it also extends into trench 274. Depending on the application, the embodiment of hybrid via interconnect structure 200 illustrated in FIG. 26 can provide improved ease of fabrication and reduced contact resistance.

Figure 27:
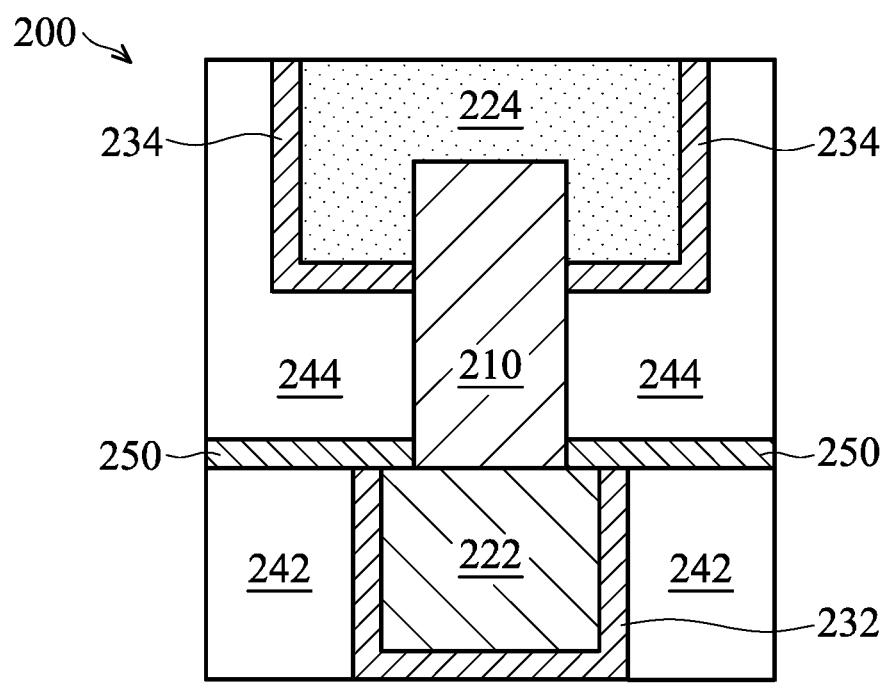

As shown in FIG. 27, another embodiment of hybrid via interconnect structure 200 does not include capping layer 260 but does include an extension of hybrid via 210 into metal filling 224, wherein the portion of hybrid via 210 that extends into metal filling 224 is not surrounded by barrier metal layer 234 and is instead barrier-free in that metal filling 224 is in contact with and wrapped around a portion of hybrid via 210. Process 20 can be adapted at step 22 such that hybrid via 210 not only fills trench 272, but it also extends into trench 274. Further, a blocking layer can be selectively deposited over hybrid via 210 between steps 22 and 23. Depending on the application, the embodiment of hybrid via interconnect structure 200 illustrated in FIG. 27 can provide improved ease of fabrication and reduced contact resistance.

Figure 28:
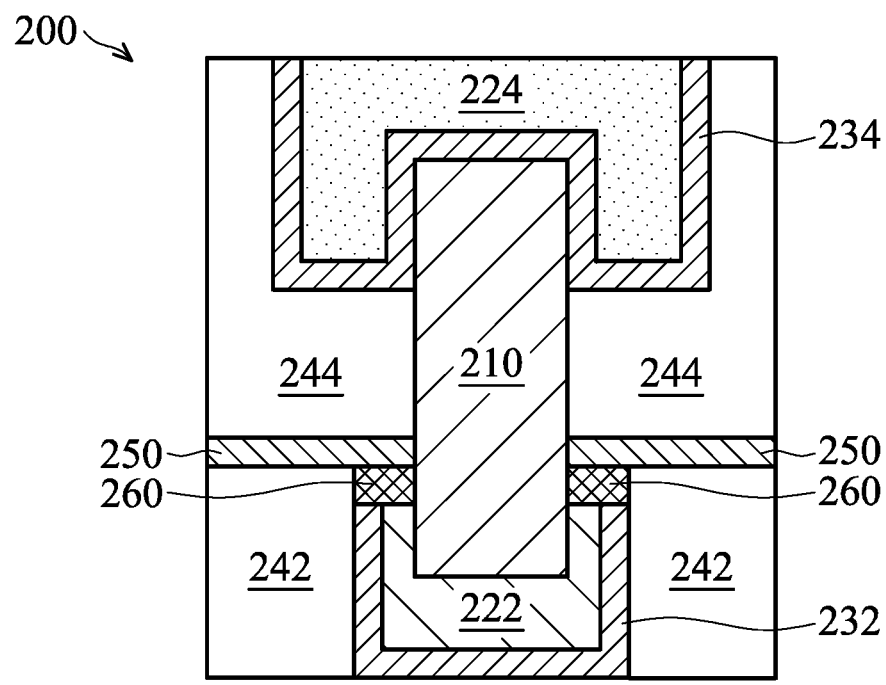

As shown in FIG. 28, another embodiment of hybrid via interconnect structure 200 includes a gap formed in capping layer 260, an extension of hybrid via 210 into metal filling 222, and an extension of hybrid via 210 into metal filling 224, wherein the portion of hybrid via 210 that extends into metal filling 224 is surrounded by barrier metal layer 234 such that hybrid via 210 is not in contact with metal filling 224. Process 20 can be adapted such that the formation of trench 272 performed in step 21 results in an extension of trench 272 into and through capping layer 260 and into metal filling 222 such that a recess is formed within metal filling 222. Further, process 20 can be adapted at step 22 such that hybrid via 210 not only fills trench 272, but it also extends into trench 274. Depending on the application, the embodiment of hybrid via interconnect structure 200 illustrated in FIG. 28 can provide improved ease of fabrication and reduced contact resistance.

Figure 29:
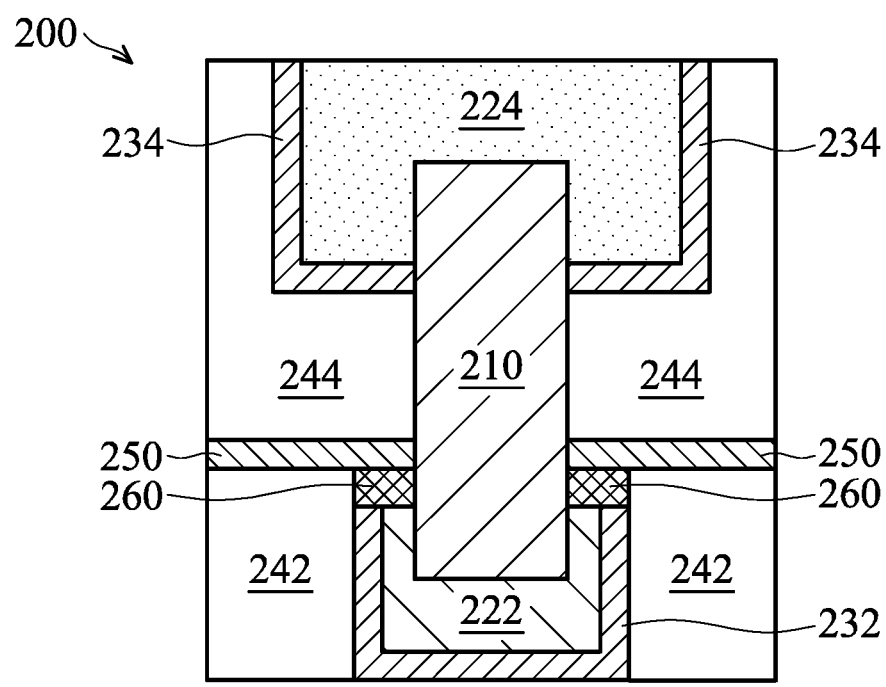

As shown in FIG. 29, another embodiment of hybrid via interconnect structure 200 includes a gap formed in capping layer 260, an extension of hybrid via 210 into metal filling 222, and an extension of hybrid via 210 into metal filling 224, wherein the portion of hybrid via 210 that extends into metal filling 224 is not surrounded by barrier metal layer 234 and is instead barrier-free in that metal filling 224 is in contact with and wrapped around a portion of hybrid via 210. Process 20 can be adapted such that the formation of trench 272 performed in step 21 results in an extension of trench 272 into and through capping layer 260 and into metal filling 222 such that a recess is formed within metal filling 222. Further, process 20 can be adapted at step 22 such that hybrid via 210 not only fills trench 272, but it also extends into trench 274, and a blocking layer can be selectively deposited over hybrid via 210 between steps 22 and 23 and removed after barrier metal layer 234 is formed in step 23. Depending on the application, the embodiment of hybrid via interconnect structure 200 illustrated in FIG. 29 can provide improved ease of fabrication and reduced contact resistance.

Figure 30:
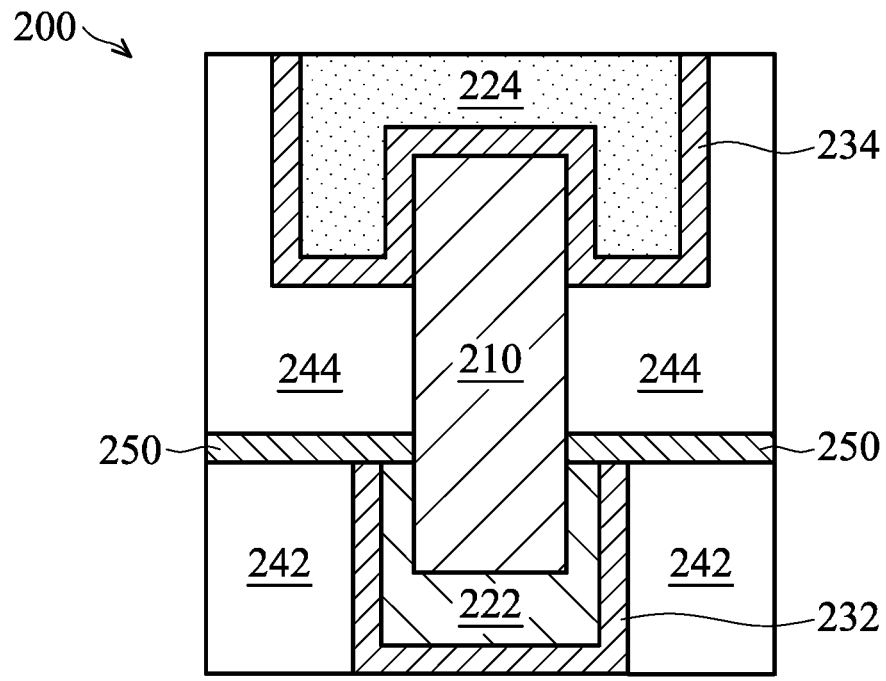

As shown in FIG. 30, another embodiment of hybrid via interconnect structure 200 does not include capping layer 260, but does include an extension of hybrid via 210 into metal filling 222 and an extension of hybrid via 210 into metal filling 224, wherein the portion of hybrid via 210 that extends into metal filling 224 is surrounded by barrier metal layer 234 such that hybrid via 210 is not in contact with metal filling 224. Process 20 can be adapted such that the formation trench 272 performed in step 21 results in an extension of trench 272 into metal filling 222 such that a recess is formed within metal filling 222. Further, process 20 can be adapted at step 22 such that hybrid via 210 not only fills trench 272, but it also extends into trench 274. Depending on the application, the embodiment of hybrid via interconnect structure 200 illustrated in FIG. 30 can provide improved ease of fabrication and reduced contact resistance.

Figure 31:
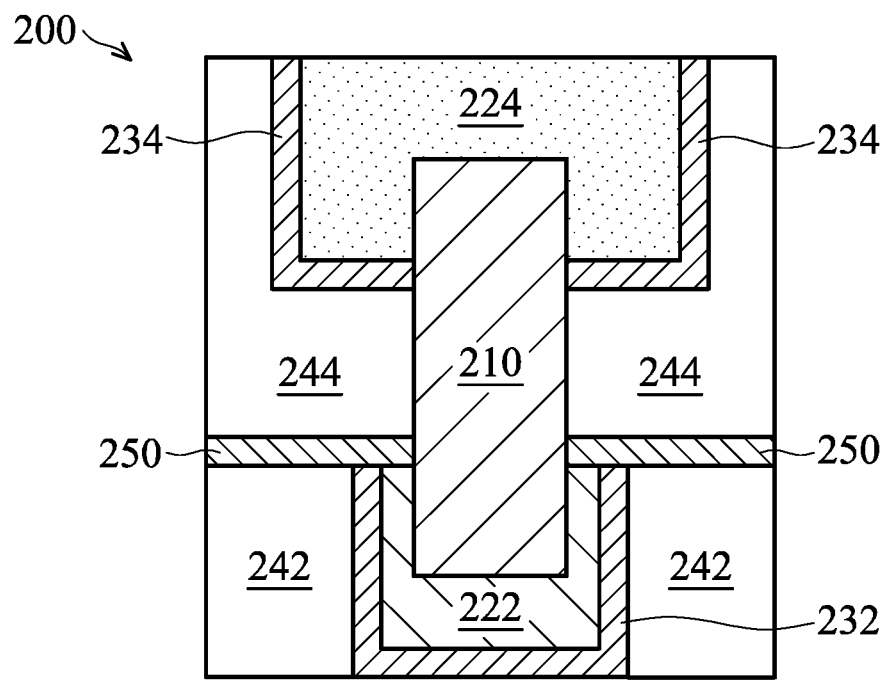

As shown in FIG. 31, another embodiment of hybrid via interconnect structure 200 does not include capping layer 260, but does include an extension of hybrid via 210 into metal filling 222 and an extension of hybrid via 210 into metal filling 224, wherein the portion of hybrid via 210 that extends into metal filling 224 is not surrounded by barrier metal layer 234 and is instead barrier-free in that metal filling 224 is in contact with and wrapped around a portion of hybrid via 210. Process 20 can be adapted such that the formation of trench 272 performed in step 21 results in an extension of trench 272 into metal filling 222 such that a recess is formed within metal filling 222. Further, process 20 can be adapted at step 22 such that hybrid via 210 not only fills trench 272, but it also extends into trench 274, and a blocking layer can be selectively deposited over hybrid via 210 between steps 22 and 23 and removed during step 23 after barrier metal layer 234 if formed. Depending on the application, the embodiment of hybrid via interconnect structure 200 illustrated in FIG. 31 can provide improved ease of fabrication and reduced contact resistance.

Figure 32:
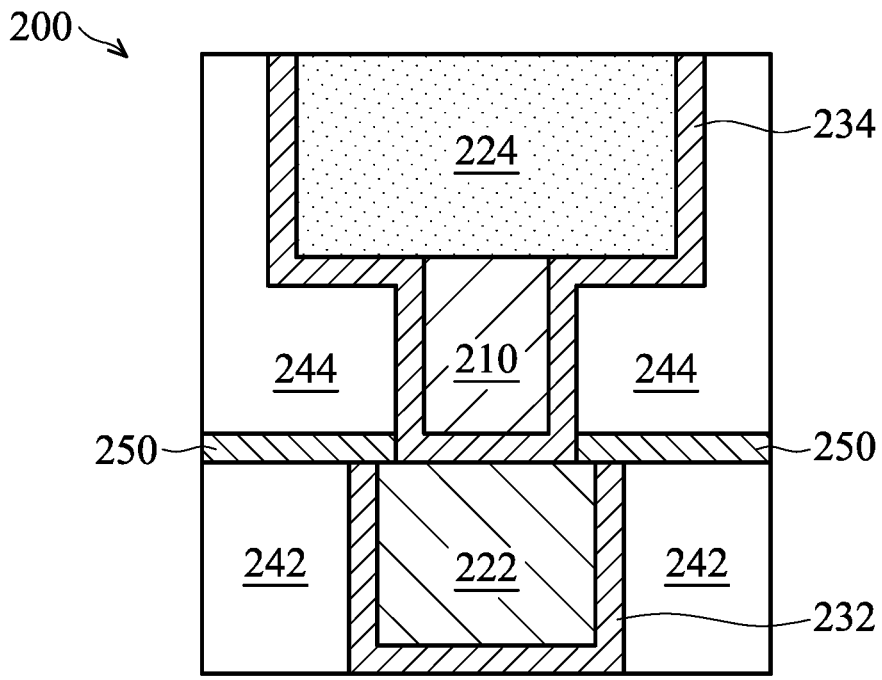

As shown in FIG. 32, another embodiment of hybrid via interconnect structure 200 does not include capping layer 260, but does include an extension of barrier metal layer 234 around hybrid via 210 such that hybrid via 210 is not in contact with metal filling 222, etch stop layer 250, or insulating layer 244 but is in contact with metal filling 224. To form this structure, process 20 can be adapted such that step 23 occurs before step 22. That is, barrier metal layer 234 can be formed within trench 272 and within trench 274 before hybrid via 210 is formed. Additionally, the seed layer of metal filling can be formed over the portions of hybrid via 210 and barrier metal layer 234 that remain exposed within trench 274 after the formation of hybrid via 210 and before the formation of the additional metal filling material in step 24. Depending on the application, the embodiment of hybrid via interconnect structure 200 illustrated in FIG. 32 can provide improved ease of fabrication and reduced contact resistance.

Figure 33:
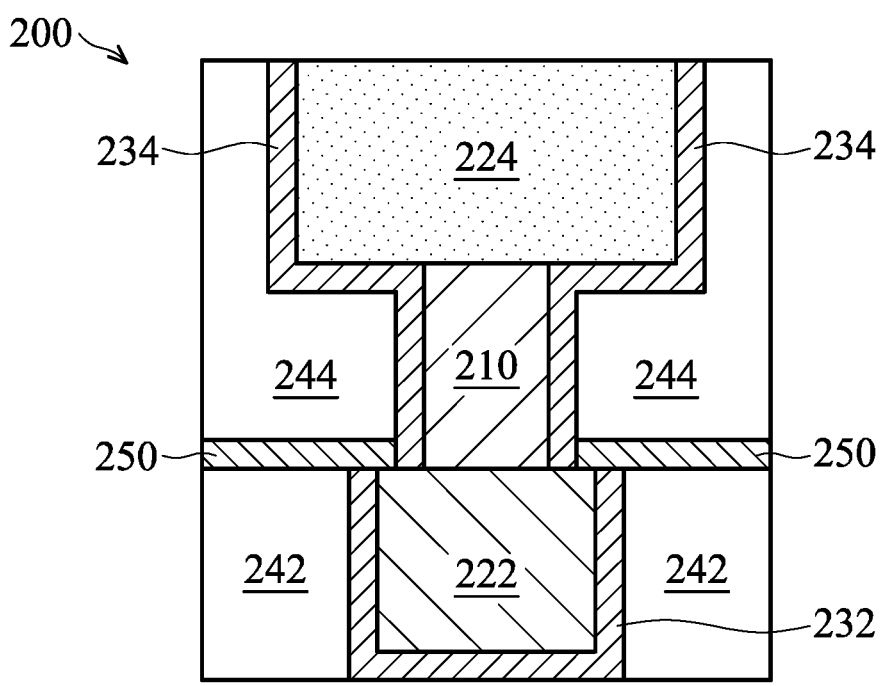

As shown in FIG. 33, another embodiment of hybrid via interconnect structure 200 does not include capping layer 260, but does include an extension of barrier metal layer 234 around hybrid via 210 such that hybrid via 210 is not in contact with insulating layer 244, but is in contact with both metal filling 222 and metal filling 224. To form this structure, process 20 can be adapted such that a blocking layer is selectively deposited within trench 272 and over metal filling 222 after step 21, and such that step 23 occurs before step 22. That is, barrier metal layer 234 can be formed within trench 272 and within trench 274 before hybrid via 210 is formed. Additionally, the seed layer of metal filling can be formed over the portions of hybrid via 210 and barrier metal layer 234 that remain exposed within trench 274 after the formation of hybrid via 210 and before the formation of the additional metal filling material in step 24. Depending on the application, the embodiment of hybrid via interconnect structure 200 illustrated in FIG. 33 can provide improved ease of fabrication and reduced contact resistance.

Figure 34:
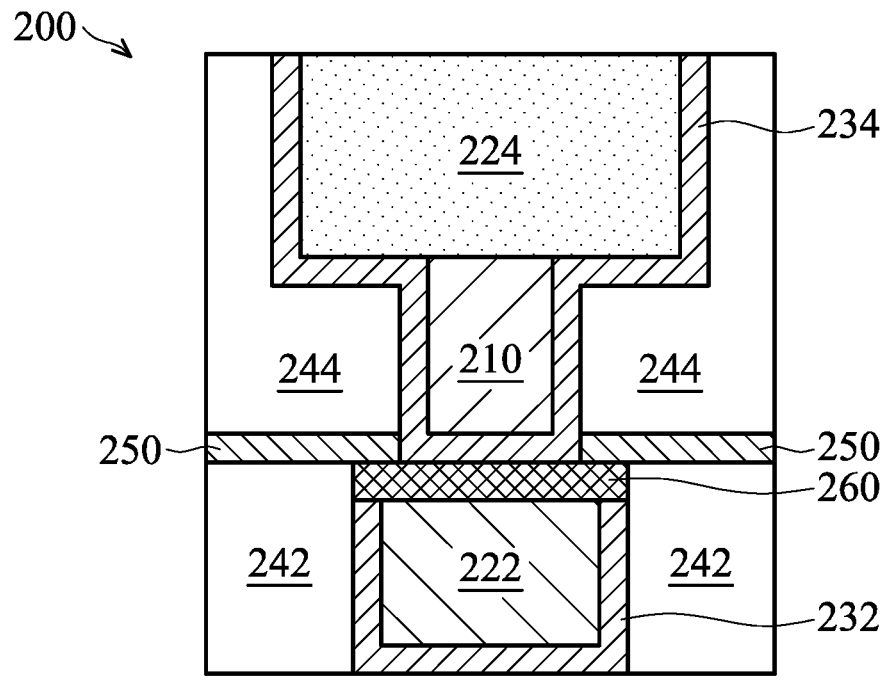

As shown in FIG. 34, another embodiment of hybrid via interconnect structure 200 includes capping layer 260 and includes an extension of barrier metal layer 234 around hybrid via 210 such that hybrid via 210 is not in contact with capping layer 260, etch stop layer 250, or insulating layer 244 but is in contact with metal filling 224. To form this structure, process 20 can be adapted such that step 23 occurs before step 22. That is, barrier metal layer 234 can be formed within trench 272 and within trench 274 before hybrid via 210 is formed. Additionally, the seed layer of metal filling can be formed over the portions of hybrid via 210 and barrier metal layer 234 that remain exposed within trench 274 after the formation of hybrid via 210 and before the formation of the additional metal filling material in step 24. Depending on the application, the embodiment of hybrid via interconnect structure 200 illustrated in FIG. 34 can provide improved ease of fabrication and reduced contact resistance.

Figure 35:
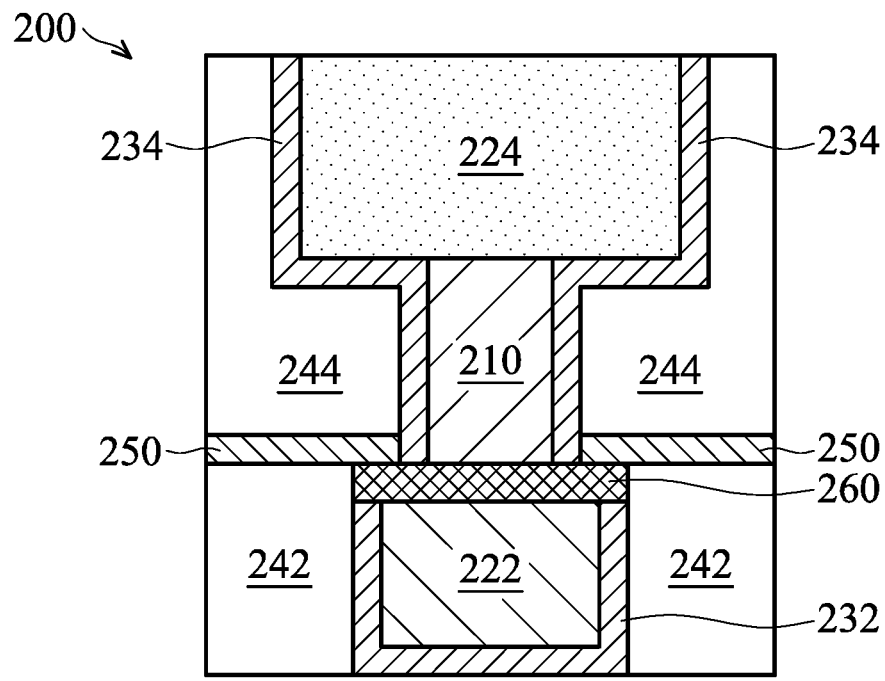

As shown in FIG. 35, another embodiment of hybrid via interconnect structure 200 includes capping layer 260 and includes an extension of barrier metal layer 234 around hybrid via 210 such that hybrid via 210 is not in contact with insulating layer 244 or etch stop layer 250, but is in contact with both metal filling 224 and capping layer 260. Process 20 can be adapted such that a blocking layer is selectively deposited within trench 272 and over capping layer 260 after step 21, and such that step 23 occurs before step 22. That is, barrier metal layer 234 can be formed within trench 272 and within trench 274 before hybrid via 210 is formed. Additionally, the seed layer of metal filling can be formed over the portions of hybrid via 210 and barrier metal layer 234 that remain exposed within trench 274 after the formation of hybrid via 210 and before the formation of the additional metal filling material in step 24. Depending on the application, the embodiment of hybrid via interconnect structure 200 illustrated in FIG. 35 can provide improved ease of fabrication and reduced contact resistance.

Figure 36:
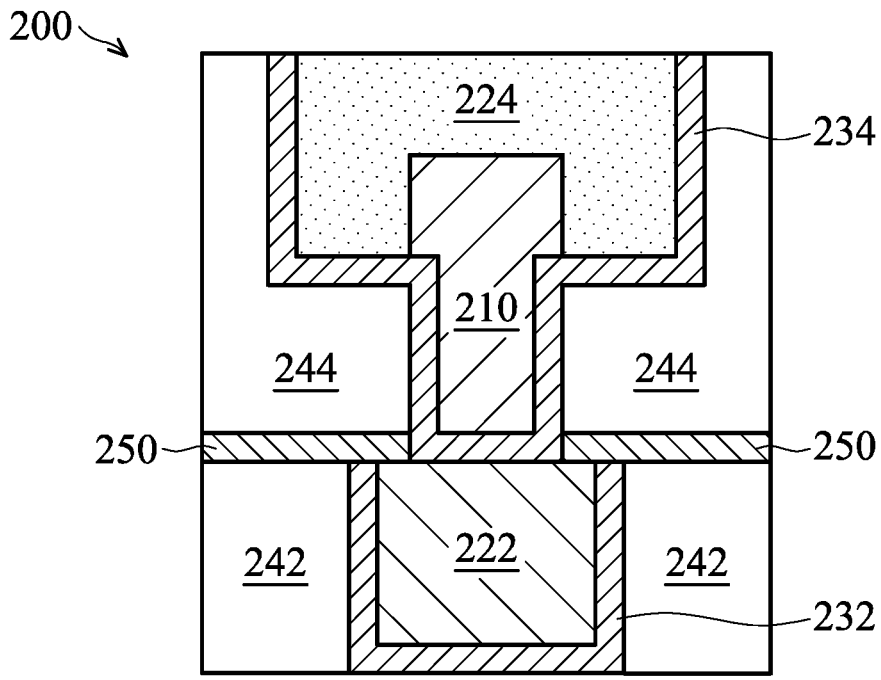

As shown in FIG. 36, another embodiment of hybrid via interconnect structure 200 does not include capping layer 260 but does include an extension of barrier metal layer 234 around hybrid via 210 such that hybrid via 210 is not in contact with metal filling 222, etch stop layer 250, or insulating layer 244 as well as an extension of hybrid via 210 into metal filling 224. Process 20 can be adapted such that step 23 occurs before step 22. That is, barrier metal layer 234 can be formed within trench 272 and within trench 274 before hybrid via 210 is formed. Additionally, hybrid via 210 can be formed such that it not only fills trench 272, but it also extends into trench 274, and the seed layer of metal filling can be formed over the portions of hybrid via 210 and barrier metal layer 234 that remain exposed within trench 274 after the formation of hybrid via 210 and before the formation of the additional metal filling material in step 24. Depending on the application, the embodiment of hybrid via interconnect structure 200 illustrated in FIG. 36 can provide improved ease of fabrication and reduced contact resistance.

Figure 37:
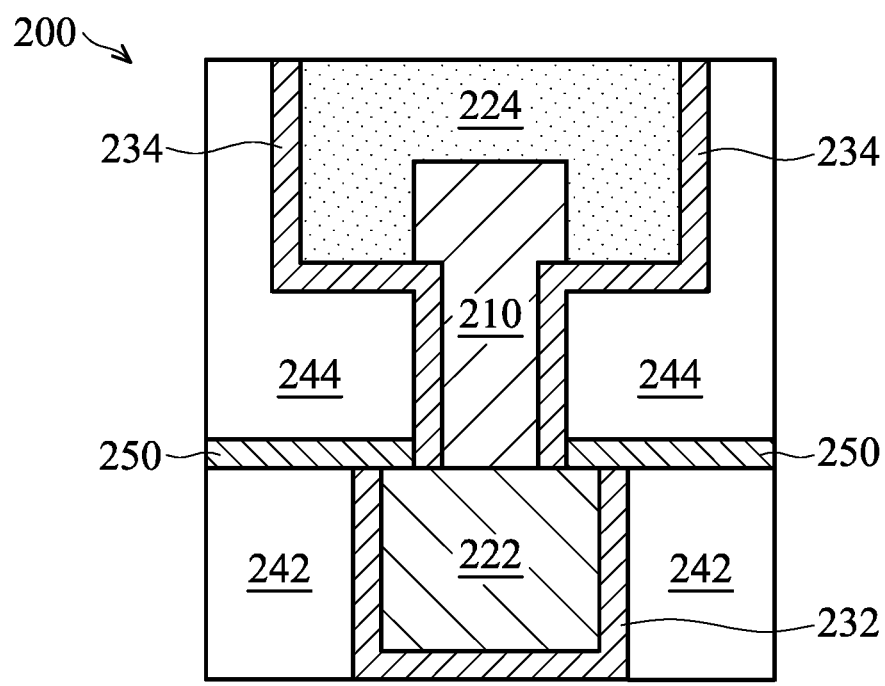

As shown in FIG. 37, another embodiment of hybrid via interconnect structure 200 does not include capping layer 260 but does include an extension of barrier metal layer 234 around hybrid via 210 such that hybrid via 210 is not in contact with insulating layer 244 or etch stop layer 250, as well as an extension of hybrid via 210 into metal filling 224. Process 20 can be adapted such that a blocking layer is selectively deposited within trench 272 and over metal filling 222 after step 21, and such that step 23 occurs before step 22. That is, barrier metal layer 234 can be formed within trench 272 and within trench 274 before hybrid via 210 is formed. Additionally, hybrid via 210 can be formed such that it not only fills trench 272, but it also extends into trench 274, and the seed layer of metal filling can be formed over the portions of hybrid via 210 and barrier metal layer 234 that remain exposed within trench 274 after the formation of hybrid via 210 and before the formation of the additional metal filling material in step 24. Depending on the application, the embodiment of hybrid via interconnect structure 200 illustrated in FIG. 37 can provide improved ease of fabrication and reduced contact resistance.

Figure 38:
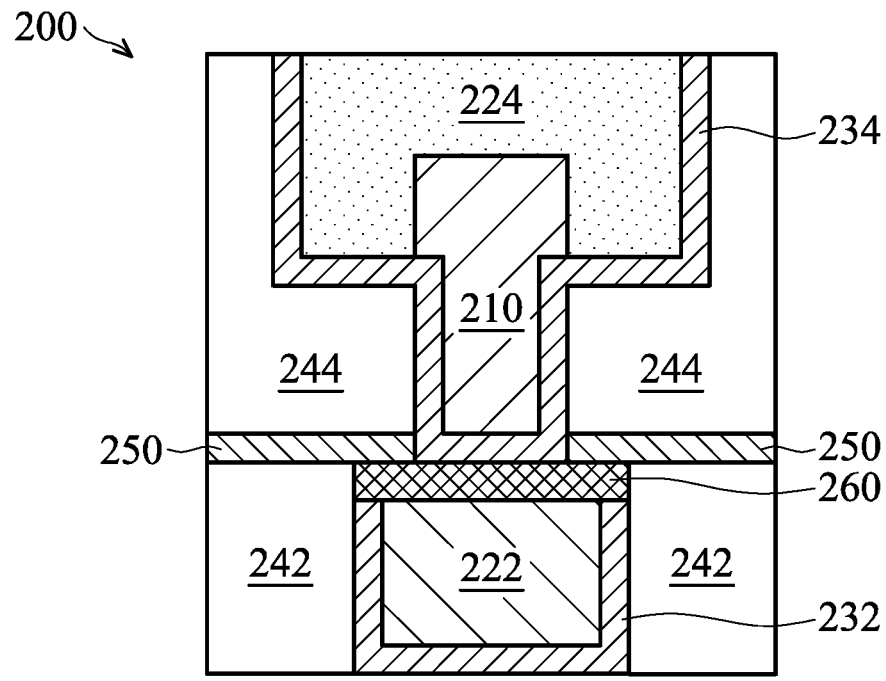

As shown in FIG. 38, another embodiment of hybrid via interconnect structure 200 includes capping layer 260, an extension of barrier metal layer 234 around hybrid via 210 such that hybrid via 210 is not in contact with capping layer 260, etch stop layer 250, or insulating layer 244, and an extension of hybrid via 210 into metal filling 224. Process 20 can be adapted such that step 23 occurs before step 22. That is, barrier metal layer 234 can be formed within trench 272 and within trench 274 before hybrid via 210 is formed. Additionally, hybrid via 210 can be formed such that it not only fills trench 272, but it also extends into trench 274, and the seed layer of metal filling can be formed over the portions of hybrid via 210 and barrier metal layer 234 that remain exposed within trench 274 after the formation of hybrid via 210 and before the formation of the additional metal filling material in step 24. Depending on the application, the embodiment of hybrid via interconnect structure 200 illustrated in FIG. 38 can provide improved ease of fabrication and reduced contact resistance.

Figure 39:
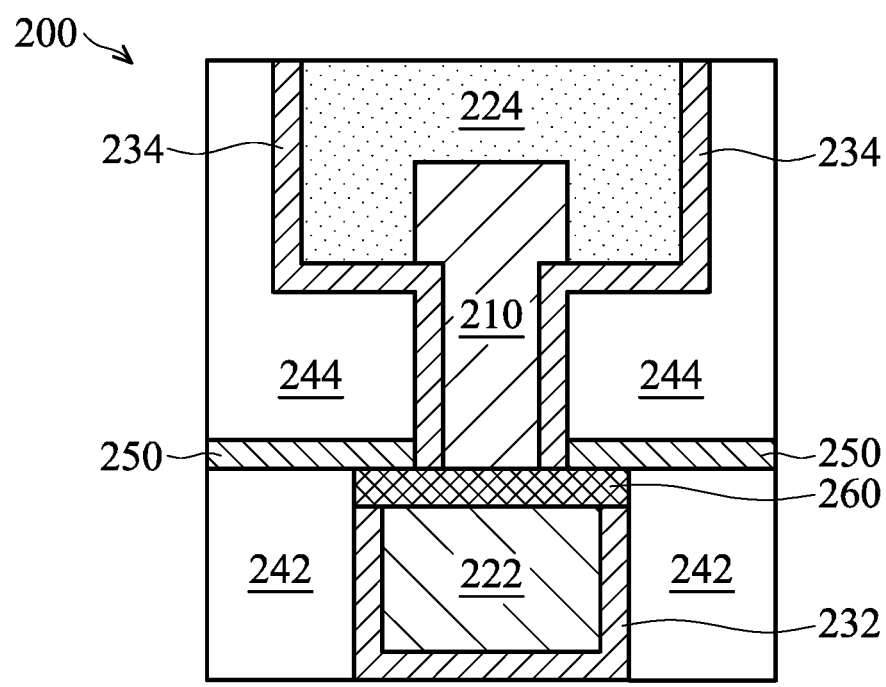

As shown in FIG. 39, another embodiment of hybrid via interconnect structure 200 includes capping layer 260, an extension of barrier metal layer 234 around hybrid via 210 such that hybrid via 210 is not in contact with insulating layer 244 or etch stop layer 250, and an extension of hybrid via 210 into metal filling 224. Process 20 can be adapted such that a blocking layer is selectively deposited within trench 272 and over capping layer 260 after step 21, and such that step 23 occurs before step 22. That is, barrier metal layer 234 can be formed within trench 272 and within trench 274 before hybrid via 210 is formed. Additionally, hybrid via 210 can be formed such that it not only fills trench 272, but it also extends into trench 274, and the seed layer of metal filling can be formed over the portions of hybrid via 210 and barrier metal layer 234 that remain exposed within trench 274 after the formation of hybrid via 210 and before the formation of the additional metal filling material in step 24. Depending on the application, the embodiment of hybrid via interconnect structure 200 illustrated in FIG. 39 can provide improved ease of fabrication and reduced contact resistance.

Figure 40:
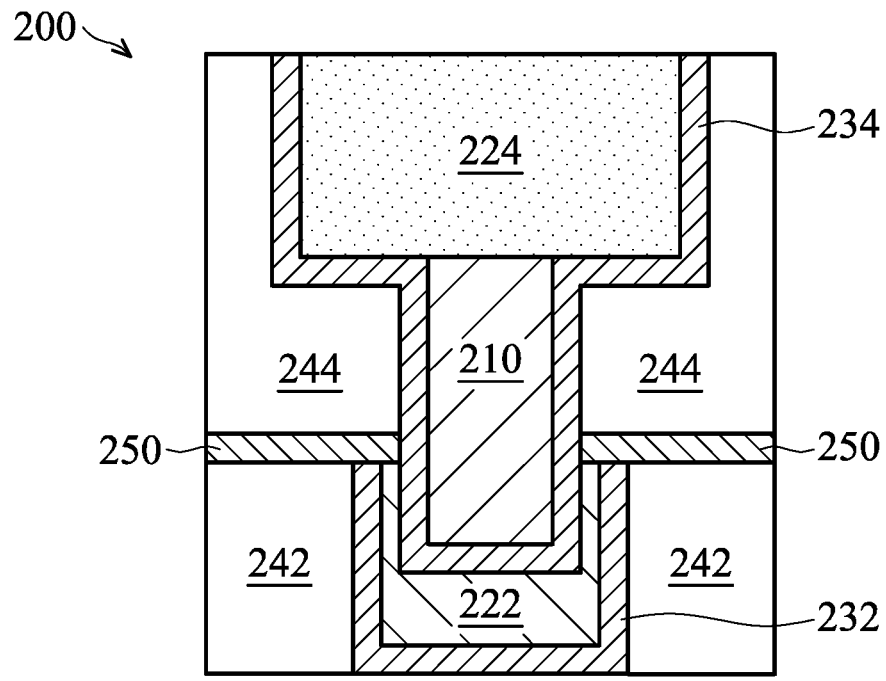

As shown in FIG. 40, another embodiment of hybrid via interconnect structure 200 does not include capping layer 260, but does include an extension of hybrid via 210 into metal filling 222 and an extension of barrier metal layer 234 around hybrid via 210 such that hybrid via 210 is not in contact with insulating layer 244, etch stop layer 250, or metal filling 222. To form this structure, process 20 can be adapted such that the formation of trench 272 performed in step 21 results in an extension of trench 272 into metal filling 222, and such that step 23 occurs before step 22. That is, barrier metal layer 234 can be formed within trench 272 and within trench 274 before hybrid via 210 is formed. Additionally, the seed layer of metal filling can be formed over the portions of hybrid via 210 and barrier metal layer 234 that remain exposed within trench 274 after the formation of hybrid via 210 and before the formation of the additional metal filling material in step 24. Depending on the application, the embodiment of hybrid via interconnect structure 200 illustrated in FIG. 40 can provide improved ease of fabrication and reduced contact resistance.

Figure 41:
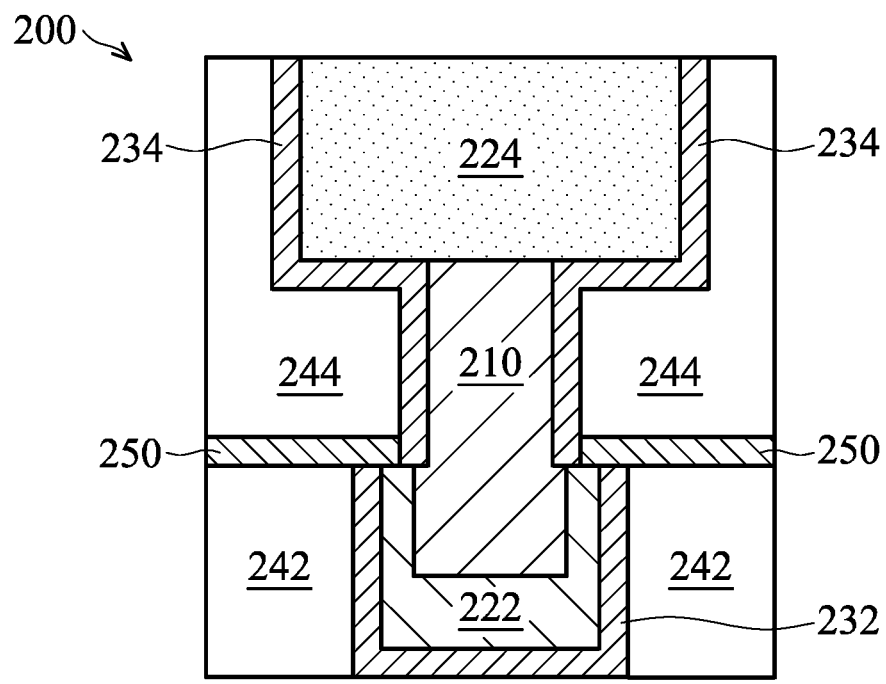

As shown in FIG. 41, another embodiment of hybrid via interconnect structure 200 does not include capping layer 260, but does include an extension of hybrid via 210 into metal filling 222 and an extension of barrier metal layer 234 around hybrid via 210 such that hybrid via 210 is not in contact with insulating layer 244 or etch stop layer 250. Process 20 can be adapted such that the formation of trench 272 performed in step 21 results in an extension of trench 272 into metal filling 222 such that a recess is formed within metal filling 222, a blocking layer is selectively deposited within the recess formed within metal filling 222 after step 21, and step 23 occurs before step 22. That is, barrier metal layer 234 can be formed within trench 272 and within trench 274 before hybrid via 210 is formed. Additionally, the seed layer of metal filling can be formed over the portions of hybrid via 210 and barrier metal layer 234 that remain exposed within trench 274 after the formation of hybrid via 210 and before the formation of the additional metal filling material in step 24. Depending on the application, the embodiment of hybrid via interconnect structure 200 illustrated in FIG. 41 can provide improved ease of fabrication and reduced contact resistance.

Figure 42:
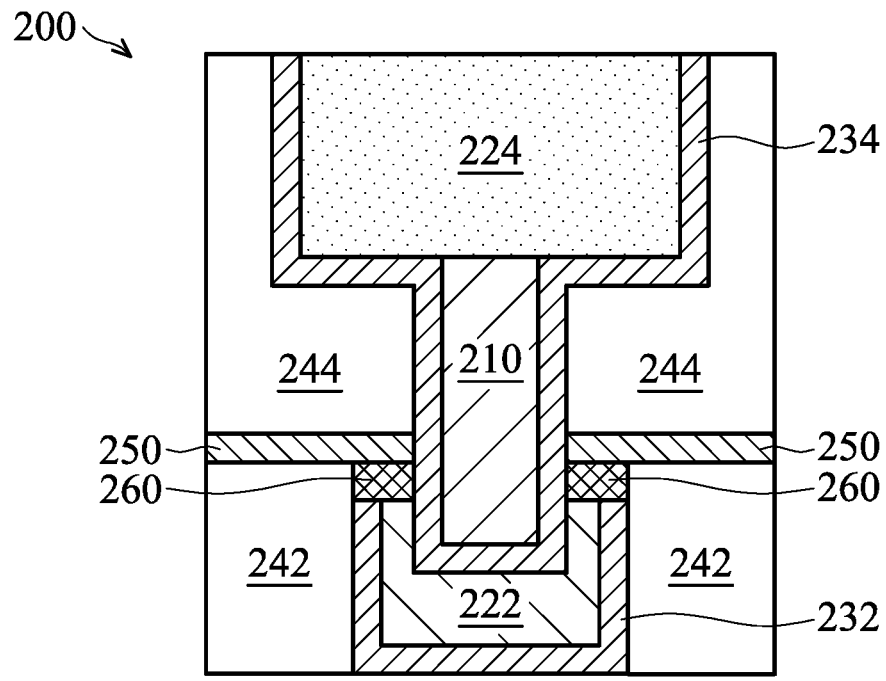

As shown in FIG. 42, another embodiment of hybrid via interconnect structure 200 includes capping layer 260, an extension of hybrid via 210 into metal filling 222, and an extension of barrier metal layer 234 around hybrid via 210 such that hybrid via 210 is not in contact with insulating layer 244, capping layer 260, etch stop layer 250, or metal filling 222. To form this structure, process 20 can be adapted such that the formation of trench 272 performed in step 21 results in an extension of trench 272 into and through capping layer 260 and into metal filling 222 such that a recess is formed within metal filling 222, and such that step 23 occurs before step 22. That is, barrier metal layer 234 can be formed within trench 272 and within trench 274 before hybrid via 210 is formed. Additionally, the seed layer of metal filling can be formed over the portions of hybrid via 210 and barrier metal layer 234 that remain exposed within trench 274 after the formation of hybrid via 210 and before the formation of the additional metal filling material in step 24. Depending on the application, the embodiment of hybrid via interconnect structure 200 illustrated in FIG. 42 can provide improved ease of fabrication and reduced contact resistance.

Figure 43:
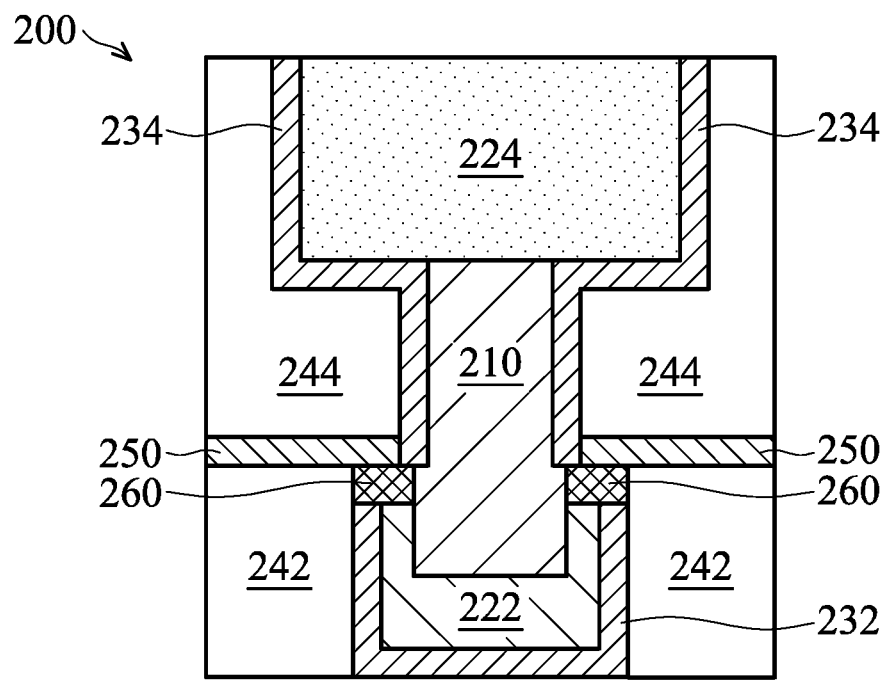

As shown in FIG. 43, another embodiment of hybrid via interconnect structure 200 includes capping layer 260, an extension of hybrid via 210 into metal filling 222, and an extension of barrier metal layer 234 around hybrid via 210 such that hybrid via 210 is not in contact with insulating layer 244 or etch stop layer 250. To form this structure, process 20 can be adapted such that the formation of trench 272 performed in step 21 results in an extension of trench 272 into and through capping layer 260 and into metal filling 222 such that a recess is formed within metal filling 222, a blocking layer is selectively deposited within the recess formed within metal filling 222 after step 21, and such that step 23 occurs before step 22. That is, barrier metal layer 234 can be formed within trench 272 and within trench 274 before hybrid via 210 is formed. Additionally, the seed layer of metal filling can be formed over the portions of hybrid via 210 and barrier metal layer 234 that remain exposed within trench 274 after the formation of hybrid via 210 and before the formation of the additional metal filling material in step 24. Depending on the application, the embodiment of hybrid via interconnect structure 200 illustrated in FIG. 43 can provide improved ease of fabrication and reduced contact resistance.

Figure 44:
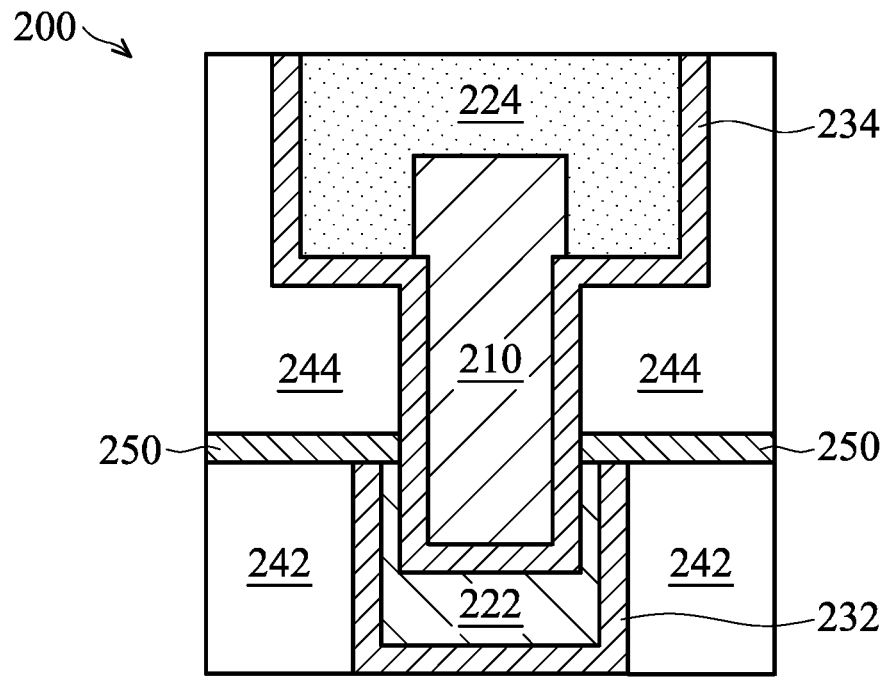

As shown in FIG. 44, another embodiment of hybrid via interconnect structure 200 does not include capping layer 260, but does include an extension of hybrid via 210 into metal filling 222, an extension of hybrid via 210 into metal filling 224, and an extension of barrier metal layer 234 around hybrid via 210 such that hybrid via 210 is not in contact with metal filling 222, insulating layer 244, or etch stop layer 250. Process 20 can be adapted such that the formation of trench 272 performed in step 21 results in an extension of trench 272 into metal filling 222 such that a recess is formed within metal filling 222, and such that step 23 occurs before step 22. That is, barrier metal layer 234 can be formed within trench 272 and within trench 274 before hybrid via 210 is formed. Additionally, hybrid via 210 can be formed such that it not only fills trench 272, but it also extends into trench 274, and the seed layer of metal filling can be formed over the portions of hybrid via 210 and barrier metal layer 234 that remain exposed within trench 274 after the formation of hybrid via 210 and before the formation of the additional metal filling material in step 24. Depending on the application, the embodiment of hybrid via interconnect structure 200 illustrated in FIG. 44 can provide improved ease of fabrication and reduced contact resistance.

Figure 45:
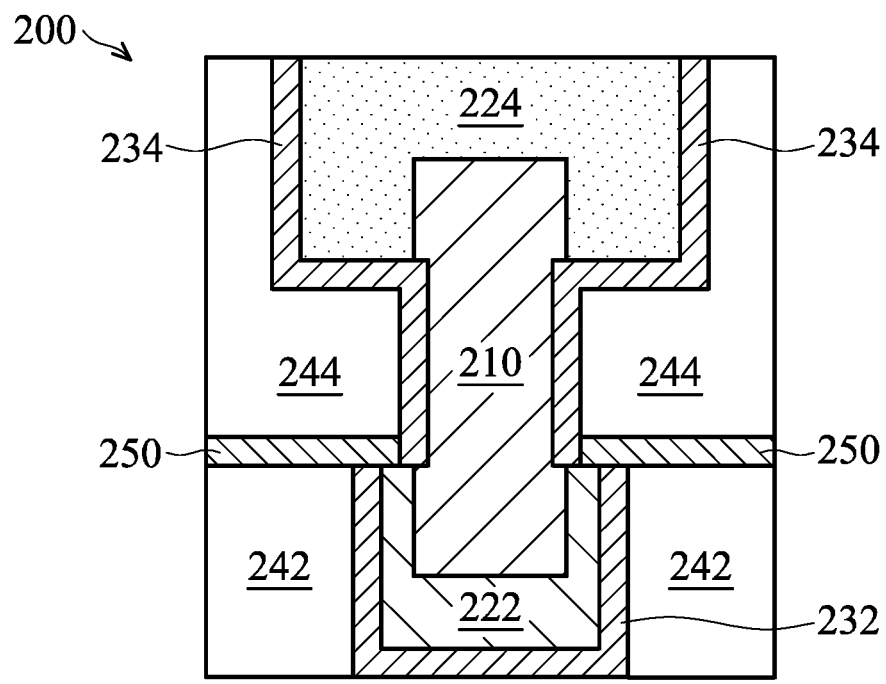

As shown in FIG. 45, another embodiment of hybrid via interconnect structure 200 does not include capping layer 260, but does include an extension of hybrid via 210 into metal filling 222, an extension of hybrid via 210 into metal filling 224, and an extension of barrier metal layer 234 around hybrid via 210 such that hybrid via 210 is not in contact with insulating layer 244 or etch stop layer 250. Process 20 can be adapted such that the formation of trench 272 performed in step 21 results in an extension of trench 272 into metal filling 222 such that a recess is formed within metal filling 222, a blocking layer is selectively deposited within the recess formed within metal filling 222 after step 21, and step 23 occurs before step 22. That is, barrier metal layer 234 can be formed within trench 272 and within trench 274 before hybrid via 210 is formed. Additionally, hybrid via 210 can be formed such that it not only fills trench 272, but it also extends into trench 274, and the seed layer of metal filling can be formed over the portions of hybrid via 210 and barrier metal layer 234 that remain exposed within trench 274 after the formation of hybrid via 210 and before the formation of the additional metal filling material in step 24. Depending on the application, the embodiment of hybrid via interconnect structure 200 illustrated in FIG. 45 can provide improved ease of fabrication and reduced contact resistance.

Figure 46:
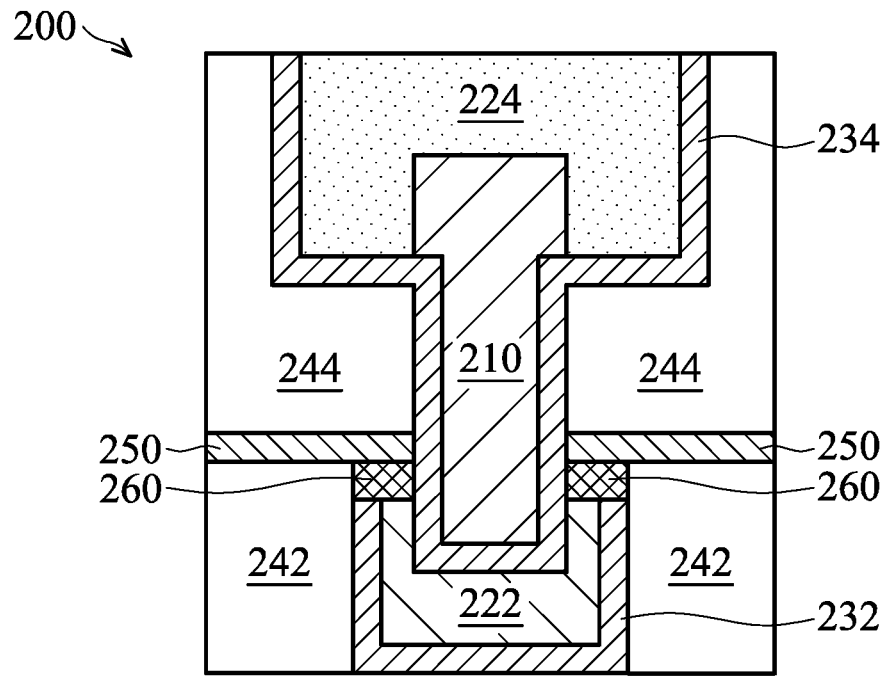

As shown in FIG. 46, another embodiment of hybrid via interconnect structure 200 includes capping layer 260, an extension of hybrid via 210 into metal filling 222, an extension of hybrid via 210 into metal filling 224, and an extension of barrier metal layer 234 around hybrid via 210 such that hybrid via 210 is not in contact with metal filling 222, insulating layer 244, etch stop layer 250, or capping layer 260. Process 20 can be adapted such that the formation of trench 272 performed in step 21 results in an extension of trench 272 into and through capping layer 260 and into metal filling 222 such that a recess is formed within metal filling 222, and such that step 23 occurs before step 22. That is, barrier metal layer 234 can be formed within trench 272 and within trench 274 before hybrid via 210 is formed. Additionally, hybrid via 210 can be formed such that it not only fills trench 272, but it also extends into trench 274, and the seed layer of metal filling can be formed over the portions of hybrid via 210 and barrier metal layer 234 that remain exposed within trench 274 after the formation of hybrid via 210 and before the formation of the additional metal filling material in step 24. Depending on the application, the embodiment of hybrid via interconnect structure 200 illustrated in FIG. 46 can provide improved ease of fabrication and reduced contact resistance.

As shown in FIG. 47, another embodiment of hybrid via interconnect structure 200 includes capping layer 260, an extension of hybrid via 210 into metal filling 222, an extension of hybrid via 210 into metal filling 224, and an extension of barrier metal layer 234 around hybrid via 210 such that hybrid via 210 is not in contact with insulating layer 244 or etch stop layer 250. Process 20 can be adapted such that the formation of trench 272 performed in step 21 results in an extension of trench 272 into and through capping layer 260 and into metal filling 222 such that a recess is formed within metal filling 222, a blocking layer is selectively deposited within the recess formed within metal filling 222 after step 21, and step 23 occurs before step 22. That is, barrier metal layer 234 can be formed within trench 272 and within trench 274 before hybrid via 210 is formed. Additionally, hybrid via 210 can be formed such that it not only fills trench 272, but it also extends into trench 274, and the seed layer of metal filling can be formed over the portions of hybrid via 210 and barrier metal layer 234 that remain exposed within trench 274 after the formation of hybrid via 210 and before the formation of the additional metal filling material in step 24. Depending on the application, the embodiment of hybrid via interconnect structure 200 illustrated in FIG. 47 can provide improved ease of fabrication and reduced contact resistance. Structures similar to hybrid via interconnect structure 100 and hybrid via interconnect structure 200 can also be formed using a reactive ion etching process as discussed in more detail below with respect to FIGS. 12-48F.

Figure 49:
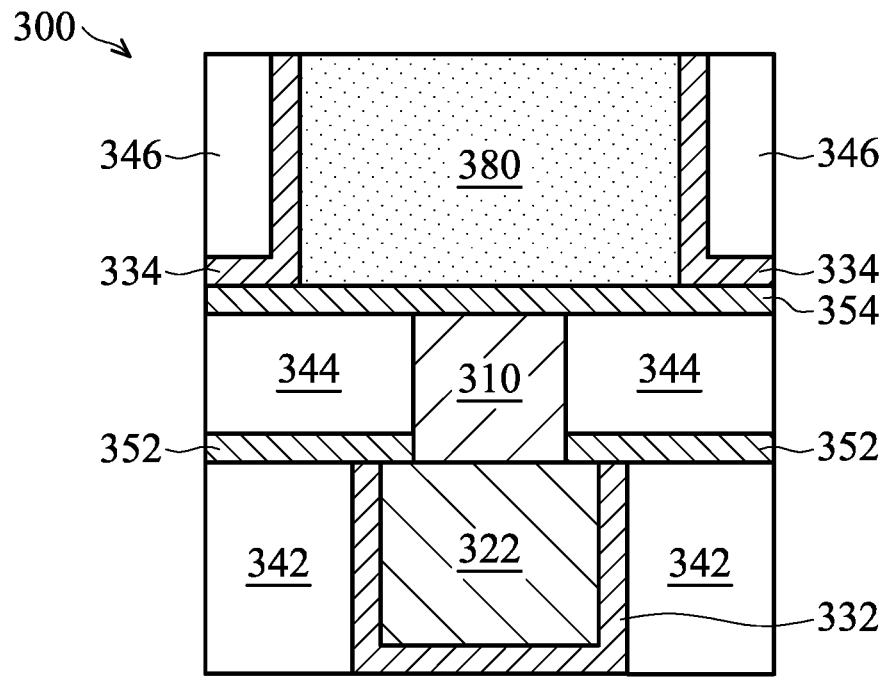
FIGS. 49-64 illustrate cross sections of various embodiments of a hybrid via interconnect structure that is formed using a reactive ion etching process.

FIGS. 49-64 illustrate cross sections of various embodiments of a hybrid via interconnect structure 300 that is formed using a reactive ion etching process. Hybrid via interconnect structure 300 can generally be formed during the BEOL portion of an IC fabrication process. As shown in FIG. 49, hybrid via interconnect structure 300 includes a metal filling 322 and a metal layer 380 electrically connected by a hybrid via 310. Metal filling 322 is surrounded by a barrier metal layer 332. Metal layer 380 is surrounded by a barrier metal layer 334. Metal filling 322 can be completely surrounded by the combination of barrier metal layer 332, an etch stop layer 352, and hybrid via 310. Metal layer 380 can be partially surrounded by barrier metal layer 234 or completely surrounded by barrier metal layer 234 (although this is not explicitly shown in FIG. 49). These layers are adjacent to an insulating layer 342, an insulating layer 344, and an insulating layer 346 separated by an etch stop layer 352 and an etch stop layer 354.

In some embodiments, metal filling 322 is a copper interconnect. However, metal filling 322 can be formed of other suitable materials (e.g. aluminum, etc.). Metal layer 380 is generally formed of a metal material suitable for use in a reactive ion etching (ME) process. That is, metal layer 380 can generally be formed of an RIE metal such as aluminum, chromium, titanium, and other suitable metals and combinations thereof. In order to pattern metal layer 380, a layer of photoresist can be applied over a portion of metal layer 380, and the remaining exposed portions of metal layer 380 can be patterned using chemically reactive ions such as chlorine-based ions and other types of ions that are accelerated towards metal layer 380. As an end result, the exposed portion of metal layer 380 that does not lie underneath the photoresist can be removed down to etch stop layer 354. Barrier metal layer 332 and barrier metal layer 334 chemically isolate metal filling 322 and metal layer 380, respectively, from surrounding materials such as silicon and other materials. For example, barrier metal layer 332 can prevent diffusion of metal filling 322 into insulating layer 342. Barrier metal layer 332 and barrier metal layer 334 can be formed using materials such as tantalum, cobalt, ruthenium, and other suitable materials. Barrier metal layer 332 and barrier metal layer 334 are generally formed of a material that is effective in chemically isolating metal filling 322 and metal layer 380 while also being effective electrical conductors.

Insulating layer 342, insulating layer 344, and insulating layer 346 are generally dielectric materials with low electrical conductivity. For example, insulating layer 342, insulating layer 344, and insulating layer 346 can be formed of materials including silicon nitride, silicon oxide, and other materials with a relatively high dielectric constants (high-k materials). Etch stop layer 352 and etch stop layer 354 can generally prevent over-etching such that structures below etch stop layer 352 and etch stop layer 354 are not damaged. For example, a first etching process can be used until etch stop layer 352 is reached, and then a second etching process can be used to remove a portion of etch stop layer 352 that is exposed as a result of the first etching process. Etch stop layer 352 and etch stop layer 354 can be formed of materials such as silicon nitride, silicon carbide, silicon carbonitride, and other similar materials.

Hybrid via 310 itself can be formed of various materials including metals (e.g. aluminum, copper, cobalt, nickel, tungsten, ruthenium, molybdenum, platinum, palladium, etc.), alloys (copper/zinc alloys, iron/cobalt alloys, molybdenum/tantalum alloys, etc.), other conductive materials (e.g. fullerenes, carbon nanotubes, molybdenum disulfide, etc.), and various other suitable materials and combinations thereof. Hybrid via 310 is generally formed of different material(s) than metal filling 322, metal layer 380, barrier metal layer 332, and barrier metal layer 334 are formed of. The use of different material(s) for hybrid via 310 can enable metallization for advanced nodes and can reduce contact resistance associated with hybrid via interconnect structure 300 overall.

Hybrid via interconnect structure 300 can generally provide reduced contact resistance and reduced interconnect resistance due to a variety of factors. For example, especially in wrapped via structures such as shown in FIGS. 54 and 56-64 (where metal filling 322 and/or metal layer 380 is in contact with and wrapped around part of hybrid via 310), contact resistance can be reduced due to a larger contact area between hybrid via 310 and metal filling 322 and/or metal layer 380. Further, with the development of more advanced semiconductor nodes, various embodiments of hybrid via interconnect structure 300 can be easier and/or more efficient to produce.

Figure 64:
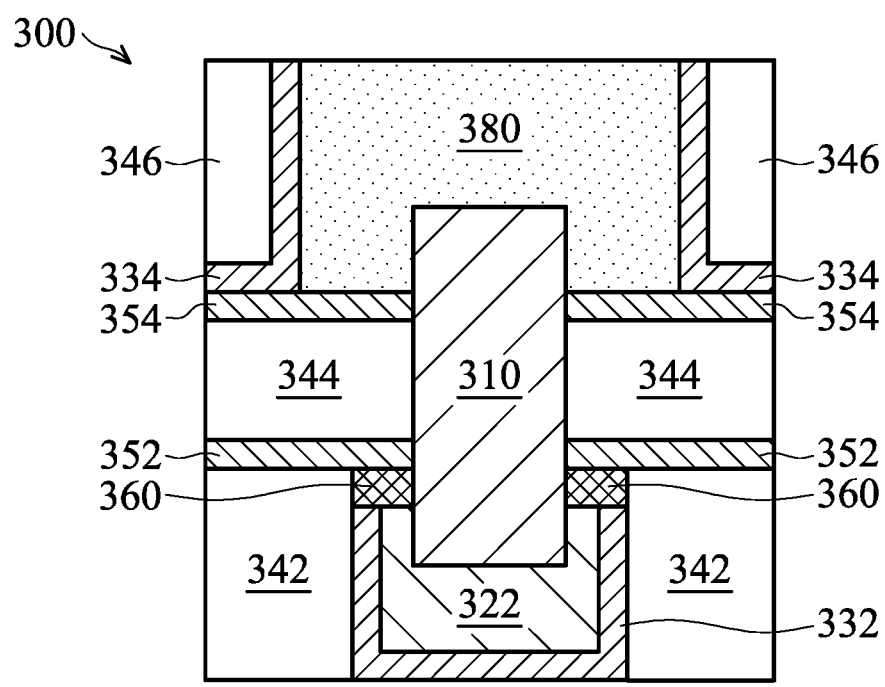
Figure 65A:
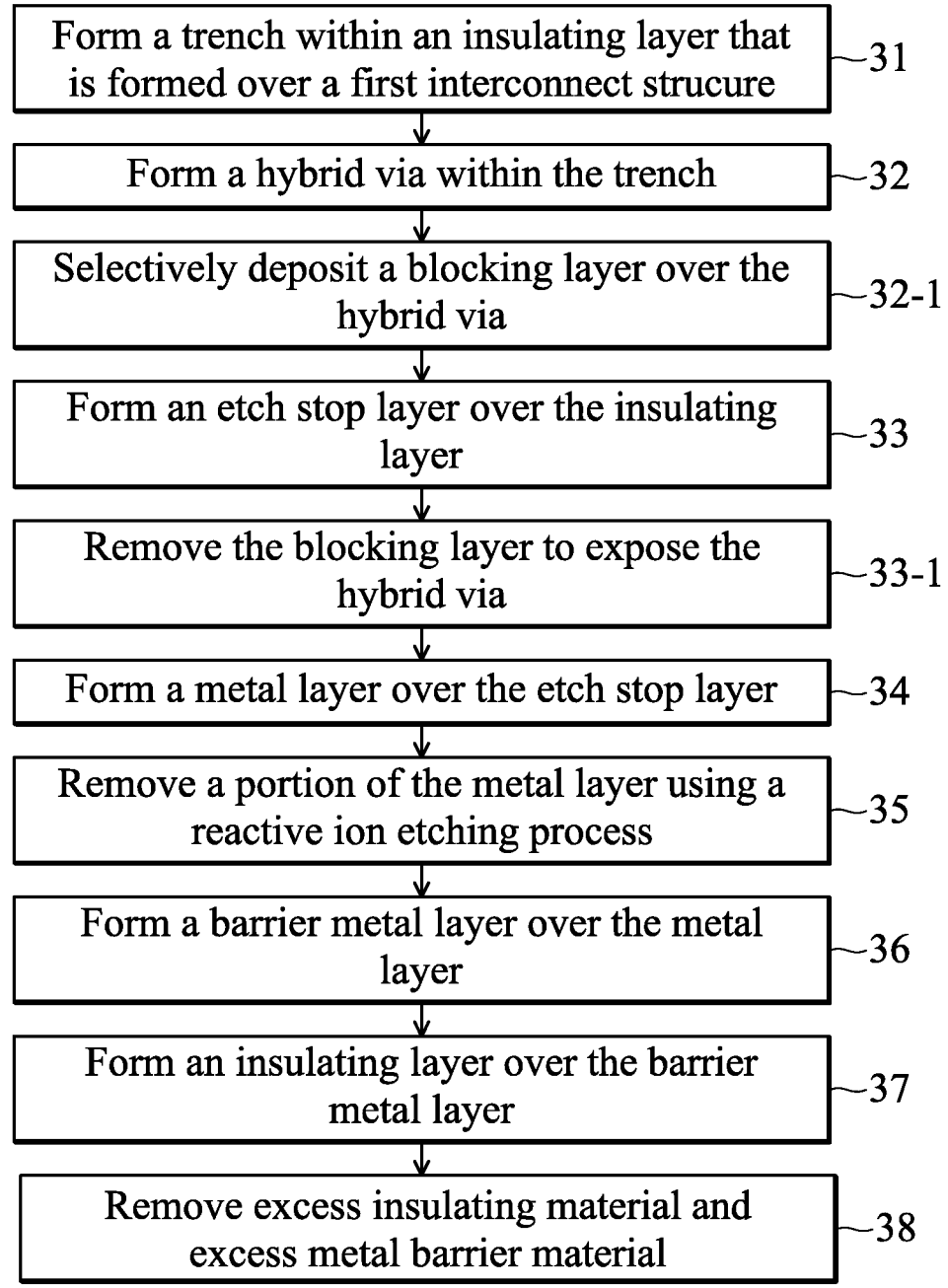
FIG. 65A is a flow diagram illustrating a process for forming the hybrid via interconnect structure of FIGS. 49-64, in accordance with some embodiments.

FIG. 65A is a flow diagram illustrating a process 30 for forming hybrid via interconnect structure 300. FIGS. 65B-65I illustrate various steps of process 30. Process 30 can generally be used to form hybrid via interconnect structure 300 which can have lower contact resistance and thereby improved performance when compared to some previous approaches. Further, process 30 can provide advantages in terms of ease of fabrication in different applications when compared to some previous approaches. Process 30 is generally a reactive ion etching process that involves formation of hybrid via 310 that electrically connects metal filling 322 and metal layer 380. Hybrid via 310 is generally formed of a different material than metal filling 322, metal layer 380, and barrier metal layers 332 and 334. Various adaptions of process 30 are contemplated such as described with respect to FIGS. 50-64.

Figure 65B:
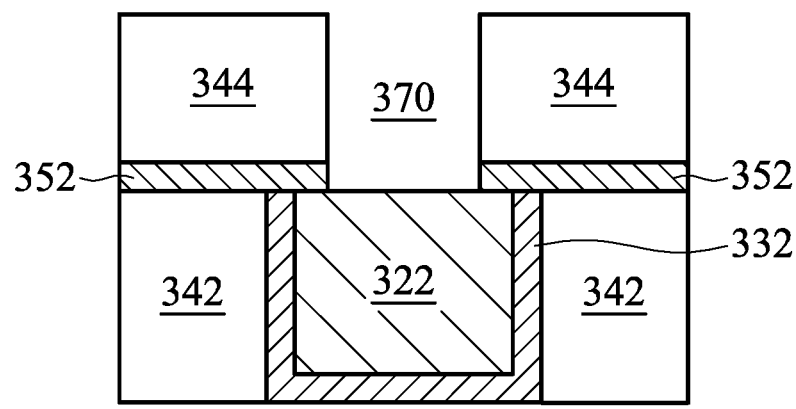
FIGS. 65B-65I illustrate various steps of the process of FIG. 65A, in accordance with some embodiments.

At a step 31, a trench is formed within an insulating layer that is formed over a first interconnect structure (FIG. 65B). As illustrated in FIG. 65B, a trench 370 is formed within insulating layer 344. The first interconnect structure includes metal filling 322, barrier metal layer 332, insulating layer 342, and etch stop layer 352. The first interconnect structure can be formed on top of a contact, such as a contact formed during the MEOL portion of an integrated circuit fabrication process. For example, the first interconnect structure can be formed over a gate contact. The first interconnect structure can be formed by depositing insulating layer 342 on a contact surface, using lithography and etching techniques to form a trench within insulating layer 342, depositing barrier metal layer 332 within the trench, forming a seed layer of metal filling material over barrier metal layer 332, depositing additional metal filling material over the seed layer to form metal filling 322, using chemical-mechanical planarization to remove excess material from metal filling 322 and barrier metal layer 332, and depositing etch stop layer 352 over insulating layer 342, barrier metal layer 332, and metal filling 322. Then, insulating layer 344 is formed over etch stop layer 352, and trench 370 is formed within insulating layer 344 using lithography and etching techniques.

Figure 65C:
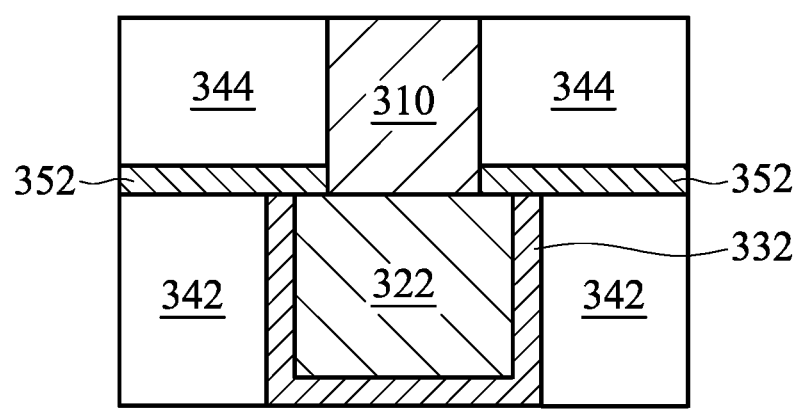

At a step 32, a hybrid via is formed within the trench (FIG. 65C). As illustrated in FIG. 65C, hybrid via 310 is formed within trench 370 by filling materials such as metals, alloys, and/or other conductive materials within trench 370. As illustrated in FIG. 65C, hybrid via 310 is formed such that a top surface of hybrid via 310 is flush or approximately flush with a top surface of insulating layer 344. However, as discussed below with respect to FIGS. 50-64, hybrid via 310 can also be formed such that it extends above the top surface of insulating layer 344. Hybrid via 310 can be formed using processes such as physical vapor deposition, chemical vapor deposition, atomic layer deposition, electrochemical deposition, and other suitable processes. In some embodiments, the process temperature for the formation of hybrid via 310 ranges from about 20 degrees Celsius to 1000 degrees Celsius, however process temperatures outside of this range are also contemplated. Further, in some embodiments, hybrid via 310 ranges in height from about 5 angstroms to 100 microns, however heights outside of this range are also contemplated.

Figure 65D:
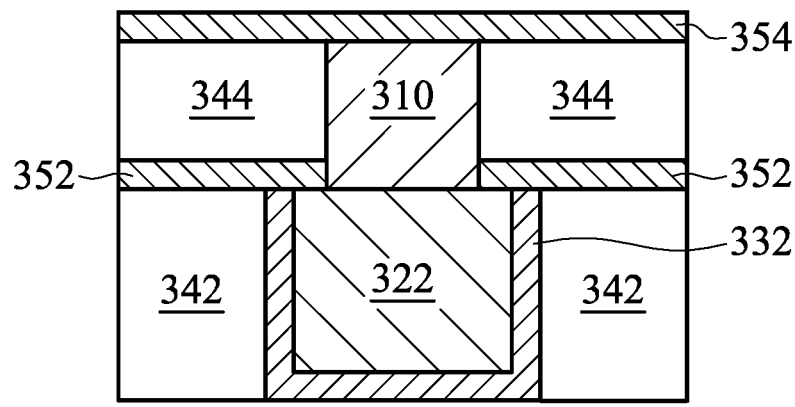

At a step 33, an etch stop layer is formed over the insulating layer and over the hybrid via (FIG. 65D). As illustrated in FIG. 65D, step 33 includes formation of etch stop layer 354. Etch stop layer 354 is deposited over insulating layer 344 and hybrid via 310, and can be formed of materials such as silicon nitride, silicon carbide, silicon carbonitride, and other suitable materials.

Figure 65E:
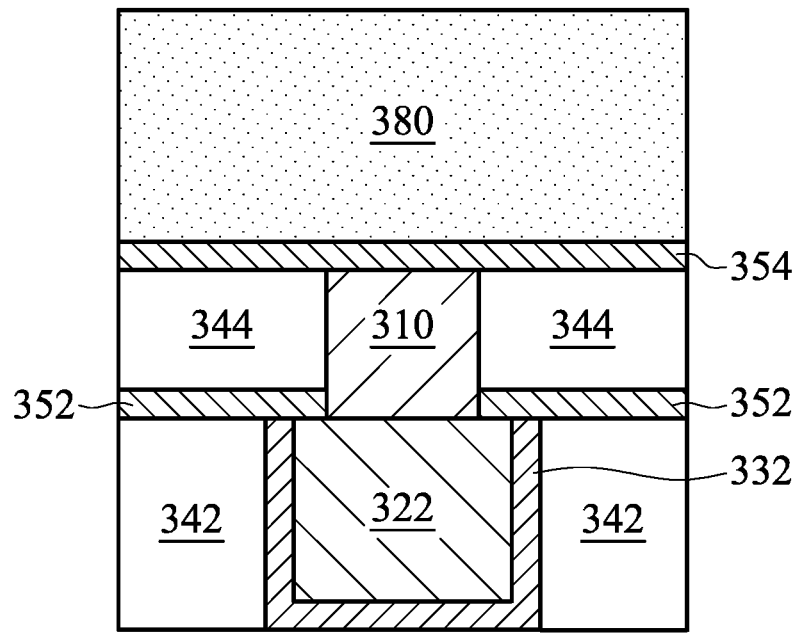

At a step 34, a metal layer is formed over the etch stop layer (FIG. 65E). The metal layer formed in step 34 is metal layer 380. Metal layer 380 can be formed by depositing materials such as aluminum, chromium, titanium, and other suitable metals over etch stop layer 354. Metal layer 380 is generally formed of material that is suitable for being patterned using a reactive ion etching process, as discussed below.

Figure 65F:
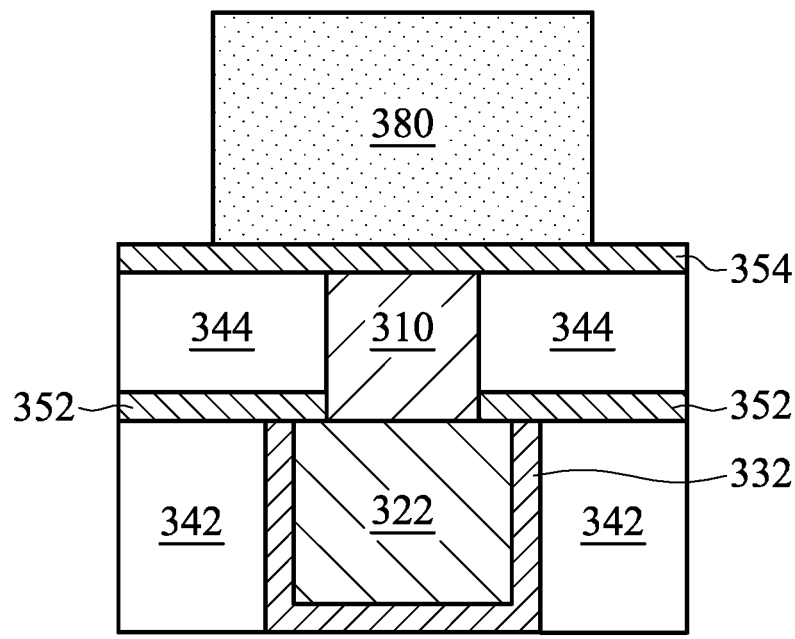

At a step 35, a portion of the metal layer is removed using a reactive ion etching process (FIG. 65F). As illustrated in FIG. 65F, a portion of metal layer 380 is removed in step 35. Step 35 can generally involve attacking metal layer 380 with chemically reactive ions that are generated under low pressure (e.g. a vacuum) by applying a strong electromagnetic field (e.g. a radio frequency (RF) field) to hybrid via interconnect structure 300. A layer of photoresist material can be applied to certain areas of metal layer 380 to shield such areas from being attacked by the chemically reactive ions. However, the areas of metal layer 380 that do not lie underneath the photoresist material will be attacked by the chemically reactive ions and will be removed down to etch stop layer 354 as illustrated in FIG. 65F.

Figure 65G:
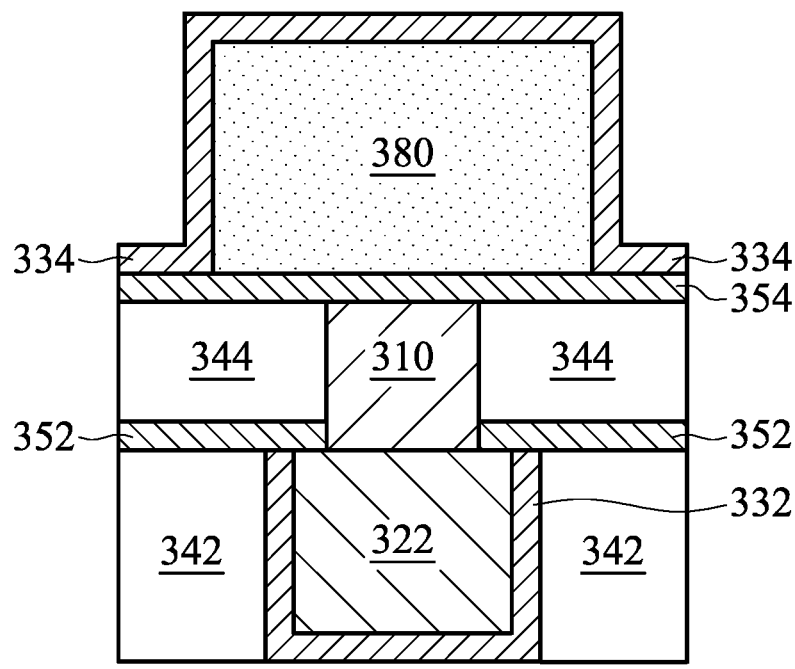

At a step 36, a barrier metal layer is formed over the metal layer (FIG. 65G). The barrier metal layer formed in step 36 is barrier metal layer 334. As illustrated in FIG. 65G, barrier metal layer 334 can be deposited over the entire exposed surface of metal layer 380 and over etch stop layer 354. Barrier metal layer 334 provides chemical isolation of metal layer 380 from surround materials such as silicon in insulating materials. Various suitable processes can be used to form barrier metal layer 334 in step 36.

Figure 65H:
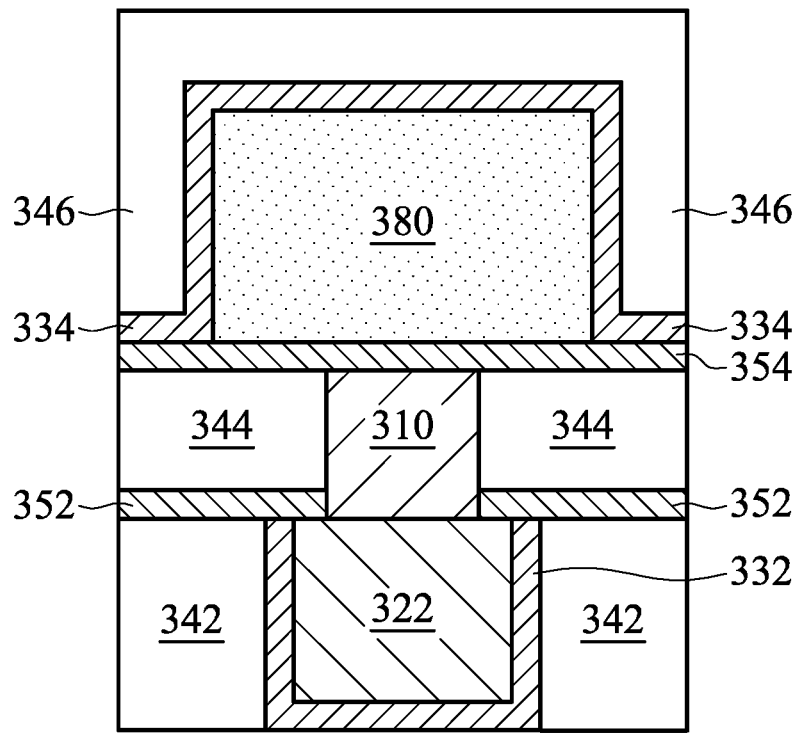

At a step 37, an insulating layer is formed over the barrier metal layer (FIG. 65H). The insulating layer formed in step 37 is insulating layer 346. As illustrated in FIG. 65H, insulating layer 346 is deposited over barrier metal layer 334. Formation of insulating layer 346 in step 37 can include depositing material(s) with a high dielectric constant (high-k) such as silicon oxide and silicon nitride, among other suitable materials. Various suitable processes can be used to form insulating layer 346 in step 37.

Figure 65I:
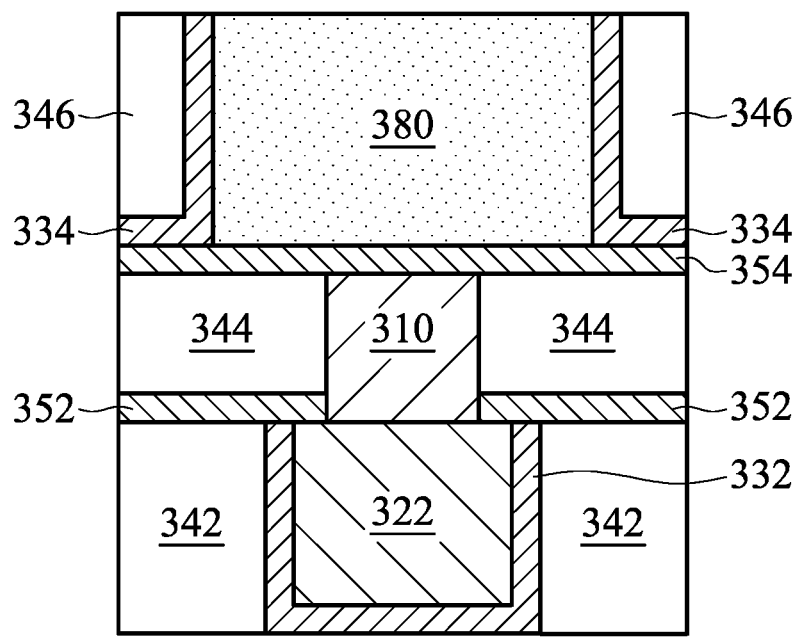

At a step 38, excess insulating material and excess barrier metal material are removed (FIG. 65I). In some embodiments, the excess insulating material and excess barrier metal material are removed using a chemical-mechanical planarization process. As illustrated in FIG. 65I, the removal of excess insulating material and excess barrier metal material can result in a structure wherein the top surfaces of insulating layer 346, barrier metal layer 334, and metal layer 380 are flush or approximately flush with each other such that the top of hybrid via interconnect structure 300 is flat or approximately flat. After step 38, the formation of hybrid via interconnect structure 300 is generally complete. Various different embodiments of hybrid via interconnect structure 300 are discussed in detail below with respect to FIGS. 50-64.

Figure 50:
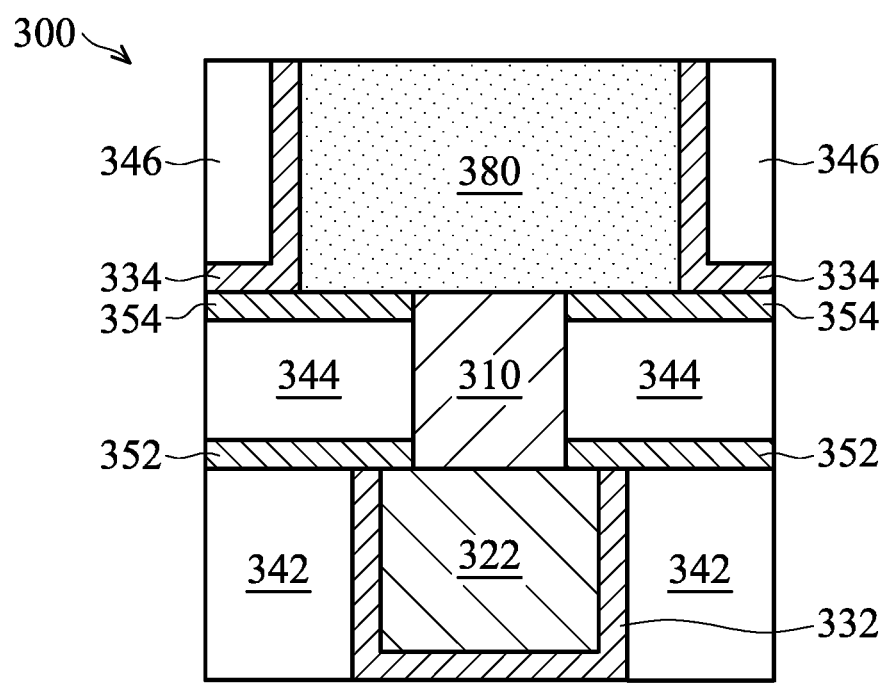

As shown in FIG. 50, another embodiment of hybrid via interconnect structure 300 includes a gap formed in etch stop layer 354 such that hybrid via 310 is in contact with metal layer 380. To from this structure, process 30 can be adapted such that a layer of blocking material is selectively deposited over hybrid via 310 between steps 32 and 33 (as indicated by step 32-1 in FIG. 65A), and removed after step 33 (as indicated by step 33-1 in FIG. 65A). Depending on the application, the embodiment of hybrid via interconnect structure 300 illustrated in FIG. 50 can provide improved ease of fabrication and reduced contact resistance.

Figure 51:
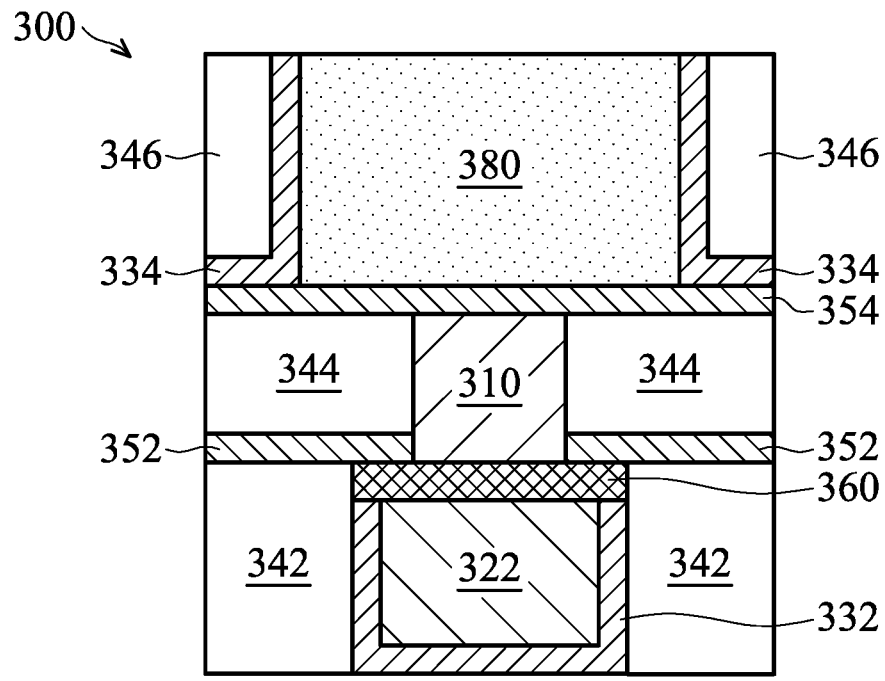

As shown in FIG. 51, another embodiment of hybrid via interconnect structure 300 includes a capping layer 360. To form this structure, capping layer 360 can be formed during the formation of the first interconnect structure before step 31 of process 30. Capping layer 360 can generally be included to reduce electromigration within hybrid via interconnect structure 300. Capping layer 360 can be formed using various materials such as silicon carbon nitride, silicon nitride, cobalt tungsten phosphide, copper alloys, and other suitable materials and combinations thereof. Depending on the application, the embodiment of hybrid via interconnect structure 300 illustrated in FIG. 51 can provide improved ease of fabrication and reduced contact resistance.

Figure 52:
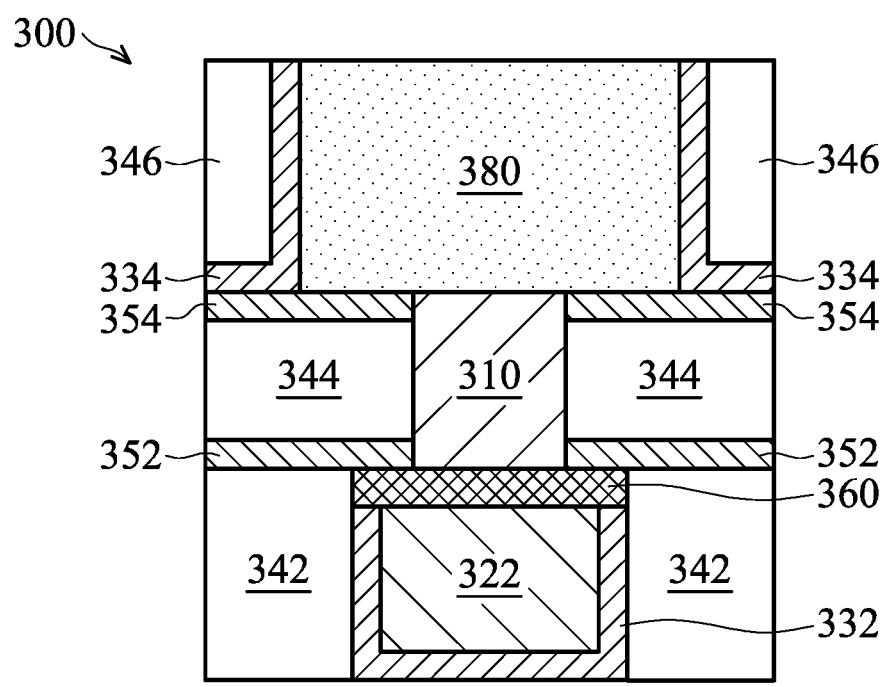

As shown in FIG. 52, another embodiment of hybrid via interconnect structure 300 includes capping layer 360 and a gap formed in etch stop layer 354 such that hybrid via 310 is in contact with metal layer 380. Process 30 can be adapted such that a layer of blocking material is selectively deposited over hybrid via 310 between steps 32 and 33, and removed after 33. Further, capping layer 360 can be included during the formation of the first interconnect structure before step 31 of process 30. Depending on the application, the embodiment of hybrid via interconnect structure 300 illustrated in FIG. 52 can provide improved ease of fabrication and reduced contact resistance.

Figure 53:
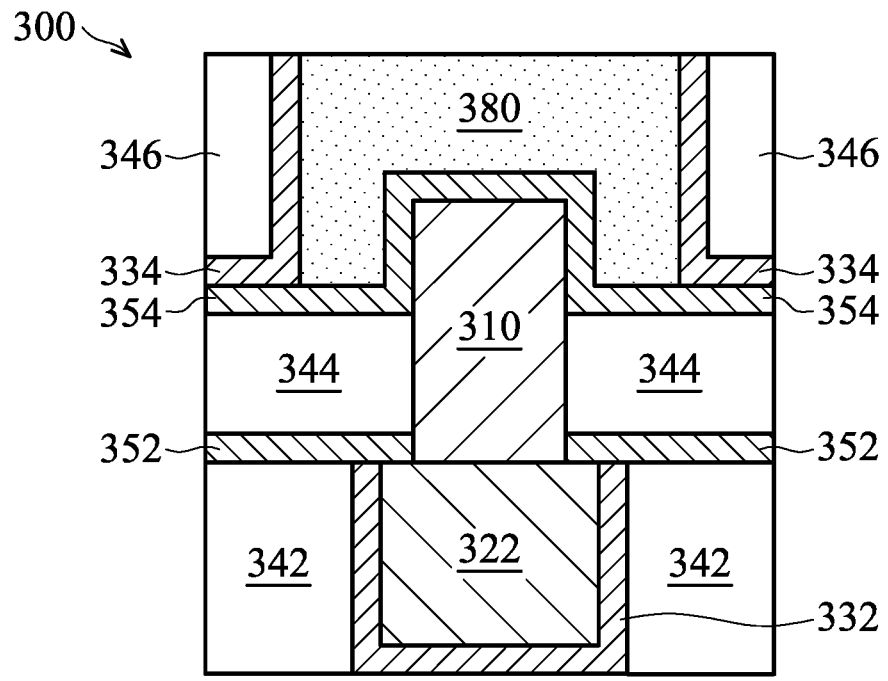

As shown in FIG. 53, another embodiment of hybrid via interconnect structure 300 includes an extension of hybrid via 310 into metal layer 380 and an extension of etch stop layer 354 such that hybrid via 310 is not in contact with metal layer 380. To form this structure, process 30 can be adapted such that hybrid via 310 extends above insulating layer 344 when it is formed in step 32. That is, the material used to form hybrid via 310 can be overfilled beyond the confines of trench 370. Then, etch stop layer 354 can be formed over hybrid via 310 and insulating layer 344 in step 33. Depending on the application, the embodiment of hybrid via interconnect structure 300 illustrated in FIG. 53 can provide improved ease of fabrication and reduced contact resistance.

Figure 54:
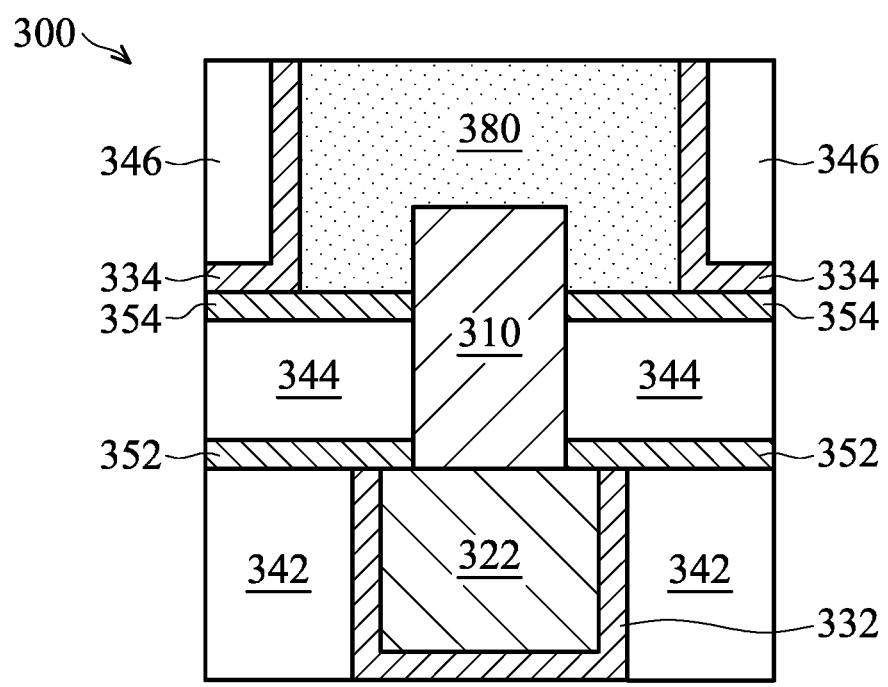

As shown in FIG. 54, another embodiment of hybrid via interconnect structure 300 includes an extension of hybrid via 310 into metal layer 380 and a gap formed in etch stop layer 354 such that hybrid via 310 is in contact with metal layer 380. In this sense, a recess is formed within metal layer 380 that is filled by hybrid via 310. To form this structure, process 30 can be adapted such that hybrid via 310 extends above insulating layer 344 when it is formed in step 32. That is, the material used to form hybrid via 310 can be overfilled beyond the confines of trench 370. Then, a blocking layer can be selectively deposited over hybrid via 310 between steps 32 and 33 and removed after step 33. Depending on the application, the embodiment of hybrid via interconnect structure 300 illustrated in FIG. 54 can provide improved ease of fabrication and reduced contact resistance.

Figure 55:
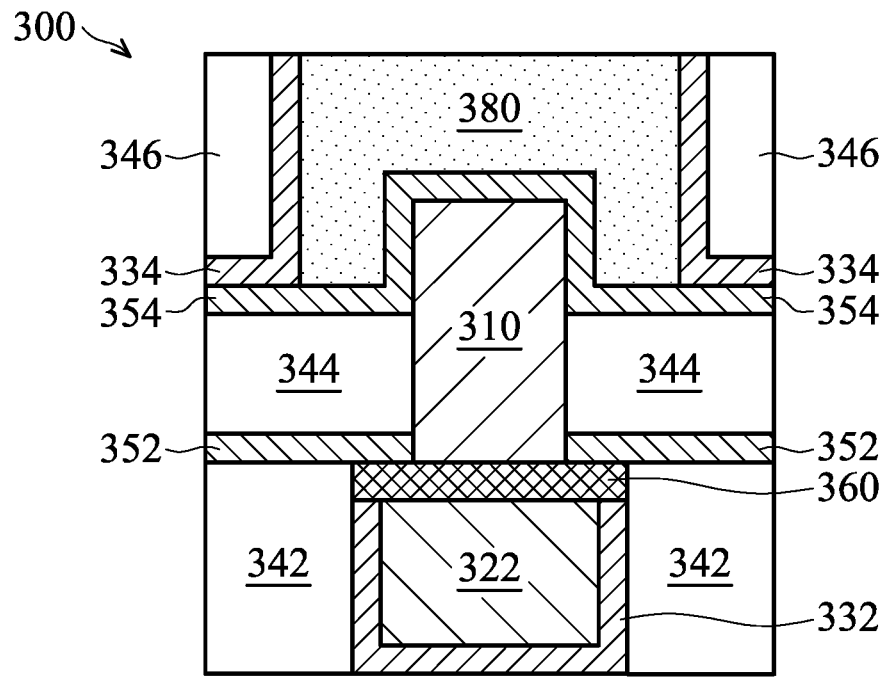

As shown in FIG. 55, another embodiment of hybrid via interconnect structure 300 includes capping layer 360, an extension of hybrid via 310 into metal layer 380, and an extension of etch stop layer 354 such that hybrid via 310 is not in contact with metal layer 380. Process 30 can be adapted such that hybrid via 310 extends above insulating layer 344 when it is formed in step 32. That is, the material used to form hybrid via 310 can be overfilled beyond the confines of trench 370. Then, etch stop layer 354 can be formed over hybrid via 310 and insulating layer 344 in step 33. Depending on the application, the embodiment of hybrid via interconnect structure 300 illustrated in FIG. 55 can provide improved ease of fabrication and reduced contact resistance.

Figure 56:
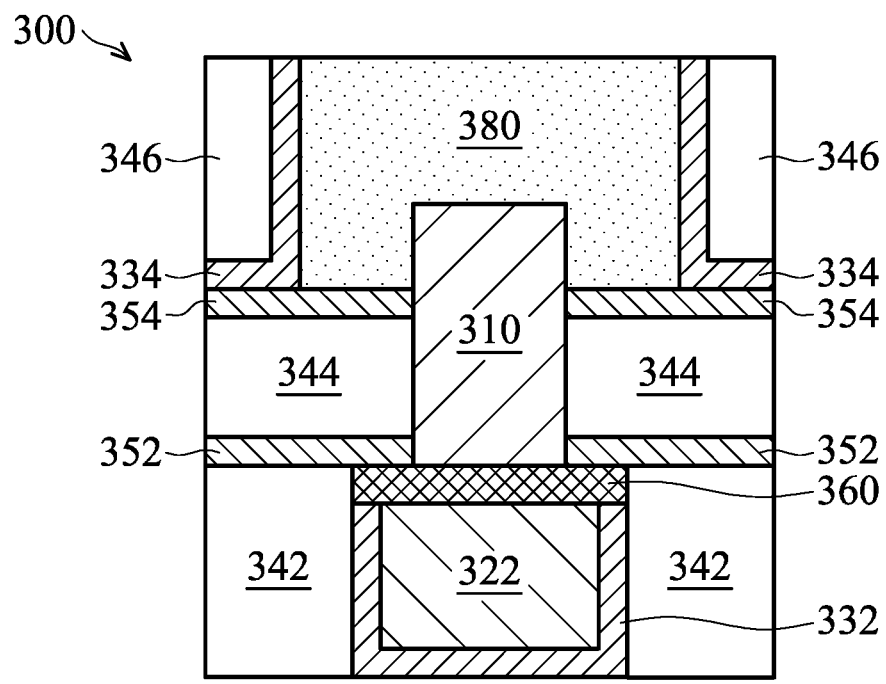

As shown in FIG. 56, another embodiment of hybrid via interconnect structure 300 includes capping layer 360, an extension of hybrid via 310 into metal layer 380, and a gap formed in etch stop layer 354 such that hybrid via 310 is in contact with metal layer 380. Process 30 can be adapted such that hybrid via 310 extends above insulating layer 344 when it is formed in step 32. That is, the material used to form hybrid via 310 can be overfilled beyond the confines of trench 370. Then, a blocking layer can be selectively deposited over hybrid via 310 between steps 32 and 33 and removed after step 33. Depending on the application, the embodiment of hybrid via interconnect structure 300 illustrated in FIG. 56 can provide improved ease of fabrication and reduced contact resistance.

Figure 57:
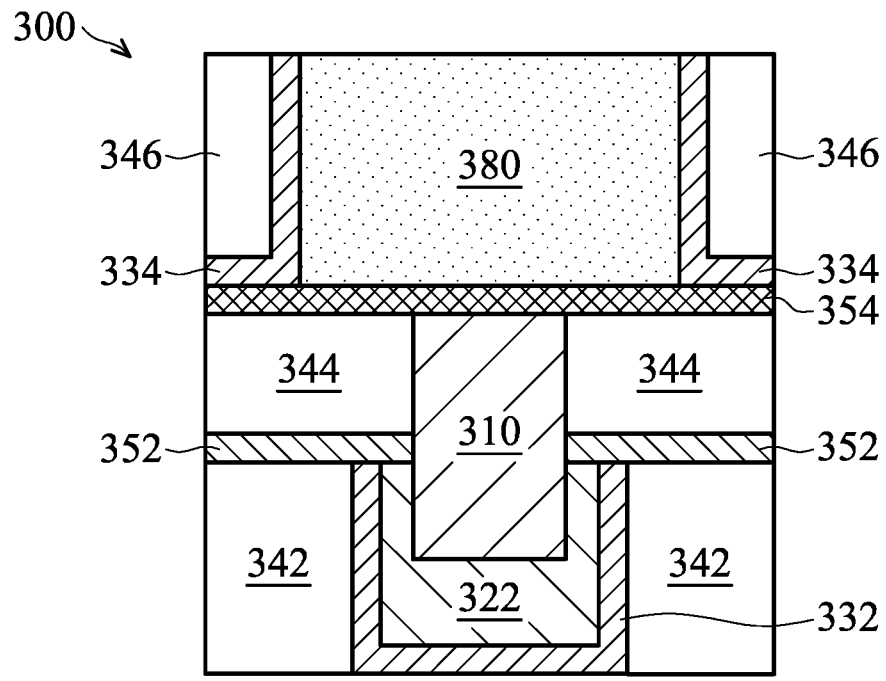

As shown in FIG. 57, another embodiment of hybrid via interconnect structure 300 includes an extension of hybrid via 310 into metal filling 322. To form this structure, process 30 can be adapted such that the formation of trench 370 performed in step 31 results in an extension of trench 370 into metal filling 322 such that a recess is formed within metal filling 322. Then, the material used to form hybrid via 310 can be filled within trench 370 and thereby within the recess formed within metal filling 322. Depending on the application, the embodiment of hybrid via interconnect structure 300 illustrated in FIG. 57 can provide improved ease of fabrication and reduced contact resistance.

Figure 58:
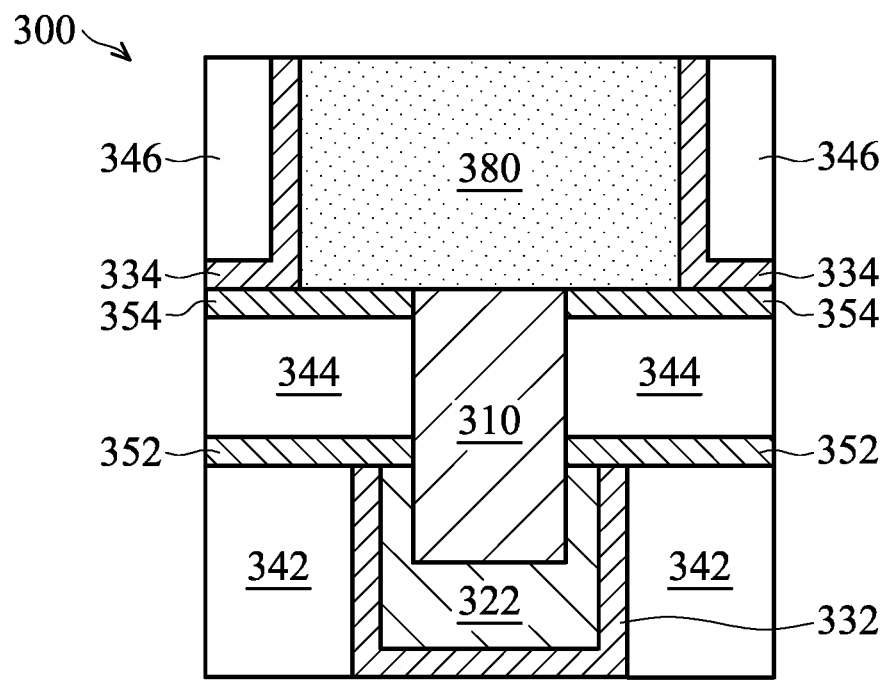

As shown in FIG. 58, another embodiment of hybrid via interconnect structure 300 includes a gap formed in etch stop layer 354 such that hybrid via 310 is in contact with metal layer 380 and an extension of hybrid via 310 into metal filling 322. Process 30 can be adapted such that a layer of blocking material is selectively deposited over hybrid via 310 between steps 32 and 33 and removed after step 33. Further, process 30 can be adapted such that the formation of trench 370 performed in step 31 results in an extension of trench 370 into metal filling 322 such that a recess is formed within metal filling 322. Then, the material used to form hybrid via 310 can be filled within trench 370 and thereby within the recess formed within metal filling 322. Depending on the application, the embodiment of hybrid via interconnect structure 300 illustrated in FIG. 58 can provide improved ease of fabrication and reduced contact resistance.

Figure 59:
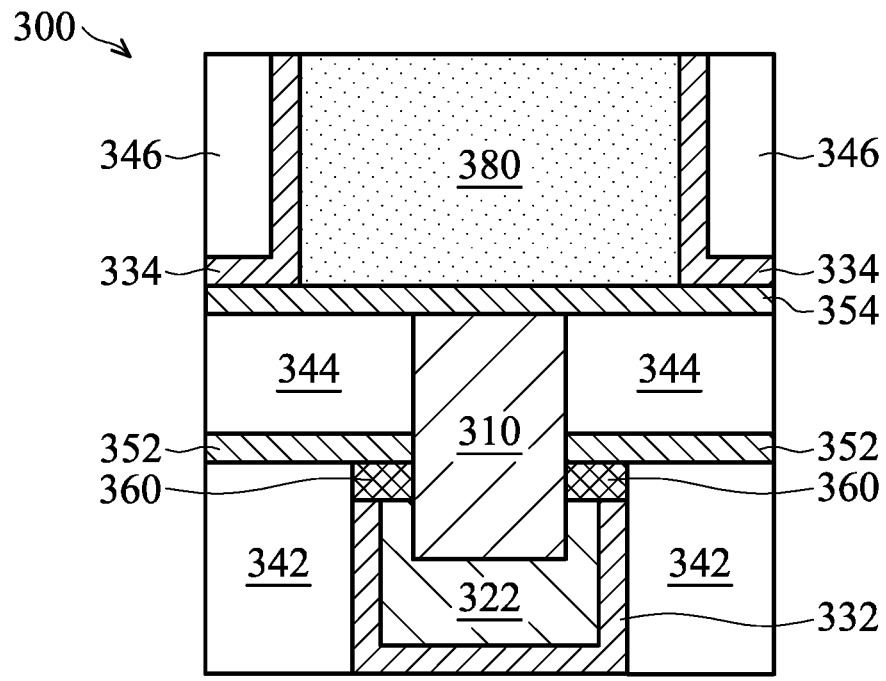

As shown in FIG. 59, another embodiment of hybrid via interconnect structure 300 includes capping layer 360 and an extension of hybrid via 310 into metal filling 322. Process 30 can be adapted such that the formation of trench 370 performed in step 31 results in an extension of trench 370 into and through capping layer 360 and into metal filling 322 such that a recess is formed within metal filling 322. Then, the material used to form hybrid via 310 can be filled within trench 370 and thereby within the recess formed within metal filling 322. Depending on the application, the embodiment of hybrid via interconnect structure 300 illustrated in FIG. 59 can provide improved ease of fabrication and reduced contact resistance.

Figure 60:
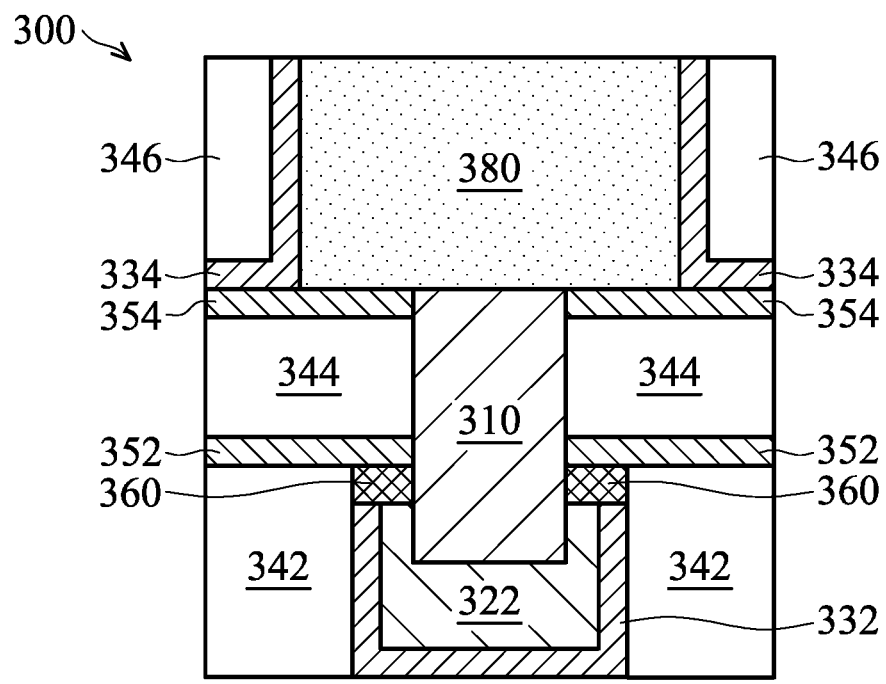

As shown in FIG. 60, another embodiment of hybrid via interconnect structure 300 includes capping layer 360, a gap formed in etch stop layer 354 such that hybrid via 310 is in contact with metal layer 380, and an extension of hybrid via 310 into metal filling 322. Process 30 can be adapted such that a layer of blocking material is selectively deposited over hybrid via 310 between steps 32 and 33 and removed after step 33. Further, process 30 can be adapted such that the formation of trench 370 performed in step 31 results in an extension of trench 370 into and through capping layer 360 and into metal filling 322 such that a recess is formed within metal filling 322. Then, the material used to form hybrid via 310 can be filled within trench 370 and thereby within the recess formed within metal filling 322. Depending on the application, the embodiment of hybrid via interconnect structure 300 illustrated in FIG. 60 can provide improved ease of fabrication and reduced contact resistance.

Figure 61:
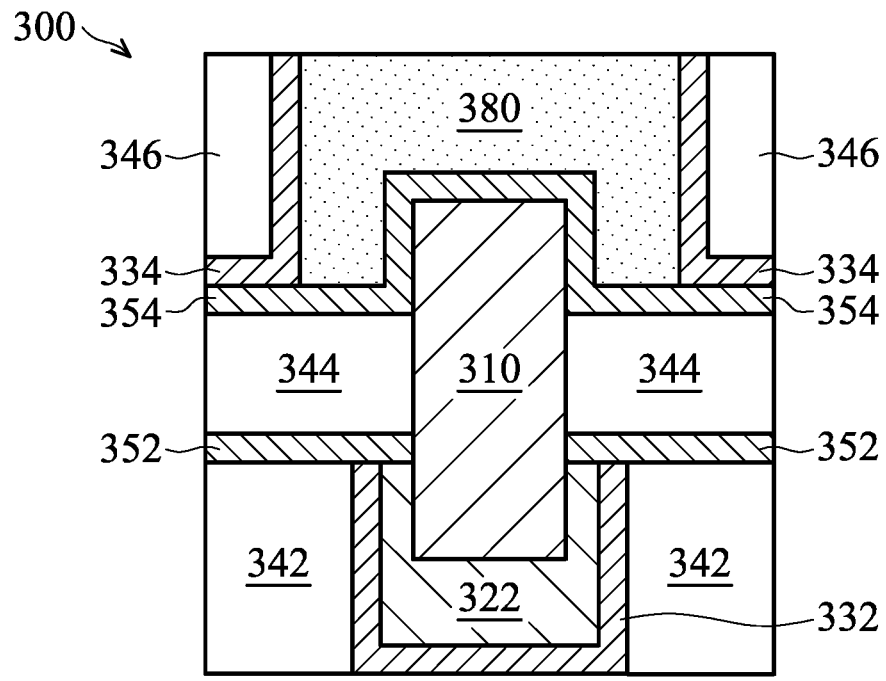

As shown in FIG. 61, another embodiment of hybrid via interconnect structure 300 includes an extension of hybrid via 310 into metal filling 322, an extension of hybrid via 310 into metal layer 380, and an extension of etch stop layer 354 such that hybrid via 310 is not in contact with metal layer 380. Process 30 can be adapted such that the formation of trench 370 performed in step 31 results in an extension of trench 370 into metal filling 322 such that a recess is formed within metal filling 322. Then, the material used to form hybrid via 310 can be filled within trench 370 and thereby within the recess formed within metal filling 322. Further, process 30 can be adapted such that hybrid via 310 extends above insulating layer 344 when it is formed in step 32. That is, the material used to form hybrid via 310 can be overfilled beyond the confines of trench 370. Then, etch stop layer 354 can be formed over hybrid via 310 and over insulating layer 344 in step 33. Depending on the application, the embodiment of hybrid via interconnect structure 300 illustrated in FIG. 61 can provide improved ease of fabrication and reduced contact resistance.

Figure 62:
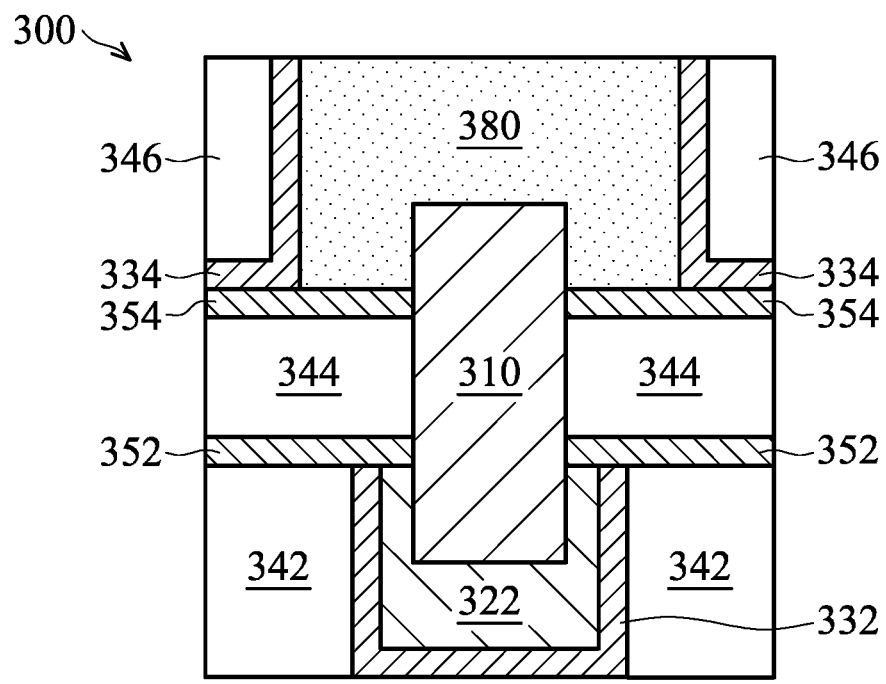

As shown in FIG. 62, another embodiment of hybrid via interconnect structure 300 includes an extension of hybrid via 310 into metal filling 322 such that hybrid via 310 is in contact with metal filling 322, an extension of hybrid via 310 into metal layer 380 such that hybrid via 310 is in contact with metal layer 380, and a gap formed in etch stop layer 354. Process 30 can be adapted such that the formation of trench 370 performed in step 31 results in an extension of trench 370 into metal filling 322 such that a recess is formed within metal filling 322. Then, the material used to form hybrid via 310 can be filled within trench 370 and thereby within the recess formed within metal filling 322. Further, process 30 can be adapted such that hybrid via 310 extends above insulating layer 344 when it is formed in step 32. That is, the material used to form hybrid via 310 can be overfilled beyond the confines of trench 370. Then, a blocking layer can be selectively deposited over hybrid via 310 between steps 32 and 33, and removed after step 33. Depending on the application, the embodiment of hybrid via interconnect structure 300 illustrated in FIG. 62 can provide improved ease of fabrication and reduced contact resistance.

Figure 63:
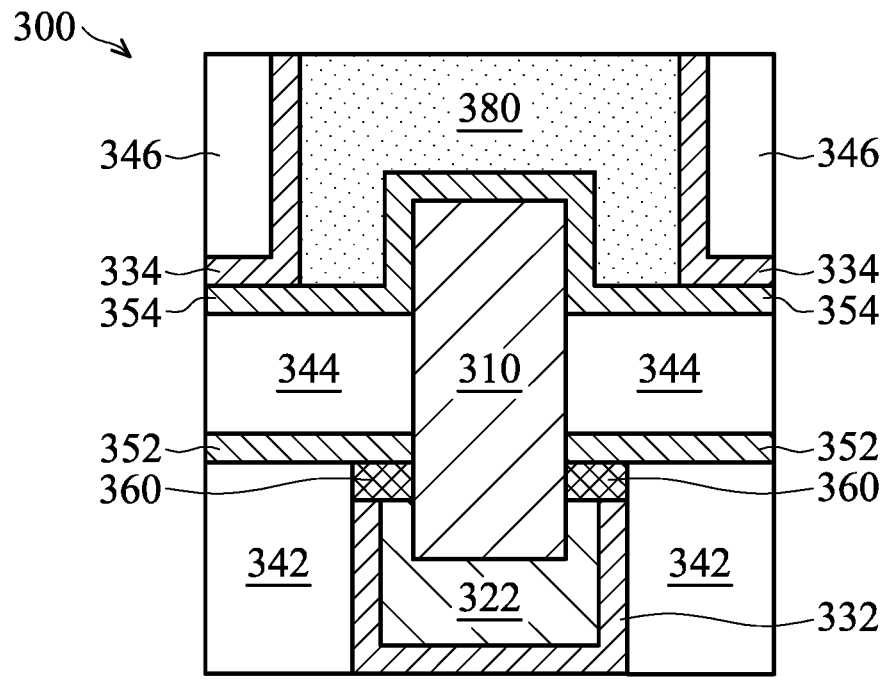

As shown in FIG. 63, another embodiment of hybrid via interconnect structure 300 includes capping layer 360, an extension of hybrid via 310 into metal filling 322, an extension of hybrid via 310 into metal layer 380, and an extension of etch stop layer 354 such that hybrid via 310 is not in contact with metal layer 380. Process 30 can be adapted such that the formation of trench 370 performed in step 31 results in an extension of trench 370 into and through capping layer 360 and into metal filling 322 such that a recess is formed within metal filling 322. Then, the material used to form hybrid via 310 can be filled within trench 370 and thereby within the recess formed within metal filling 322. Further, process 30 can be adapted such that hybrid via 310 extends above insulating layer 344 when it is formed in step 32. That is, the material used to form hybrid via 310 can be overfilled beyond the confines of trench 370. Then, etch stop layer 354 can be formed over hybrid via 310 and over insulating layer 344 in step 33. Depending on the application, the embodiment of hybrid via interconnect structure 300 illustrated in FIG. 63 can provide improved ease of fabrication and reduced contact resistance.

As shown in FIG. 64, another embodiment of hybrid via interconnect structure 300 includes capping layer 360, an extension of hybrid via 310 into metal filling 322 such that hybrid via 310 is in contact with metal filling 322, an extension of hybrid via 310 into metal layer 380 such that hybrid via 310 is in contact with metal layer 380, and a gap formed in etch stop layer 354. Process 30 can be adapted such that the formation of trench 370 performed in step 31 results in an extension of trench 370 into and through capping layer 360 and into metal filling 322 such that a recess is formed within metal filling 322. Then, the material used to form hybrid via 310 can be filled within trench 370 and thereby within the recess formed within metal filling 322. Further, process 30 can be adapted such that hybrid via 310 extends above insulating layer 344 when it is formed in step 32. That is, the material used to form hybrid via 310 can be overfilled beyond the confines of trench 370. Then, a blocking layer can be selectively deposited over hybrid via 310 between steps 32 and 33, and removed after step 33. Depending on the application, the embodiment of hybrid via interconnect structure 300 illustrated in FIG. 64 can provide improved ease of fabrication and reduced contact resistance.

The blocking layers described herein can be selectively deposited using a chemical vapor deposition process, an atomic layer deposition process, a spin coating process, a dipping process, a blade-coating process, an immersion process, and other suitable processes and combinations thereof. Further, the blocking layers described herein can be formed of materials including small molecules, polymers, organometallic compounds, and other suitable materials. Solutions for wet-coating the blocking layers described herein can include both protic and aprotic solvents. In some embodiments, the thickness of the blocking layers described herein range in thickness from about 2 angstroms to 100 microns, however thicknesses outside of this range are also contemplated. The blocking layers described herein can be removed using removal processes such as thermal removal, photolithography, chemical treatment, and other suitable processes and combinations thereof.

As described in detail above, various embodiments of the hybrid via interconnect structure disclosed herein can be used to provide improved interconnect structures within an integrated circuit. The hybrid via interconnect structure includes a hybrid via that generally provides an electrical connection between two metals such as two copper interconnects. The hybrid via can be formed of a variety of materials including metals, alloys, and other conductive materials. The hybrid via interconnect structure can be formed using a single damascene process, a dual damascene process, or a reactive ion etching process, for example. The hybrid via interconnect structure can provide advantages in terms of reduced contact and interconnect resistance as well as improved ease and efficiency of fabrication.

An implementation of the present disclosure is a circuit. The circuit includes a first metal filling at least partially surrounded by a first barrier metal layer, a second metal filling at least partially surrounded by a second barrier metal layer, and a hybrid via formed between the first metal filling and the second metal filling. The hybrid via provides an electrical connection between the first metal filling and the second metal filling.

Another implementation of the present disclosure is a method of fabrication a circuit. The method includes forming an insulating layer over a first interconnect structure, forming a trench within the insulating layer, forming a hybrid via within the trench, and forming a second interconnect structure over the hybrid via such that the hybrid via provides an electrical connection between the first interconnect structure and the second interconnect structure.

Yet another implementation of the present disclosure is a circuit. The circuit includes a metal filling at least partially surrounded by a first barrier metal layer, a metal layer at least partially surrounded by a second barrier metal layer, and a hybrid via formed between the metal filling and the metal layer. The hybrid via provides an electrical connection between the metal filling and the metal layer.

The foregoing outlines features of several embodiments so that those skilled in the art can better understand the aspects of the present disclosure. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they can make various changes, substitutions, and alterations herein without departing from the spirit and scope of the present disclosure.

What is claimed is:

1. A method of fabricating a circuit, comprising:
    forming an insulating layer over a first interconnect structure, wherein the first interconnect structure includes a first metal material;
    after forming the insulating layer, forming a first trench within the insulating layer;
    after forming the first trench, forming a hybrid via within the first trench, wherein the hybrid via includes a second metal material different from the first metal material;
    after forming the hybrid via, forming an additional insulating layer over the hybrid via;
    after forming the additional insulating layer, forming a second trench entirely within the additional insulating layer to expose an entire top surface of the hybrid via;
    selectively depositing a blocking layer over the entire top surface of the hybrid via in the second trench;
    after selectively depositing the blocking layer, depositing a barrier metal layer in the second trench;
    after depositing the barrier metal layer, removing the blocking layer to expose the entire top surface of the hybrid via between portions of the barrier metal layer, wherein removing the blocking layer results in the barrier metal layer to directly contact sidewalls of the hybrid via; and
    forming a metal layer over the barrier metal layer, the metal layer having the first metal material and in direct contact with the barrier metal layer, resulting in a second interconnect structure,
    wherein the hybrid via provides an electrical connection between the first interconnect structure and the second interconnect structure, and
    wherein the first metal material includes copper and the second metal material includes an iron/cobalt alloy or a molybdenum/tantalum alloy.

2. The method of claim 1, wherein the metal layer includes a metal filling over a seed layer.

3. The method of claim 1, wherein forming the hybrid via includes forming the hybrid via using at least one of a physical vapor deposition process, a chemical vapor deposition process, an atomic layer deposition process, or an electrochemical deposition process.

4. The method of claim 1, wherein a height of the hybrid via ranges from 5 angstroms to 100 microns.

5. The method of claim 1, wherein the barrier metal layer includes tantalum, cobalt, ruthenium, or combinations thereof.

6. The method of claim 1, further comprising forming a capping layer over the first interconnect structure, wherein forming the hybrid via results in the hybrid via to extend through the capping layer.

7. The method of claim 1, wherein selectively depositing the blocking layer includes performing a wet-coating process to deposit a material having an organometallic compound.

8. A method of fabricating a circuit, comprising:
    forming an insulating layer over a first interconnect structure, wherein the first interconnect structure includes a first metal material;
    subsequent to forming the insulating layer, forming a first trench within the insulating layer;
    subsequent to forming the first trench, forming a hybrid via within the first trench, wherein the hybrid via includes a second metal material different from the first metal material;
    forming an additional insulating material over the insulating layer and over the hybrid via;
    forming a second trench completely within the additional insulating material, the second trench exposing an entire top surface of the hybrid via; and
    forming a second interconnect structure within the second trench,
    wherein forming the second interconnect structure includes:
    selectively forming a blocking layer over the entire top surface of the hybrid via in the second trench;
    after selectively forming the blocking layer, forming a barrier metal layer in the second trench;

after forming the barrier metal layer, removing the blocking layer to expose the entire top surface of the hybrid via between portions of the barrier metal layer, wherein removing the blocking layer results in a lower portion of the barrier metal layer to directly contact sidewalls of the hybrid via, the lower portion having a top surface coplanar with the entire top surface of the hybrid via; and forming a metal layer over the barrier metal layer, the metal layer directly contacting the entire top surface of the hybrid via and, the metal layer including the first metal material, wherein the first metal material includes copper, and wherein the second metal material includes an iron/cobalt alloy or a molybdenum/tantalum alloy.

9. The method of claim 8, wherein forming the metal layer includes:

forming a seed layer over the barrier metal layer; and forming a metal filling over the seed layer.

10. The method of claim 8, wherein the hybrid via is configured to provide an electrical connection between the first interconnect structure and the second interconnect structure.

11. The method of claim 8, wherein forming the hybrid via includes forming the hybrid via using at least one of a physical vapor deposition process, a chemical vapor deposition process, an atomic layer deposition process, or an electrochemical deposition process.

12. The method of claim 8, wherein a height of the hybrid via ranges from 5 angstroms to 100 microns.

13. The method of claim 8, wherein the barrier metal layer includes tantalum, cobalt, ruthenium, or combinations thereof.

14. The method of claim 8, wherein selectively depositing the blocking layer includes performing a wet-coating process to deposit a material having an organometallic compound.

15. A method of fabricating a circuit, comprising:

forming an insulating layer over a first interconnect structure, wherein the first interconnect structure includes a first metal material;

after forming the insulating layer, forming a first trench within the insulating layer;

after forming the first trench, forming a hybrid via within the first trench, wherein the hybrid via includes a second metal material different from the first metal material;

after forming the hybrid via, forming an additional insulating layer over the hybrid via;

after forming the additional insulating layer, forming a second trench entirely within the additional insulating layer; and forming a second interconnect structure over the hybrid via within the second trench, including:

selectively depositing a blocking layer over an entire top surface of the hybrid via in the second trench, wherein the blocking layer includes an organometallic compound;

after selectively depositing the blocking layer, depositing a barrier metal layer in the second trench;

after depositing the barrier metal layer, removing the blocking layer to expose the entire top surface of the hybrid via between portions of the barrier metal layer, wherein removing the blocking layer results in the barrier metal layer to directly contact sidewalls of the hybrid via; and forming a metal layer over to directly contact the barrier metal layer, the metal layer including the first metal material, wherein the first metal material includes copper and the second metal material includes an iron/cobalt alloy or a molybdenum/tantalum alloy.

16. The method of claim 15, wherein the metal layer includes a metal filling over a seed layer.

17. The method of claim 15, wherein the hybrid via is configured to provide an electrical connection between the first interconnect structure and the second interconnect structure.

18. The method of claim 15, wherein forming the hybrid via includes forming the hybrid via using at least one of a physical vapor deposition process, a chemical vapor deposition process, an atomic layer deposition process, or an electrochemical deposition process.

19. The method of claim 15, wherein a height of the hybrid via ranges from 5 angstroms to 100 microns.

20. The method of claim 15, wherein selectively depositing the blocking layer includes performing a wet-coating process using solutions containing a protic or an aprotic solvent.

* * * * *